(12) United States Patent
Yamazaki et al.

(10) Patent No.: US 7,365,393 B2
(45) Date of Patent: *Apr. 29, 2008

(54) SEMICONDUCTOR DEVICE AND FABRICATION METHOD THEREOF

(75) Inventors: Shunpei Yamazaki, Setagaya (JP); Satoshi Murakami, Atsugi (JP); Jun Koyama, Atsugi (JP); Yukio Tanaka, Atsugi (JP); Hidehito Kitakado, Atsugi (JP); Hideto Ohnumo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 491 days.

This patent is subject to a terminal disclaimer.

(21) Appl. No.: 10/945,048

(22) Filed: Sep. 21, 2004

(65) Prior Publication Data

US 2005/0040401 A1    Feb. 24, 2005

Related U.S. Application Data

(62) Division of application No. 10/456,633, filed on Jun. 9, 2003, now Pat. No. 6,967,129, which is a division of application No. 09/510,734, filed on Feb. 22, 2000, now Pat. No. 6,576,926.

(30) Foreign Application Priority Data

Feb. 23, 1999    (JP)    ................... 11-045558

(51) Int. Cl.
    *H01L 21/70*    (2006.01)
    *H01L 27/12*    (2006.01)

(52) U.S. Cl. .......................... 257/344; 349/38

(58) Field of Classification Search .............. 257/59, 257/66, 344; 349/38–44
See application file for complete search history.

(56) References Cited

U.S. PATENT DOCUMENTS 3,461,357 A    8/1969    Mutter et al.

(Continued)

FOREIGN PATENT DOCUMENTS

EP    0 589 478    3/1994

(Continued)

OTHER PUBLICATIONS

J. Ayres et al., *WS 3/1: Influence of Drain Field on Poly-Si TFT Behaviour*, AMLCD Workshop, 1990, pp. 33-36.

(Continued)

*Primary Examiner*—Thomas L. Dickey
(74) *Attorney, Agent, or Firm*—Eric J. Robinson; Robinson Intellectual Property Law Office, P.C.

(57) ABSTRACT

This invention provides a semiconductor device having high operation performance and high reliability. An LDD region 707 overlapping with a gate wiring is arranged in an n-channel TFT 802 forming a driving circuit, and a TFT structure highly resistant to hot carrier injection is achieved. LDD regions 717, 718, 719 and 720 not overlapping with a gate wiring are arranged in an n-channel TFT 804 forming a pixel unit. As a result, a TFT structure having a small OFF current value is achieved. In this instance, an element belonging to the Group 15 of the Periodic Table exists in a higher concentration in the LDD region 707 than in the LDD regions 717, 718, 719 and 720.

52 Claims, 38 Drawing Sheets

U.S. PATENT DOCUMENTS

| | | | |
|---|---|---|---|
| 4,953,003 | A | 8/1990 | Johansen |
| 5,217,910 | A | 6/1993 | Shimizu et al. |
| 5,247,190 | A | 9/1993 | Friend et al. |
| 5,323,042 | A | 6/1994 | Matsumoto |
| 5,399,502 | A | 3/1995 | Friend et al. |
| 5,412,493 | A | 5/1995 | Kunii et al. |
| 5,413,945 | A | 5/1995 | Chien et al. |
| 5,499,123 | A | 3/1996 | Mikoshiba |
| 5,508,209 | A | 4/1996 | Zhang et al. |
| 5,508,216 | A | 4/1996 | Inoue |
| 5,532,176 | A | 7/1996 | Katada et al. |
| 5,563,427 | A | 10/1996 | Yudasaka et al. |
| 5,594,569 | A | 1/1997 | Konuma et al. |
| 5,643,826 | A | 7/1997 | Ohtani et al. |
| 5,712,495 | A | 1/1998 | Suzawa |
| 5,714,418 | A | 2/1998 | Bai et al. |
| 5,757,048 | A | 5/1998 | Inoue |
| 5,804,878 | A * | 9/1998 | Miyazaki et al. ........... 257/764 |
| 5,811,835 | A | 9/1998 | Seiki et al. |
| 5,856,689 | A | 1/1999 | Suzawa |
| 5,917,563 | A * | 6/1999 | Matsushima ................ 349/38 |
| 5,923,962 | A | 7/1999 | Ohtani et al. |
| 5,953,582 | A | 9/1999 | Yudasaka et al. |
| 5,962,872 | A | 10/1999 | Zhang et al. |
| 5,998,841 | A | 12/1999 | Suzawa |
| 6,011,274 | A | 1/2000 | Gu et al. |
| 6,046,479 | A | 4/2000 | Young et al. |
| 6,049,092 | A | 4/2000 | Konuma et al. |
| 6,100,954 | A | 8/2000 | Kim et al. |
| 6,111,619 | A | 8/2000 | He et al. |
| 6,115,090 | A | 9/2000 | Yamazaki |
| 6,166,414 | A | 12/2000 | Miyazaki et al. |
| 6,198,133 | B1 | 3/2001 | Yamazaki et al. |
| 6,201,585 | B1 | 3/2001 | Takano et al. |
| 6,222,238 | B1 | 4/2001 | Chang et al. |
| 6,259,120 | B1 | 7/2001 | Zhang et al. |
| 6,281,552 | B1 | 8/2001 | Kawasaki et al. |
| 6,306,694 | B1 | 10/2001 | Yamazaki et al. |
| 6,333,518 | B1 | 12/2001 | Seo |
| 6,399,988 | B1 | 6/2002 | Yamazaki |
| 6,524,895 | B2 | 2/2003 | Yamazaki et al. |
| 6,531,713 | B1 | 3/2003 | Yamazaki |
| 6,534,826 | B2 | 3/2003 | Yamazaki |
| 6,576,924 | B1 | 6/2003 | Yamazaki et al. |
| 6,674,136 | B1 | 1/2004 | Ohtani |
| 6,777,254 | B1 | 8/2004 | Yamazaki et al. |
| 6,777,716 | B1 | 8/2004 | Yamazaki et al. |
| 6,777,763 | B1 | 8/2004 | Zhang et al. |
| 6,936,844 | B1 | 8/2005 | Yamazaki et al. |
| 6,952,020 | B1 | 10/2005 | Yamazaki et al. |
| 2003/0100152 | A1 | 5/2003 | Konuma et al. |

FOREIGN PATENT DOCUMENTS

| | | |
|---|---|---|
| EP | 0 602 250 | 6/1994 |
| EP | 0 604 006 | 6/1994 |
| EP | 0 635 890 | 1/1995 |
| EP | 0 645 802 | 3/1995 |
| EP | 0 871 227 | 10/1998 |
| EP | 0978877 | 2/2000 |
| JP | 4-369271 | 12/1992 |
| JP | 5-102483 | 4/1993 |
| JP | 07-130652 | 5/1995 |
| JP | 09-026602 | 1/1997 |
| JP | 10-92576 | 4/1998 |
| WO | WO 90/13148 | 11/1990 |
| WO | WO-94/00882 | 1/1994 |
| WO | WO-94/18706 | 8/1994 |
| WO | WO 99/50911 | 10/1999 |

OTHER PUBLICATIONS

Y. Yamaguchi et al., *Structure Design for Submicron MOSFET on Ultra Thin SOI*, IEDM 90: Technical Digest of International Electron Devices Meeting, 1990, pp. 591-594.

Office Communication (Application No. 00103706.8) Dec. 11, 2006.

Furue et al., "Characteristics and Driving Scheme of Polymer-Stabilized Monostable FLCD Exhibiting Fast Response Time and High Contrast Ratio With Gray-Scale Capability," SID 98 Digest, pp. 782-785.

Yoshida et al., "A Full-Color Thresholdless Antiferroelectric LCD Exhibiting Wide Viewing Angle With Fast Response Time," SID 97 Digest, pp. 841-844.

Hatano et al., "A Novel Self-Aligned Gate-Overlapped LDD Poly-Si TFT With High Reliability and Performance," IEDM Technical Digest 1997, pp. 523-526.

Shimokawa et al, "Characterization of High-Efficiency Cast-si Solar Cell Wafers By MBIC Measurement," Japanese Journal of Applied Physics, vol. 27, No. 5, May 1988, pp. 751-758.

Herman Schenk et al., "Polymers for Light Emitting Diodes," EuroDisplay '99 Proceedings, Sep. 6-9, 1999, pp. 33-37.

Inventors: Shunpei Yamazaki et al., "Semiconductor Device and Fabrication Method Thereof," filed Jul. 5, 2000, Specifications and Drawings for U.S. Appl. No. 09/610,217.

Inventors: Shunpei Yamazaki et al., "Semiconductor Device and Manufacturing Method Thereof," filed Jul. 6, 2000, Specifications and Drawings for U.S. Appl. No. 09/610,753.

Inventors: Shunpei Yamazaki, "Semiconductor Device and Method of Manufacturing Therefor," filed Feb. 11, 2000, Specifications and Drawings for U.S. Appl. No. 09/502,675.

Inventors: Shunpei Yamazaki, "Method for Manufacturing an Electrooptical Device," filed Mar. 22, 2000, Specifications and Drawings for U.S. Appl. No. 09/533,175.

Inventors: Shunpei Yamazaki, "Semiconductor Device and Method of Manufacturing the Same," filed Feb. 7, 2000, Specifications and Drawings for U.S. Appl. No. 09/498,646.

U.S. Appl. No. 09/544,801, Specifications and Drawings, "Semiconductor Device and Method For Fabricating the Same," Shunpei Yamazaki et al., filed Apr. 7, 2000.

* cited by examiner

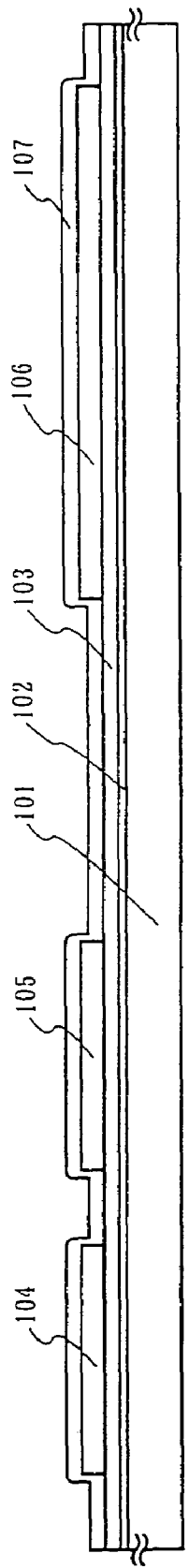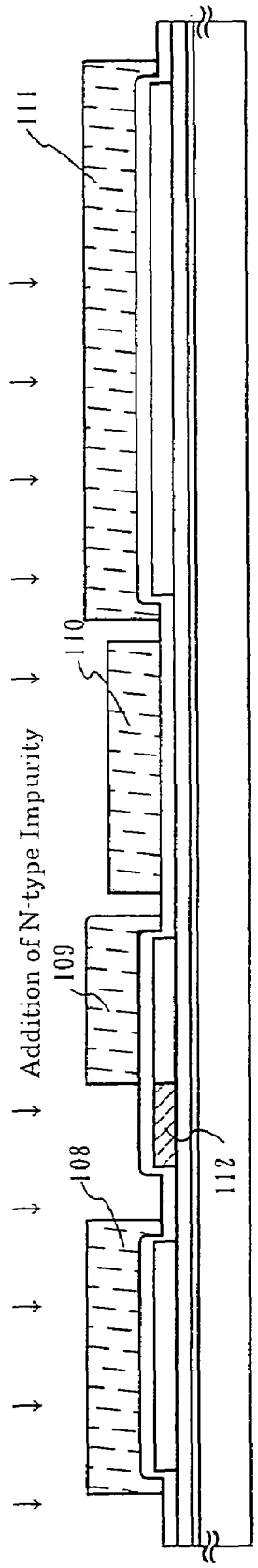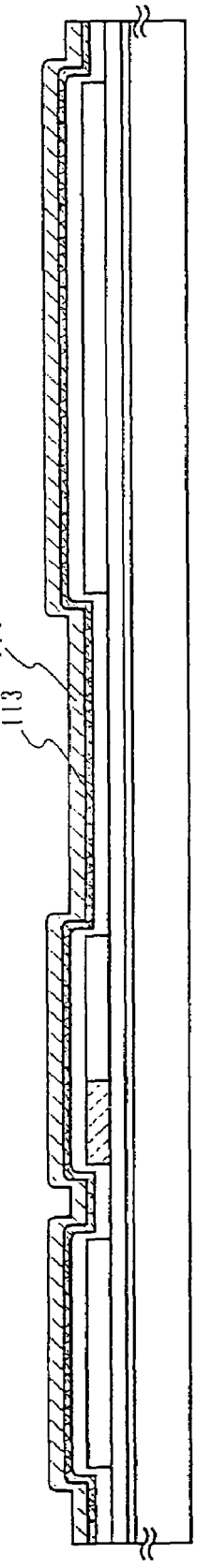

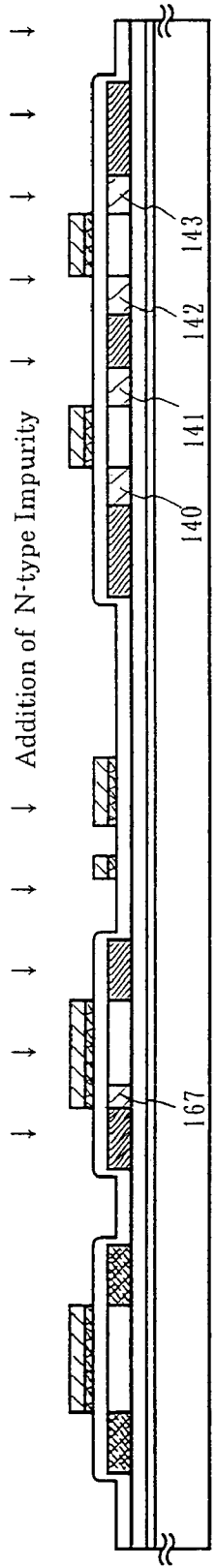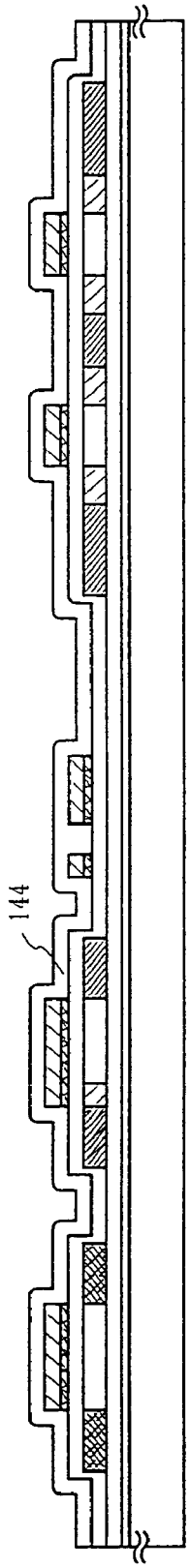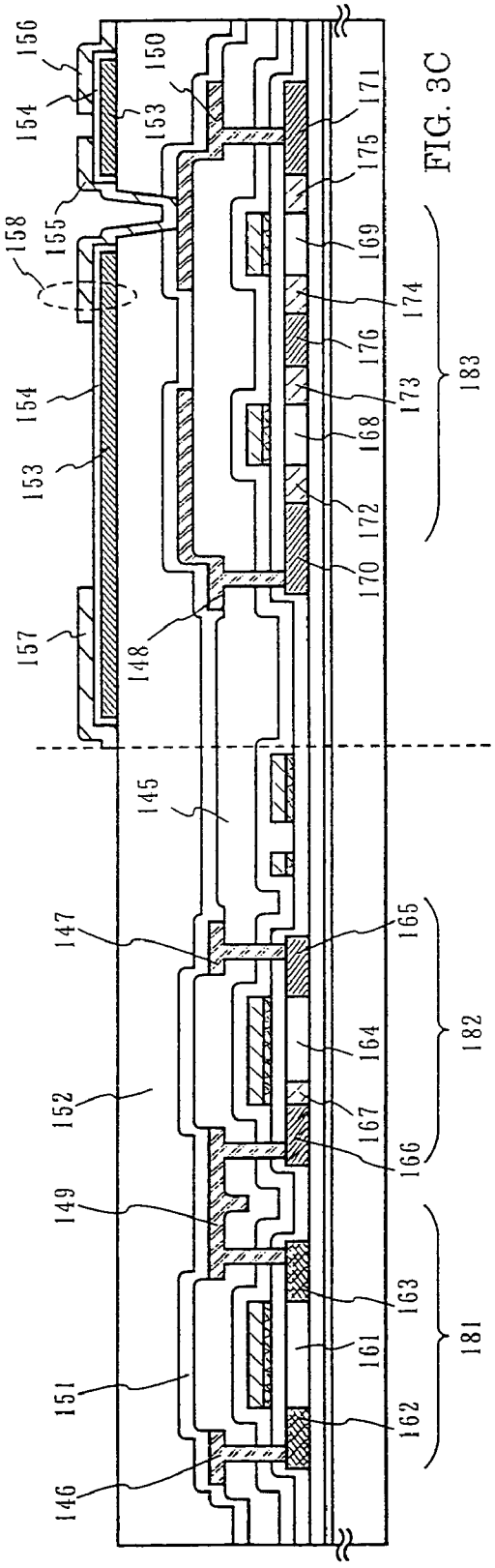

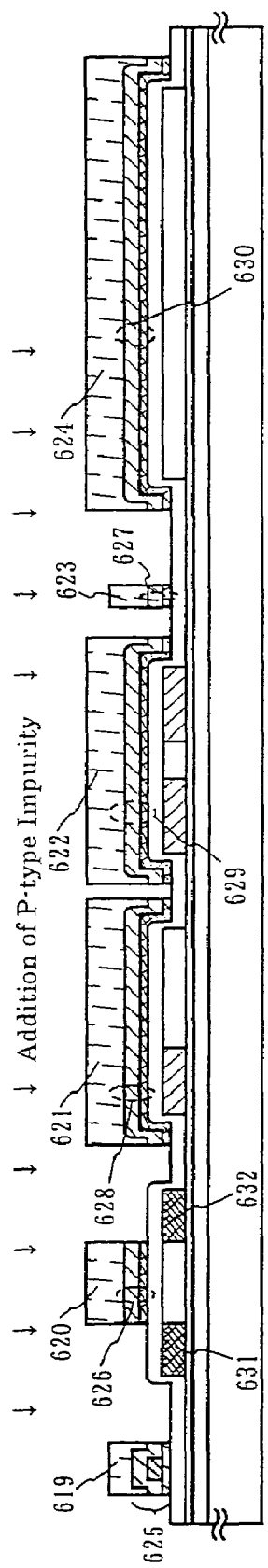
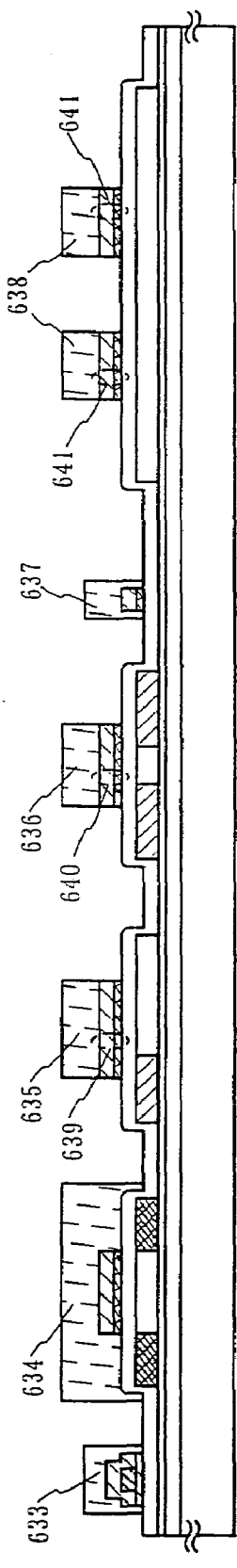
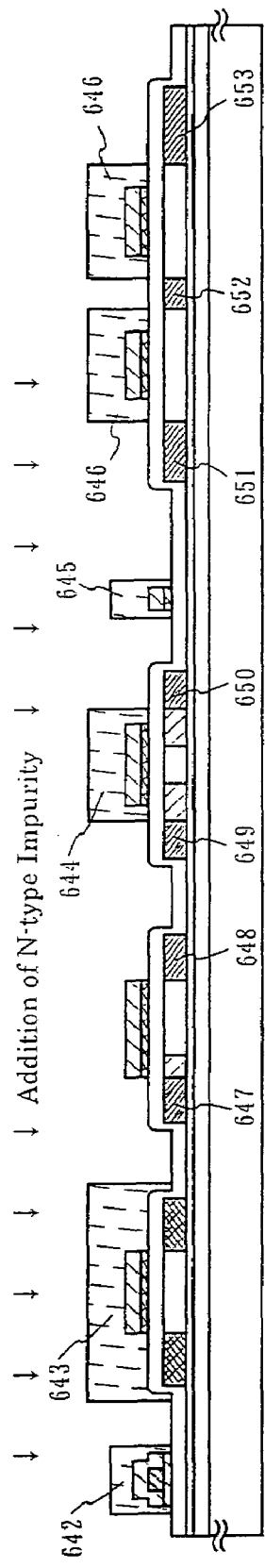

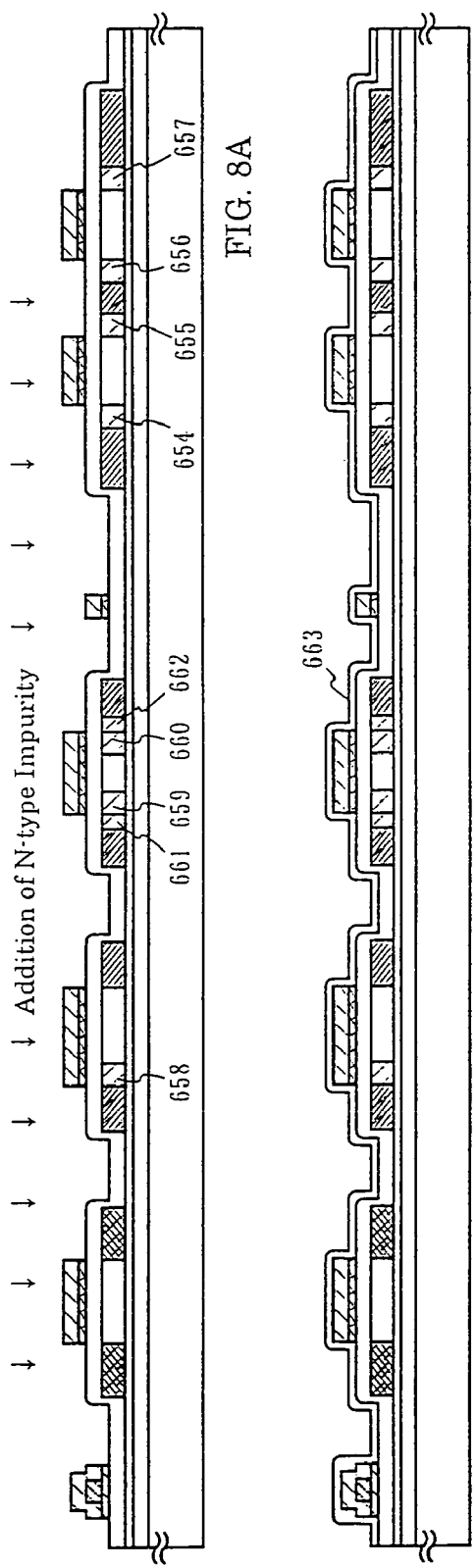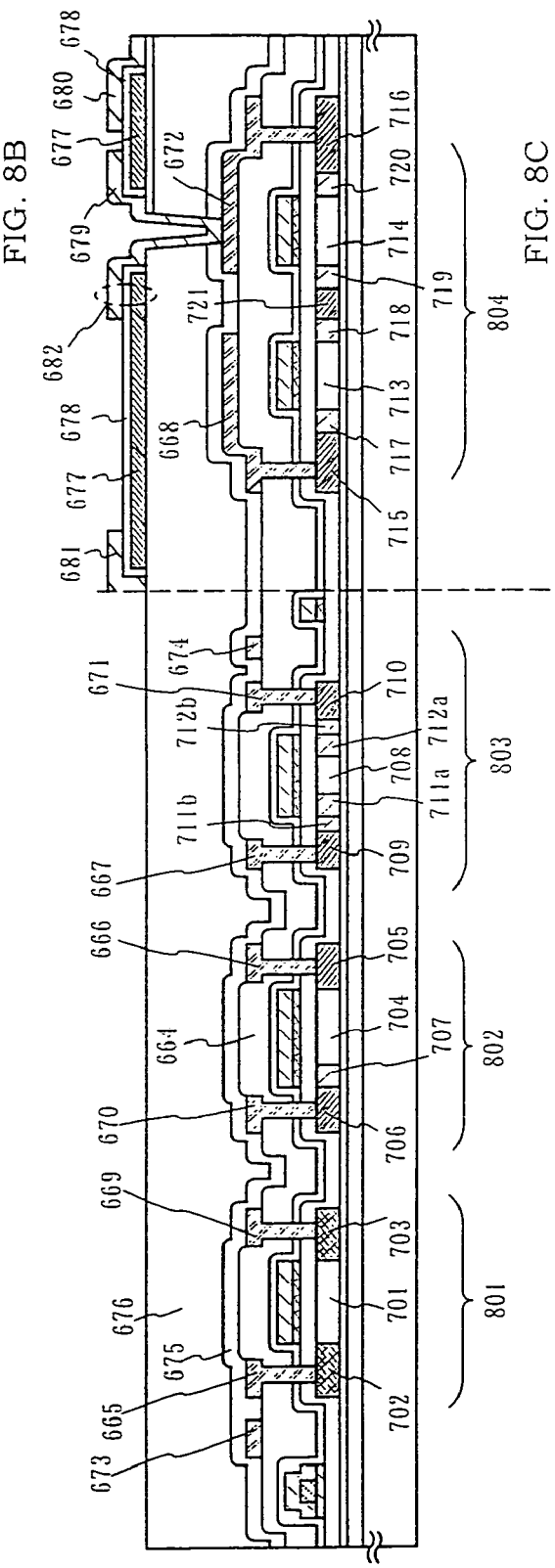

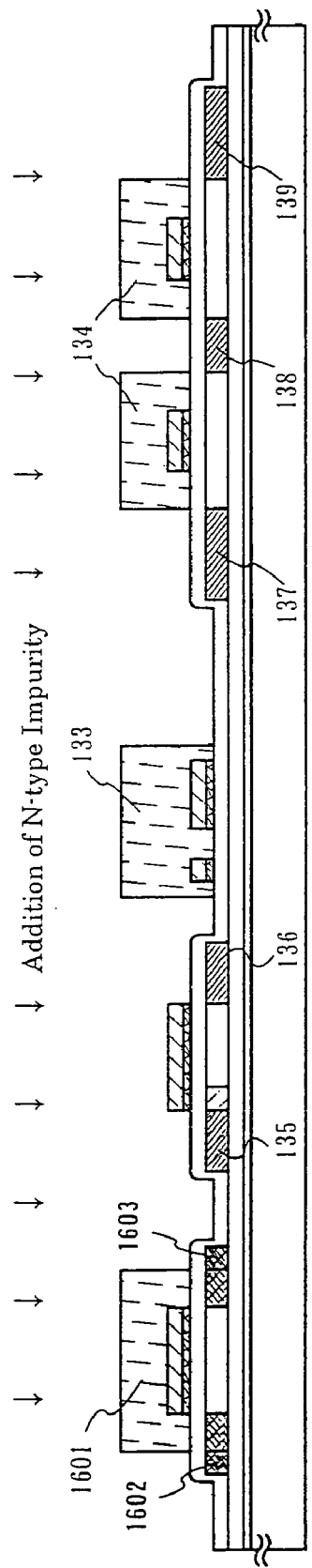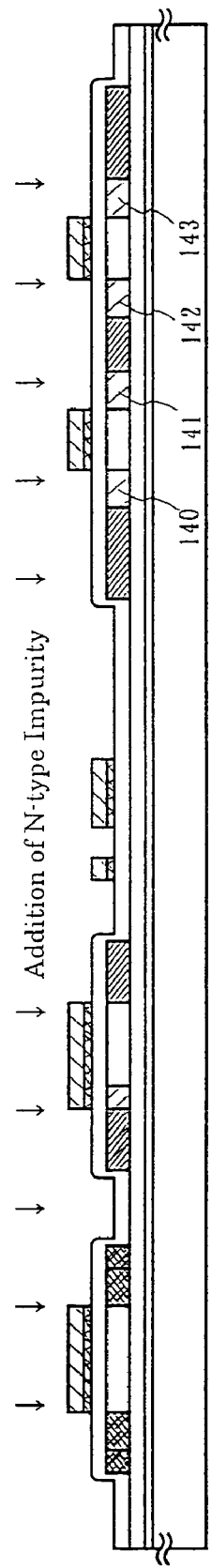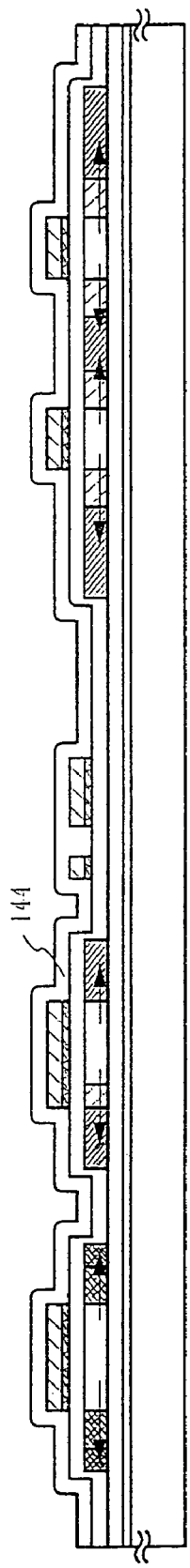

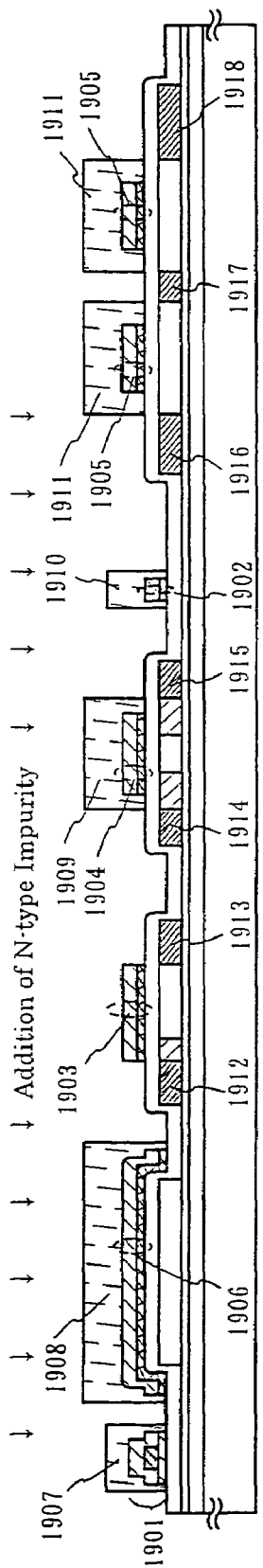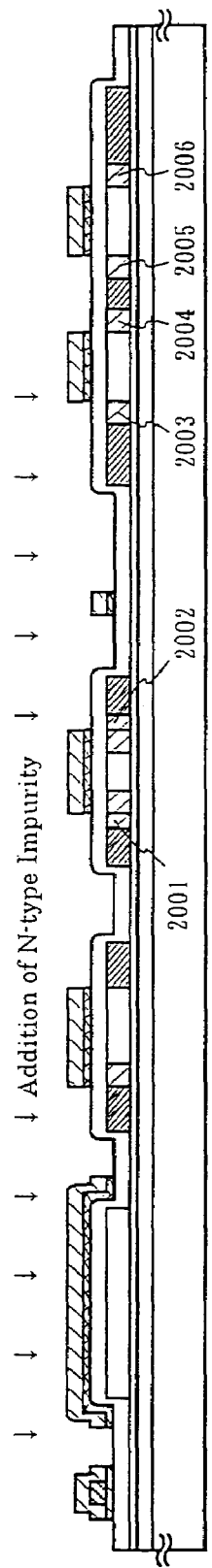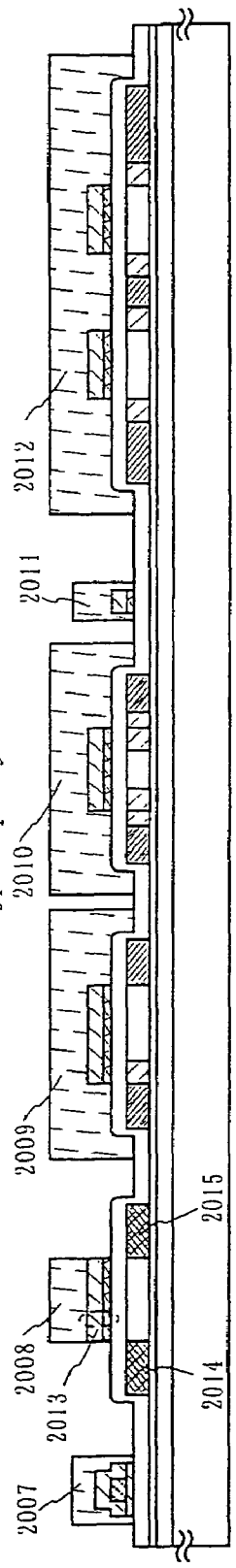

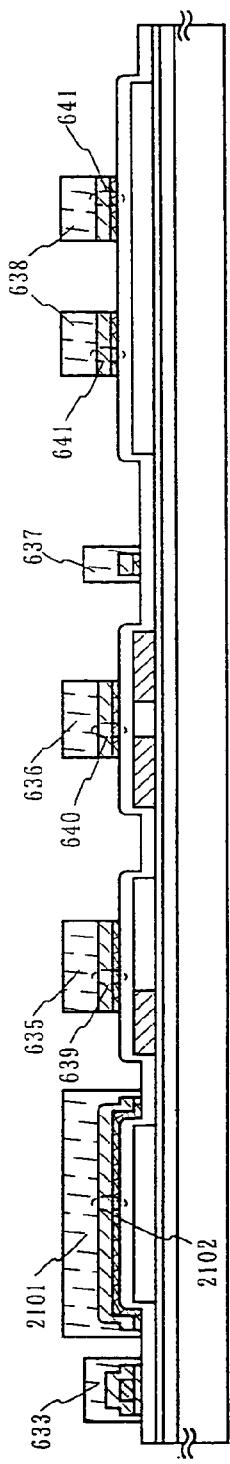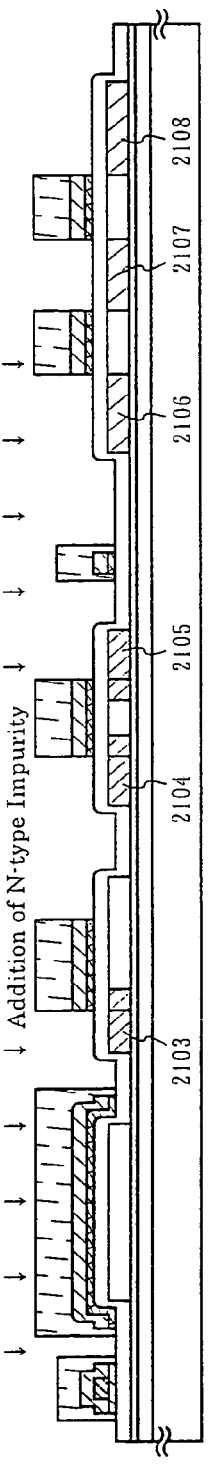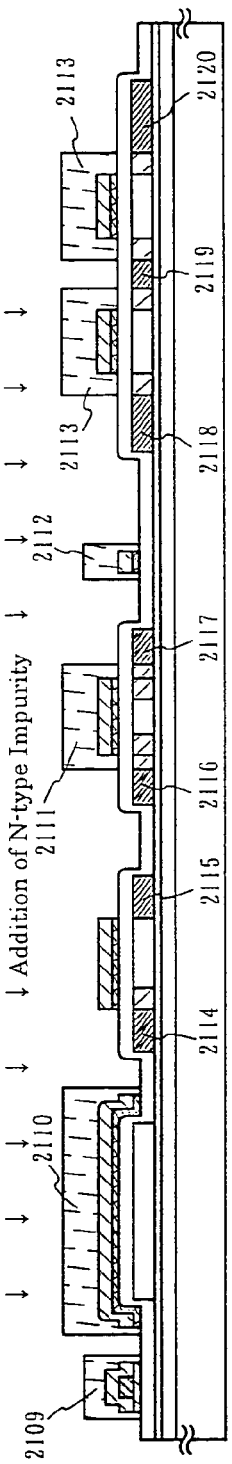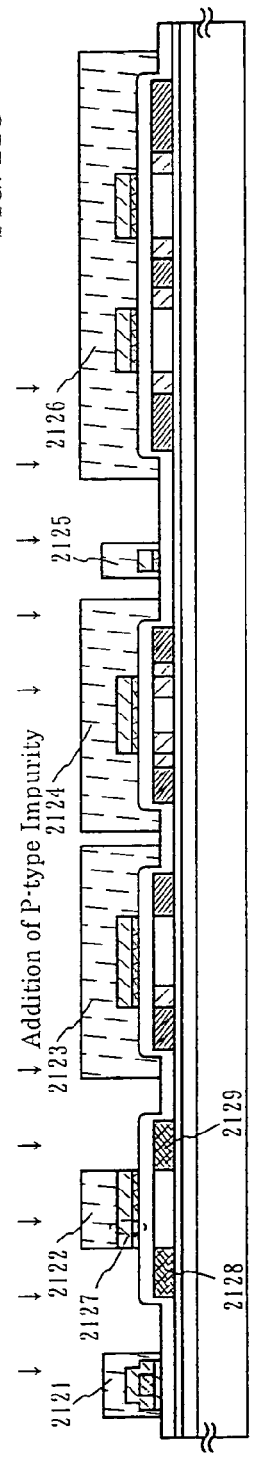

SEMICONDUCTOR DEVICE AND FABRICATION METHOD THEREOF

BACKGROUND OF THE INVENTION

1. Field of the Invention

This invention relates to a semiconductor device having a circuit comprising thin film transistors (hereinafter referred to as "TFTs") on a substrate having an insulation surface, and to a fabrication method of such a semiconductor device. More specifically, the present invention relates to electro-optical apparatuses (called also "electronic appliances") typified by a liquid crystal display device including a pixel unit (pixel matrix circuit) and driving circuits (driver circuits) disposed around the pixel unit and formed on the same substrate and an EL (Electro-Luminescence) display device, and electrical appliances (called also "electronic appliances") having the electro-optical apparatus mounted thereto.

The term "semiconductor device" used in this specification represents generally those apparatuses which function by utilizing semiconductor characteristics, and includes also the electro-optical apparatuses and electrical appliances using the electro-optical apparatus described above.

2. Description of the Related Art

Development of a semiconductor device having a large area integrated circuit, that comprises TFTs formed on a substrate having an insulation surface, has been made progressively. An active matrix type liquid crystal display device, an EL display device and a close adhesion type image sensor are typical of such semiconductor devices. Particularly because TFTs using a polycrystalline silicon film (typically, a poly-Si film) as an active layer (the TFT will be hereinafter referred to as "poly-silicon TFT") have high field mobility, they can form a variety of functional circuits.

In the active matrix type liquid crystal display device, for example, an integrated circuit that includes a pixel unit for displaying images for each functional block, a shift register circuit, a level shifter circuit, a buffer circuit, a sampling circuit, and so forth, each being based on a CMOS circuit, is formed on one substrate. In the case of the close adhesion type image sensor, an integrated circuit such as a sample-and-hold circuit, a shift register circuit, a multiplexer circuit, and so forth, is formed by using the TFTs.

These driving circuits (which are also called "peripheral driving circuits") do not always have the same operating condition. Therefore, the characteristics required for the TFTs are naturally different to certain extents. The pixel unit comprises a pixel TFT functioning as a switching device and an auxiliary holding capacitance, and a voltage is applied to a liquid crystal to drive it. Here, an alternating current must be applied to drive the liquid crystal, and a system called "frame inversion driving" has gained a wide application. Therefore, one of the required characteristics of the TFT is that an OFF current value (a drain current value flowing through the TFT when it is in the OFF operation) must be sufficiently lowered. Because a high driving voltage is applied to the buffer circuit, the TFT must have a high withstand voltage such that it does not undergo breakdown even when a high voltage is applied. In order to improve the current driving capacity, it is necessary to sufficiently secure the ON current value (the drain current value flowing through the TFT when it is in the ON operation).

However, the poly-silicon TFT involves the problem that its OFF current is likely to become high. Degradation such as the drop of the ON current value is observed in the poly-silicon TFT in the same way as in MOS transistors used for ICs, or the like. It is believed that the main cause is hot carrier injection, and the hot carriers generated by a high field in the proximity of the drain presumably invite this degradation.

An LDD (Lightly Doped Drain) structure is known as a structure of the TFT for lowering the OFF current value. This structure forms an impurity region having a low concentration between a channel formation region and a source or drain region to which an impurity is doped in a high concentration. The low concentration impurity region is called the "LDD region".

A so-called "GOLD (Gate-drain Overlapped LDD) structure" is also known as a structure for preventing deterioration of the ON current value by hot carrier injection. Since the LDD region is so arranged as to overlap with a gate wiring through a gate insulation film in this structure, this structure is effective for preventing hot carrier injection in the proximity of the drain and for improving reliability. For example, Mutsuko Hatano, Hajime Akimoto and Takeshi Sakai, "IEDM97 Technical Digest", pp. 523-526, 1997, discloses a GOLD structure using side walls formed from silicon. It has been confirmed that this structure provides by far higher reliability than the TFTs having other structures.

In an active matrix type liquid crystal display device, a TFT is disposed for each of dozens to millions of pixels and a pixel electrode is disposed for each TFT. An opposing electrode is provided on an opposing substrate side sandwiching a liquid crystal, and forms a kind of capacitors using the liquid crystal as a dielectric. The voltage to be applied to each pixel is controlled by the switching function of the TFT. As the charge to this capacitor is controlled, the liquid crystal is driven, and an image is displayed by controlling the quantity of transmitting rays of light.

However, the accumulated capacity of this capacitor decreases gradually due to a leakage current resulting from the OFF current, or the like. Consequently, the quantity of transmitting rays of light changes, thereby lowering the contrast of image display. Therefore, it has been customary to dispose a capacitance wiring, and to arrange another capacitor (called a "holding capacitance") in parallel with the capacitor using the liquid crystal as the dielectric in order to supplement the capacitance lost by the capacitor using the liquid crystal as the dielectric.

Nonetheless, the required characteristics of the pixel TFT of the pixel unit are not always the same as the required characteristics of the TFT (hereinafter called the "driving TFT") of a logic circuit (called also the "driving circuit") such as the shift register circuit and the buffer circuit. For example, a large reverse bias voltage (a negative voltage in n-channel TFT) is applied to the gate wiring in the pixel TFT, but the TFT of the driving circuit is not fundamentally driven by the application of the reverse bias voltage. The operation speed of the former may be lower than $\frac{1}{100}$ of the latter.

The GOLD structure has a high effect for preventing the degradation of the ON current value, it is true, but is not free from the problem that the OFF current value becomes greater than the ordinary LDD structures. Therefore, the GOLD structure cannot be said as an entirely preferable structure for the pixel TFT, in particular. On the contrary, the ordinary LDD structures have a high effect for restricting the OFF current value, but is not resistant to hot carrier injection, as is well known in the art.

For these reasons, it is not always preferred to constitute all the TFTs by the same construction in the semiconductor devices having a plurality of integrated circuits such as the active matrix type liquid crystal display device.

When a sufficient capacitance is secured by forming a holding capacitance using the capacitance wiring in the pixel unit as represented by the prior art example described above, an aperture ratio (a ratio of an area capable of image display to an area of one pixel) must be sacrificed. Particularly in the case of a small high precision panel used for a projector type display device, the area per pixel is so small that the drop of the aperture ratio by the capacitance wiring becomes a serious problem.

SUMMARY OF THE INVENTION

In order to solve the problems described above, the present invention aims at improving operation performance and reliability of a semiconductor device by optimizing the structures of the TFT used for each circuit of the semiconductor device in accordance with the function of each circuit.

It is another object of the present invention to provide a structure for lowering the area of a holding capacitance provided to each pixel and for improving an aperture ratio in a semiconductor device having a pixel unit.

To accomplish the objects described above, the present invention employs the following constructions. In a semiconductor device including a pixel unit and a driving circuit on the same substrate, the present invention provides a semiconductor device wherein an LDD region of an n-channel TFT forming the driving circuit described above is formed in such a fashion that a part or the whole part thereof overlaps with a gate wiring of the n-channel TFT while sandwiching a gate insulation film between them, and an LDD region of a pixel TFT that forms the pixel unit is formed in such a fashion as not to overlap with a gate wiring of the pixel TFT while sandwiching a gate insulation film.

In addition to the construction described above, the holding capacitance of the pixel unit may comprise a shading film arranged on a resin film, an oxide of the shading film and a pixel electrode. According to this arrangement, the holding capacitance can be formed with an extremely small area and consequently, the aperture ratio of the pixel can be improved.

Another detailed construction according to the present invention is as follows. In a semiconductor device including a pixel unit and a driving circuit on the same substrate, this driving circuit includes a first n-channel TFT formed in such a fashion that the whole part of its LDD region overlaps with a gate wiring while sandwiching a gate insulation film between them, and a second n-channel TFT formed in such a fashion that a part of its LDD region overlaps with a gate wiring while sandwiching a gate insulation film between them, and the pixel unit includes a pixel TFT formed in such a fashion that an LDD region does not overlap with a gate wiring while sandwiching a gate insulation film between them. Needless to say, a holding capacitance of the pixel unit may comprise a shading film disposed on an organic resin film, an oxide of the shading film and a pixel electrode.

In the construction described above, the LDD region of the n-channel TFT forming the driving circuit may contain an element belonging to the Group 15 of the Periodic Table in a concentration higher by 2 to 10 times that of the LDD region of the pixel TFT. The LDD region of the first n-channel TFT may be formed between a channel formation region and a drain region, and the LDD regions of the second n-channel TFT may be so formed as to sandwich the channel formation region between them.

As to a method of fabricating a semiconductor device, the present invention employs the following construction. In a method of fabricating a semiconductor device including a pixel unit and a driving circuit on the same substrate, the method according to the present invention comprises the steps of forming a channel formation region, a source region, a drain region and an LDD region between the drain region and the channel formation region, in an active layer of a first n-channel TFT that forms the driving circuit; forming a channel formation region, a source region, a drain region, an LDD region between the source region and the channel formation region and an LDD region between the drain region and the channel formation region, in an active layer of a second n-channel TFT that forms the driving circuit; forming a channel formation region, a source region and a drain region in an active layer of a p-channel TFT that forms the driving circuit; and forming a channel formation region, a source region, a drain region and an LDD region between the drain region and the channel formation region, in an active layer of a pixel TFT that forms the pixel unit; wherein the LDD region of the first n-channel TFT is formed in such a fashion that the whole part thereof overlaps with the gate wiring of the first n-channel TFT while sandwiching the gate insulation film between them, the LDD region of the second n-channel TFT is formed in such a fashion that a part thereof overlaps with the gate wiring of the first n-channel TFT while sandwiching the gate insulation film between them, and the LDD region of the pixel TFT is so arranged as not to overlap with the gate wiring of the pixel TFT while sandwiching the gate insulation film between them.

As to the fabrication method, the present invention employs the following another construction. In a method of fabricating a semiconductor device including a pixel unit and a driving circuit on the same substrate, the method of the present invention comprises a first step of forming an active layer on a substrate; a second step of forming a gate insulation film in contact with the active layer; a third step of adding an element belonging to the Group 15 of the Periodic Table to an active layer of an n-channel TFT forming the driving circuit, and forming an $n^-$ region; a fourth step of forming a conductive film on the gate insulation film; a fifth step of patterning the conductive film and forming a gate wiring of a p-channel TFT; a sixth step of adding an element belonging to the Group 13 of the Periodic Table in self-alignment to the active layer of the p-channel TFT with the gate wiring of the p-channel TFT as a mask, and forming a $p^{++}$ region; a seventh step of patterning the conductive film that is not patterned in the fifth step, and forming a gate wiring of then-channel TFT; an eighth step of adding an element belonging to the Group 15 of the Periodic Table to the active layer of the n-channel TFT, and forming an $n^+$ region; and a ninth step of adding an element belonging to the Group 15 of the Periodic Table in self-alignment with the gate wirings of the n-channel TFT and the p-channel TFT as the masks, and forming an $n^{--}$ region.

In a method of fabricating a semiconductor device including a pixel unit and a driving circuit on the same substrate, a further detailed construction of the method of the present invention comprises a first step of a first step of forming an active layer on a substrate; a second step of forming a gate insulation film in contact with the active layer; a third step of adding an element belonging to the Group 15 of the Periodic Table to an active layer of an n-channel TFT forming the driving circuit, and forming an $n^-$ region; a fourth step of forming a conductive film on the gate insulation film; a fifth step of patterning the conductive film and forming a gate wiring of a p-channel TFT; a sixth step of adding an element belonging to the Group 13 of the Periodic Table in self-alignment to the active layer of the p-channel TFT with the gate wiring of the p-channel TFT as a mask, and forming a p$^{++}$ region; a seventh step of patterning the conductive film, that is not patterned in the fifth step, and forming a gate wiring of the n-channel TFT; an eighth step of adding an element belonging to the Group 15 of the Periodic Table to the active layer of the n-channel TFT, and forming an n$^+$ region; and a ninth step of adding an element belonging to the Group 15 of the Periodic Table in self-alignment with the gate wirings of the n-channel TFT and the p-channel TFT as the masks, and forming an n$^{--}$ region.

In the construction described above, the sequence of the process steps for forming the p$^{++}$ region, the n$^+$ region or the n$^{--}$ region may be changed appropriately. Whichever sequence may be employed, the basic function of the TFT formed finally does not change and the effects of the present invention are not spoiled in any way.

BRIEF DESCRIPTION OF THE DRAWINGS

FIGS. 1A to 1C are schematic sectional views showing a fabrication process of a pixel unit and a driving circuit;

FIGS. 3A to 3C are schematic sectional views showing a fabrication process of a pixel unit and a driving circuit;

FIGS. 7A to 7C are schematic sectional views showing a fabrication process of a pixel unit and a driving circuit;

FIGS. 8A to 8C are schematic sectional views showing a fabrication process of a pixel unit and a driving circuit;

FIGS. 16A to 16C are schematic sectional views showing a fabrication process of a pixel unit and a driving circuit;

FIGS. 20A to 20C are schematic sectional views showing a fabrication process of a pixel unit and a driving circuit;

FIGS. 21A to 21D are schematic sectional views showing a pixel unit and a driving circuit;

DESCRIPTION OF THE PREFERRED EMBODIMENTS

Figure 2A:
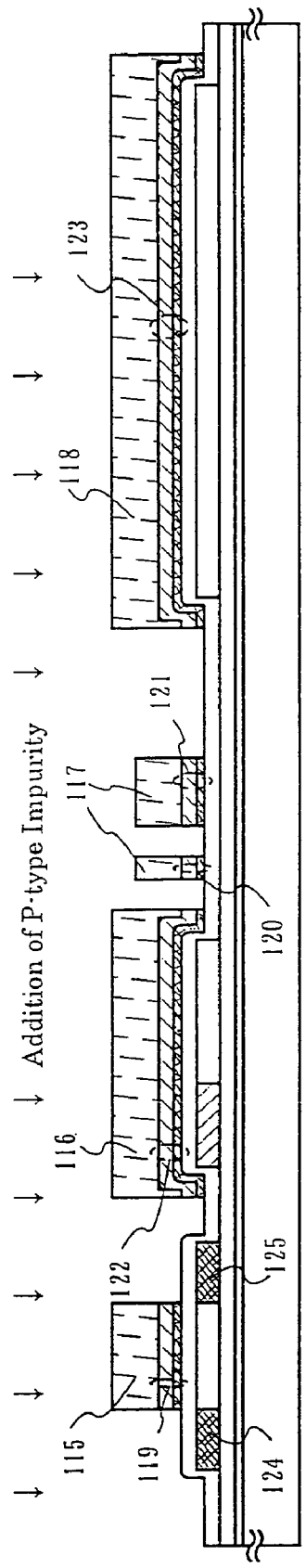
FIGS. 2A to 2C are schematic sectional views showing a fabrication process of a pixel unit and a driving circuit.

Hereinafter, preferred embodiments of the present invention will be explained in detail with reference to Examples thereof.

EXAMPLE 1

The first example will be explained with reference to FIGS. 1A to 1C, 2A to 2C and 3A to 3C. A method of simultaneously fabricating TFT of a pixel unit and TFT of a driving circuit disposed around the pixel unit will be explained.

FIG. 1A shows the formation step of active layers and a gate insulation film.

In FIG. 1A, a substrate 101 is preferably made of a glass substrate, a quartz substrate or a plastic substrate (inclusive of a plastic film). A silicon substrate or a metal substrate having an insulation film on the surface thereof can be used, too.

An underlying film 102 that comprises a silicon-containing insulation film (the term "insulation film" generically represents a silicon oxide film, a silicon nitride film and a silicon nitride oxide film in this specification) is formed by a plasma CVD process or a sputtering process to a thickness of 100 to 400 nm on the surface of the substrate 101 on which the TFTs are to be fabricated. The term "silicon nitride oxide film" used in this specification represents an insulation film expressed by the general formula $SiO_xN_y$ (where 0<x and y<1) and containing silicon, oxygen and nitrogen in a predetermined proportion.

In this example, the underlying film 102 has a two-layered structure consisting of a silicon nitride film 102 that has a thickness within the range of 25 to 100 nm and is hereby 50 nm and a silicon oxide film 103 that has a thickness within the range of 50 to 300 nm and is hereby 150 nm. The underlying film 102 is disposed so as to prevent contamination of impurities from the substrate, and need not always be disposed when the quartz substrate is used.

Next, an amorphous silicon film having a thickness of 20 to 100 nm is formed on the underlying film 102 by a known film formation method. The amorphous silicon film is preferably subjected to a dehydrogenation treatment preferably at 400 to 550° C. for several hours, though the treatment temperature and time vary depending on the hydrogen content. A crystallization step is preferably carried out after the hydrogen content is lowered to not greater than 5 atomic %. Though the amorphous silicon film may be formed by other fabrication methods such as sputtering and vacuum deposition, impurity elements contained in the film such as oxygen and nitrogen are preferably lowered sufficiently. Because the underlying film and the amorphous silicon film can be formed by the same film formation method, they may be formed hereby continuously. When the underlying film is prevented from being exposed once to the atmospheric air after its formation, surface contamination can be prevented, and variance of characteristics of the resulting TFT can be reduced.

A process step of forming the crystalline silicon film from the amorphous silicon film may use a known laser crystallization technology or thermal crystallization technology. The crystalline silicon film may be formed by the thermal crystallization method using a catalytic element that promotes crystallization of silicon. Besides the amorphous silicon film, a micro-crystalline silicon film may be used or the crystalline silicon film may be directly deposited. Furthermore, the crystalline silicon film may be formed by using the known technology of SOI (Silicon On Insulators) that bonds single crystal silicon onto the substrate.

Unnecessary portions of the crystalline silicon film thus formed are etched away to form island-like semiconductor films (hereinafter called the "active layers") 104, 105 and 106. Boron (B) may be doped in advance in a concentration of about $1 \times 10^{15}$ to $1 \times 10^{17}$ cm$^{-3}$ into regions of the crystalline silicon film where n-channel TFT is to be formed, in order to control a threshold voltage.

Next, a gate insulation film 107 consisting essentially of silicon oxide or silicon nitride as the principal component is so formed as to cover the active layers 104, 105 and 106. The gate insulation film 107 is formed to a thickness of 10 to 200 nm, preferably 50 to 150 nm. For example, a silicon nitride oxide film is formed by a plasma CVD process to a thickness of 75 nm from $N_2O$ and $SiH_4$ as the starting materials. This film is then oxidized thermally at 800 to 1,000° C. in an oxygen atmosphere or in a mixed atmosphere of oxygen and hydrochloric acid, giving a 115 nm-thick gate insulation film.

FIG. 1B shows the formation of an n$^-$ region.

Resist masks 108, 109, 110 and 111 are formed over the surface of the active layers 104 and 106, the entire surface of the regions in which wiring is to be formed, and over a part of the active layer 105 (inclusive of the region which is to serve as the channel formation region). An n-type imparting impurity element is added to form a low concentration impurity region 112. This low concentration impurity region 112 is the impurity region for forming later an LDD region (which is called the "Lov region" in this specification with "ov" representing "overlap") that overlaps with the gate wiring through the gate insulation film beneath the n-channel TFT of a CMOS circuit. The concentration of the impurity element for imparting the n-type that is contained in the resulting low concentration impurity region, is expressed by "n$^-$". Therefore, the low concentration impurity region 112 can be paraphrased to the "n$^-$ region" in this specification.

In this example, phosphorus is added by ion doping that excites phosphine ($PH_3$) by plasma excitation without executing mass separation. An ion implantation method that executes mass separation may be used naturally. In this process step, phosphorus is added to the semiconductor layer beneath the gate insulation film 107 through this film 107. The phosphorus concentration to be doped is preferably within the range of $2 \times 10^{16}$ to $5 \times 10^{19}$ atoms/cm$^3$, and is hereby $1 \times 10^{18}$ atoms/cm$^3$.

After the resist masks 108, 109, 110 and 111 are removed, heat-treatment is carried out at 400 to 900° C., preferably 550 to 800° C., for 1 to 12 hours in a nitrogen atmosphere so as to activate phosphorus that is doped. This activation may be effected by irradiating a laser beam. Though this process step can be omitted, a higher activation ratio can be expected if this step is conducted.

FIG. 1C shows the formation of conductive films for gate wirings.

A first conductive film 113 is formed to a thickness of 10 to 100 nm by using an element selected from the group consisting of tantalum (Ta), titanium (Ti), molybdenum (Mo) and tungsten (W), or conductive materials of any of these elements as the principal component. Tantalum nitride (TaN) or tungsten nitride (WN), for example, is preferably used for the first conductive film 113.

A second conductive film 114 is formed to a thickness of 100 to 400 nm on the first conductive film 113 by using an element selected from the group consisting of Ta, Ti, Mo and W, or a conductive material of any of these elements as the principal component. For example, Ta may be formed to a thickness of 200 nm. It is hereby effective to form a silicon film to a thickness of about 2 to 20 nm beneath the first conductive film 113 or on the second conductive film 114 in order to prevent oxidation of the conductive films 113 and 114 (particularly, the conductive film 114).

FIG. 2A shows the formation of a p-channel gate wiring and the formation of p$^{++}$ regions.

After resist masks 115, 116, 117 and 118 are formed, the first conductive film and the second conductive film (which will be handled hereinafter as a laminate film) are etched, giving a gate wiring 119 (also called the "gate electrode") of the p-channel TFT and gate wirings 120 and 121. Incidentally, the conductive films 122 and 123 are left non-etched in such a manner as to cover the entire surface of the region that is to serve as the n-channel TFT.

The resist masks 115, 116, 117 and 118 are left as the masks, and a process step of doping an impurity element for imparting the p-type is carried out for a part of the semiconductor layer 104 at which the p-channel TFT is formed. Boron is used hereby as the impurity element and is doped by an ion doping method using diborane ($B_2H_6$). (Needless to say, an ion implantation method may be employed, too.) In this instance, boron is doped in a concentration of $5 \times 10^{20}$ to $3 \times 10^{21}$ atoms/cm$^3$. Incidentally, the concentration of the p-type imparting impurity element contained in the resulting impurity region is hereby expressed as "p++". Therefore, the impurity regions 124 and 125 can be paraphrased to the "p$^{++}$ regions" in this specification.

Incidentally, in this process step, a process step may be carried out which etches away the gate insulation film 107 using the resist masks 115, 116, 117 and 118 to expose a part of the active layer 104 and then adds the p-type imparting impurity element. In this case, since the acceleration voltage may be low, damage to the active layer is small, and throughput can be improved.

Figure 2B:
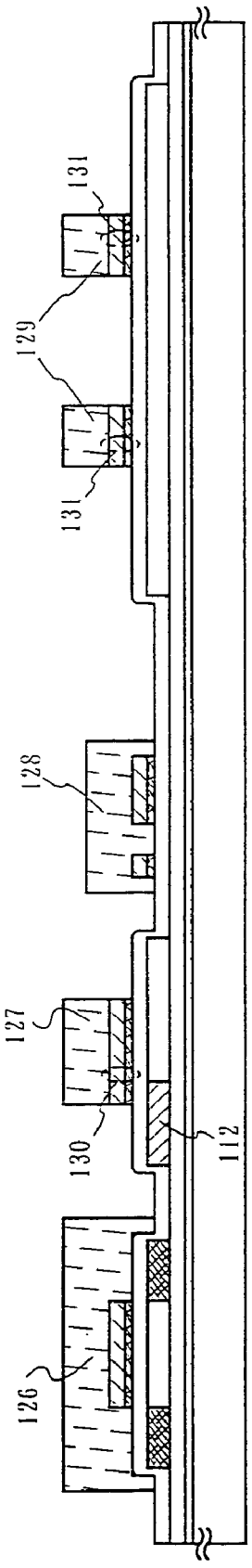

FIG. 2B shows the formation of n-channel gate wirings.

After the resist masks 115, 116, 117 and 118 are removed, resist masks 126, 127, 128 and 129 are formed, and gate wirings 130 and 131 of the n-channel TFT are formed. At this time, the gate wiring 130 is formed in such a manner as to overlap with the n$^-$ region 112 through the gate insulation film 107.

Figure 2C:
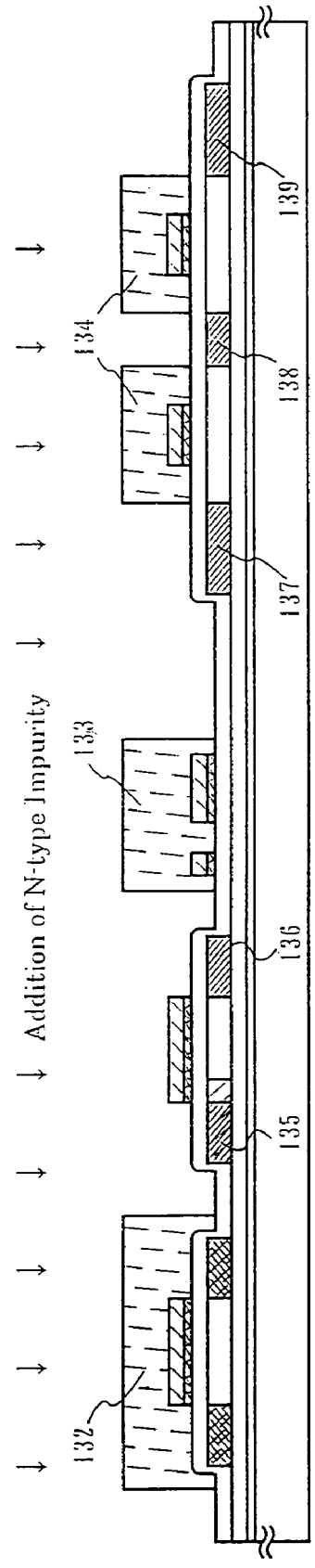

FIG. 2C shows the formation of n$^+$ regions.

The resist masks 126, 127, 128 and 129 are removed, and resist masks 132, 133 and 134 are formed afresh. A process step of forming an impurity region, that is to function as a source or drain region in each n-channel TFT, is carried out. The resist mask 134 is formed in such a manner as to cover the gate wiring 131 of the n-channel TFT to form the LDD region in such a manner that the gate wiring does not overlap with the n-channel TFT of the pixel unit in a subsequent process step.

An n-type imparting impurity element is added to form impurity regions 135, 136, 137, 138 and 139. Here, the ion doping method that uses phosphine (PH$_3$) is employed. (Needless to say, the ion implantation method may be employed, as well.) The phosphorus concentration in this region is $1 \times 10^{20}$ to $1 \times 10^{21}$ atoms/cm$^3$. The concentration of the n-type imparting impurity element contained in the impurity regions 137, 138 and 139 is hereby expressed as "n$^+$". Therefore, the impurity regions 137, 138 and 139 in this specification can be paraphrased to the "n$^+$ regions". Strictly speaking, since the n$^-$ region has been formed already, the impurity region 135 contains phosphorus in a somewhat higher concentration than the impurity regions 136, 137, 138 and 139.

In this process step, a step of adding the n-type imparting impurity element may be conducted after the gate insulation film 107 is etched using the resist masks 132, 133 and 134 and the gate wiring 130 as the masks to expose a part of the active layers 105 and 106. In this case, since the acceleration voltage may be low, damage to the active layer is small and throughput can be improved.

FIG. 3A shows the formation of n$^{--}$ regions.

The resist masks 132, 133 and 134 are removed, and a process step of adding an n-type imparting impurity element to the active layer 106, that is to serve as the n-channel TFT, is carried out. The impurity regions 140, 141, 142 and 143 thus formed contain phosphorus in a concentration of ½ to ¹⁄₁₀ (more concretely, $1 \times 10^{16}$ to $5 \times 10^{18}$ atoms/cm$^3$) of the n$^-$ region described above. Incidentally, the concentration of the n-type imparting impurity element contained in these impurity regions 140, 141, 142 and 143 is here by expressed by "n$^{--}$". Therefore, the impurity regions 140, 141, 142 and 143 can be paraphrased to the "n$^{--}$ regions" in this specification. In this process step, phosphorus is added in the concentration of n$^{--}$ into all the impurity regions except for the impurity region 167 that is hidden by the gate wiring. However, this concentration n$^{--}$ can be neglected because it is extremely low.

FIG. 3B shows a thermal activation step.

A protective insulation film 144, that is to serve later as a first inter-layer insulation film, is formed. The protective insulation film 144 may be a silicon nitride film, a silicon oxide film, a silicon nitride oxide film or their laminate film. The film thickness may be within the range of 100 to 400 nm.

A heat-treatment step is carried out in order to activate the n-type or p-type imparting impurity element added in each concentration. This process step can be conducted by a furnace annealing method, a laser annealing method, or a rapid thermal annealing method (RTA). This example uses the furnace annealing method. The heat-treatment is carried out in a nitrogen atmosphere at 300 to 650° C., preferably 400 to 550° C., and hereby 450° C., for 2 hours.

A heat-treatment is further carried out in an atmosphere containing 3 to 100% hydrogen at 300 to 450° C. for 1 to 12 hours so as to hydrogenate the active layer. This is the process step for terminating the dangling bonds of the semiconductor layer by hydrogen that is heated and excited. Plasma hydrogenation (using hydrogen that is excited by plasma) may be employed as another means for hydrogenation.

FIG. 3C shows the formation of inter-layer insulation films, source/drain wirings, a shading film, a pixel electrode and a holding capacitance.

After the activation step is completed, a 0.5 to 1.5 μm-thick inter-layer insulation film 145 is formed on the protective insulation film 144. A laminate film comprising the protective insulation film 144 and the inter-layer insulation film 145 is used as the first inter-layer insulation film.

Thereafter, contact holes reaching the source or drain regions of the TFT are bored, and source wirings 146, 147 and 148 and drain wirings 149 and 150 are formed. In this example, the source wirings and the drain wirings comprise a three-layered laminate film that is formed continuously by sputtering a Ti film having a thickness of 100 nm, a Ti-containing aluminum film having a thickness of 300 nm and a Ti film having a thickness of 150 nm. Incidentally, a laminate film of a copper film and a titanium nitride film may be used as the source wirings and the drain wirings.

Next, a silicon nitride film, a silicon oxide film or a silicon nitride oxide film is formed as a passivation file 151 to a thickness of 50 to 500 nm (typically, 200 to 300 nm). When hydrogenation treatment is carried out under this condition, desired results can be obtained for improving characteristics of the TFT. Similar effects can be obtained, for instance, when heat-treatment is carried out in an atmosphere containing 3 to 100% hydrogen at 300 to 450° C. for 1 to 12 hours, or by the plasma hydrogenation method. Open portions may be formed in the passivation film 151 at positions where contact holes for connecting the pixel electrodes to the drain wirings are to be later formed.

Next, a second inter-layer insulation film 152 made of an organic resin is formed to a thickness of about 1 μm. Polyimide, acrylic, polyamide, polyimideamide, BCB (benzocyclobutene), etc. can be used as the organic resin. The advantages brought forth by using the organic resin film are that the film formation method is simple, the parasitic capacitance can be reduced because a specific dielectric constant is low, and planarity is high. Organic resin films other than those described above and organic SiO compounds can be used, too. This example uses polyimide of the type that can be polymerized thermally after the application to the substrate, and the film is formed by firing at 300° C.

Next, the shading film 153 is formed on the second inter-layer insulation film 152 in the region that is to serve as the pixel unit. The shading film 153 is made of the element selected from the group consisting of aluminum (Al), titanium (Ti) and tantalum (Ta), or a material containing any of them as the principal component, and the film is formed to a thickness of 100 to 300 nm. An oxide (oxide film) 154 is formed to a thickness of 30 to 150 nm (preferably, 50 to 75 nm) on the surface of the shading film 153 by an anodic oxidation method or a plasma oxidation method. This example uses the aluminum film or the film consisting essentially of aluminum as the principal component for the shading film 153 and the aluminum oxide film (alumina film) for the oxide 154.

Though the insulation film is deposited only to the surface of the shading film in this example, the insulation film may be formed by the gaseous phase method such as the plasma CVD method, the thermal CVD method or the sputtering method. In such a case, too, the film thickness is preferably 30 to 150 nm (preferably, 50 to 75 nm). A silicon oxide film, a silicon nitride film, a silicon nitride oxide film, a DLC (Diamond-like Carbon) film or an organic resin film may be used. Furthermore, a laminate film combining these films may be used, too.

Next, contact holes reaching the drain wiring 150 are formed in the second inter-layer insulation film 152, thereby forming a pixel electrode 155. Incidentally, pixel electrodes 156 and 157 are the pixel electrodes of other adjacent pixels. The pixel electrodes 155, 156 and 157 are formed of a transparent conductive film in the case of fabricating a transmission type liquid crystal display device, and are formed of a metal film in the case of fabricating a reflection type liquid crystal display device. Here, a film consisting essentially of a compound between indium oxide and tin oxide (called "ITO") is fabricated by sputtering to a thickness of 100 nm in order to obtain the transmission type liquid crystal display device.

At this time, the region 158 at which the pixel electrode 155 and the shading film 153 overlap with each other through the oxide 154 constitutes a holding capacitance.

In this way, the CMOS circuit for forming the driving circuit and the active matrix substrate having the pixel unit are completed on the same substrate. Incidentally, the n-channel TFT 181 and the p-channel TFT 182 are formed in the CMOS circuit that constitutes the driving circuit, and the pixel TFT 183 comprising the n-channel TFT is formed in the pixel unit.

In the p-channel TFT 181 of the CMOS circuit, the channel formation region 161, the source region 162 and the drain region 163 are formed. Each of the source region 162 and the drain region 163 is formed of the $p^{++}$ region. In the n-channel TFT 182, the channel formation region 164, the source region 165, the drain region 166 and the LDD region (Lov region) 167 that wholly overlaps with the gate wiring through the gate insulation film are formed. At this time, the source region 165 and the drain region 166 are the $n^+$ regions, and the Lov region 167 is the $n^-$ region. More strictly, the drain region 166 is a $(n^-+n^+)$ region.

Referring to FIG. 3C, the Lov region is shown disposed only on one side of the channel formation region 164 (only on the drain region side) in order to reduce the resistance component as much as possible. However, the Lov region may be disposed on both sides while sandwiching the channel formation region 164 between them.

Formed in the pixel TFT 183 are the channel formation regions 168 and 169, the source region 170, the drain region 171, the LDD regions not overlapping with the gate wiring through the gate insulation film (this LDD region will be called hereinafter the "Loff region"; "off" represents hereby "offset") 172, 173, 174 and 175, and the $n^+$ region 176 (which is effective for reducing the OFF current value) that keeps contact with the Loff regions 173 and 174. At this time, the source region 170 and the drain region 171 comprise the $n^+$ region, respectively, and the Loff regions 172, 173, 174 and 175 comprise the $n^{--}$ region, respectively.

This invention can optimize the structure of the TFT for forming each circuit in accordance with the circuit specification required by the pixel unit and by the driving circuit, and can improve operation performance of the semiconductor device and its reliability. Speaking more concretely, the arrangement of the LDD regions is rendered different for the n-channel TFTs in accordance with the circuit specification, and the TFT structure making the most of the high speed operation or the countermeasure for the hot carrier and the TFT structure making the most of the low OFF current operation are accomplished on the same substrate because the Lov regions and the Loff regions are skillfully arranged.

In the case of the active matrix type liquid crystal display device, for example, the n-channel TFT 182 is suitable for a logic circuit such as a shift register circuit, a frequency division circuit, a signal division circuit, a level shifter circuit or a buffer circuit, for which the high speed operation is of importance. The n-channel TFT 183 is suitable for the pixel unit, a sampling circuit (called also a "transfer gate"), etc, for which the low OFF current operation is of importance.

The length (width) of the Lov region is from 0.5 to 3.0 μm for the channel length of 3 to 7 μm, typically 1.0 to 1.5 μm. The length (width) of the Loff regions 172, 173, 174 and 175 disposed in the pixel TFT 183 is 0.5 to 3.5 μm, typically 2.0 to 2.5 μm.

EXAMPLE 2

Figure 4:
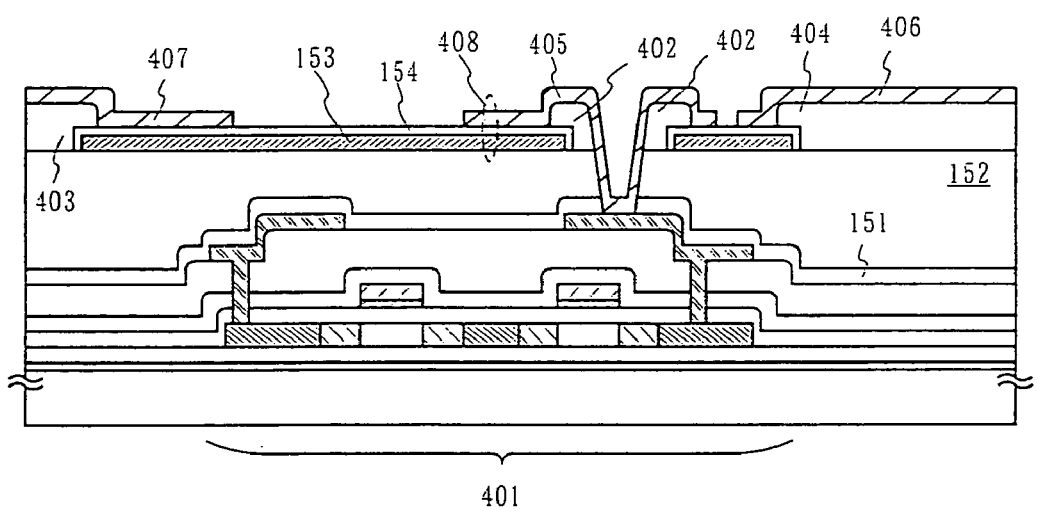
FIG. 4 is schematic sectional view showing a structure of a holding capacitance.

In this example, another structure of the holding capacitance connected to the n-channel TFT 401 of the pixel unit of the active matrix substrate will be explained with reference to FIG. 4. Incidentally, the sectional structure shown in FIG. 4 is entirely the same as that of Example 1 up to the process step of forming the oxide 154, and the structure up to this step has been explained already with reference to FIGS. 1A to 1C, 2A to 2C and 3A to 3C. Therefore, only the difference of this example from Example 1 will be explained.

After the shading film 153 and the oxide 154 obtained by oxidizing the shading film 153 are formed in accordance with the process steps of Example 1, spacers 402, 403 and 404 comprising an organic resin film are formed. A film selected from the group consisting of polyimide, polyamide, polyimideamide, acrylic and BCB (benzocyclobutene) can be used for the organic resin film. Thereafter, the spacer 402, the second inter-layer insulation film 152 and the passivation film 151 are etched to form contact holes, and the pixel electrode 405 is formed using the same material as that of Example 1. Incidentally, the pixel electrodes 406 and 407 are the pixel electrodes of other adjacent pixels.

In this way, the holding capacitance 408 is formed in the region where the shading film 153 and the pixel electrode 405 overlap with each other through the oxide 154. Because the spacers 402, 403 and 404 are disposed in the manner described above, short-circuit that would otherwise occur between the shading film 153 and each pixel electrode 405, 406 and 407 can be prevented.

Incidentally, the construction of this example can be combined with the construction of Example 1.

EXAMPLE 3

Figure 5A:
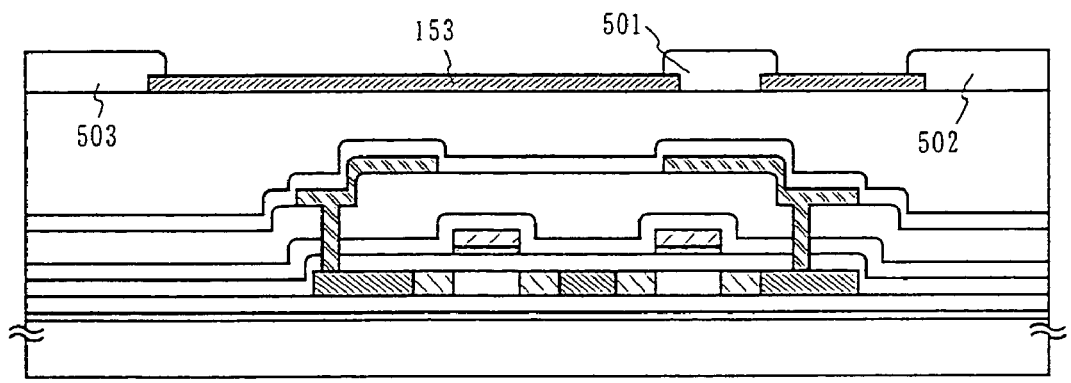
FIGS. 5A to 5C are schematic sectional views showing a fabrication process of a holding capacitance.
Figure 5B:
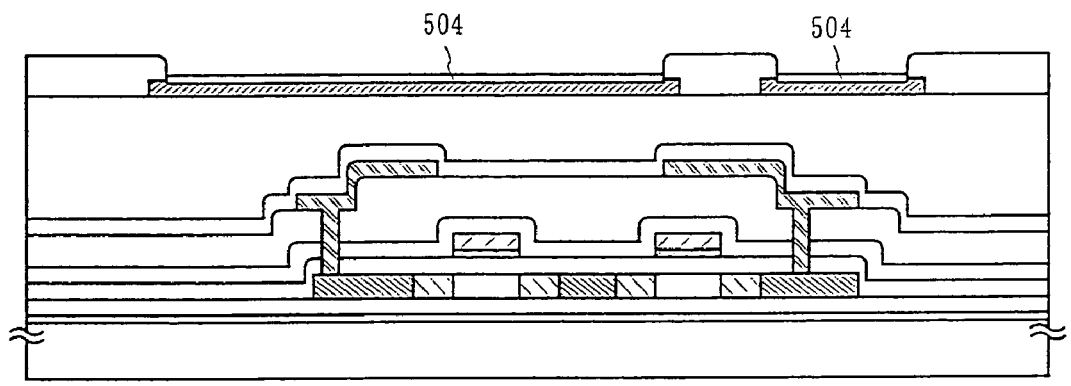
Figure 5C:
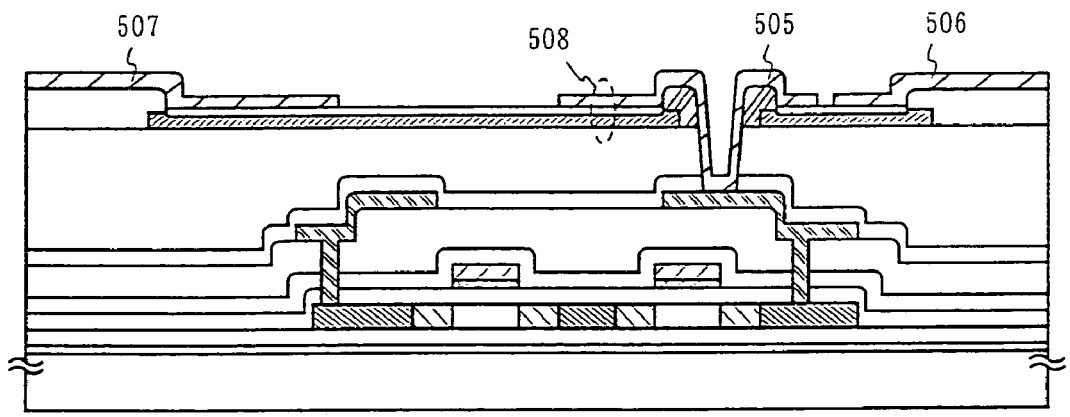

In this example, still another structure of the holding capacitance connected to the n-channel TFT of the pixel unit of the active matrix substrate will be explained with reference to FIGS. 5A to 5C. Incidentally, the sectional structure shown in FIGS. 5A to 5C is exactly the same as that of Example 1 up to the process step of forming the shading film 153, and the structure up to this process step has been explained already with reference to FIGS. 1A to 1C, 2A to 2C and 3A to 3C. Therefore, only the difference of this example from Example 1 will be explained.

After the shading film 153 is formed in accordance with the process steps of Example 1, spacers 501, 502 and 503 comprising an organic resin film are formed in such a manner as to cover the end portions of the shading film 153. A film selected from the group consisting of polyimide, polyamide, polyimideamide, acrylic and BCB (benzocyclobutene) can be used for the organic resin film (FIG. 5A).

Next, an oxide 504 is formed on the exposed surface of the shading film 153 by the anodic oxidation method or the plasma oxidation method. Incidentally, the oxide 504 is not formed at the contact portions with the spacers 501, 502 and 503 (FIG. 5B).

Next, the spacer 501, the second inter-layer insulation film 152 and the passivation film 151 are etched to form a contact hole, and a pixel electrode 505 is formed using the same material as that of Example 1. The pixel electrodes 506 and 507 are the pixel electrodes of other adjacent pixels.

In this way, the holding capacitance 508 is formed in the region where the shading film 153 and the pixel electrode 505 overlap with each other through the oxide 504. Because the spacers 501, 502 and 503 are provided, short-circuit that would otherwise occur between the shading film 153 and each pixel electrode 505, 506 and 507 can be prevented.

Incidentally, the construction of this example can be combined with the construction of Example 1.

EXAMPLE 4

In this example, a method of fabricating an active matrix substrate having a pixel unit and a CMOS circuit as the basic form of a driving circuit disposed in the periphery of the pixel unit, that are formed simultaneously, will be explained with reference to FIGS. 6A to 6D, 7A to 7C and 8A to 8C.

To begin with, a silicon nitride oxide film 602a is formed as an underlying film on a substrate 601 to a thickness of 50 to 500 nm, typically 100 nm. The silicon nitride oxide film 602a is formed using $SiH_4$, $N_2O$, and $NH_3$ as the starting material gas, and the nitrogen concentration of this film is adjusted to at least 25 atomic % to less than 50 atomic %. Heat-treatment is then carried out in a nitrogen atmosphere at 450 to 650° C. in order to render the silicon nitride oxide film 602a compact.

A silicon nitride oxide film 602b is further formed to a thickness of 100 to 500 nm, typically 200 nm, and an amorphous semiconductor film (not shown) is continuously formed to a thickness of 20 to 80 nm. This example uses an amorphous silicon film for the amorphous semiconductor film, but a micro-crystalline silicon film or an amorphous silicon-germanium film may be used, as well.

The amorphous silicon film is then crystallized by crystallization means described in Japanese Patent Laid-Open No. 7-130652 (corresponding to U.S. Pat. Nos. 5,643,826 and 5,923,962), forming a crystalline silicon film that is not shown. The technology disclosed in this prior art reference is the crystallization means that uses catalytic elements for promoting crystallization (at least one member selected from the group consisting of nickel, cobalt, germanium, tin, lead, palladium, iron and copper; typically nickel) for crystallizing the amorphous silicon film. More concretely, the reference invention conducts heat-treatment under the condition where the catalytic element is supported on the surface of the amorphous silicon film to convert the amorphous silicon film to the crystalline silicon film.

After the crystalline silicon film is formed in this way, the remaining amorphous component is crystallized as an excimer laser beam is radiated to improve crystallinity of the entire film. Incidentally, the excimer laser beam may be of a pulse oscillation type or a continuous oscillation type. When the beam is processed into a linear shape and radiated, a large substrate can be processed, too.

Figure 6A:
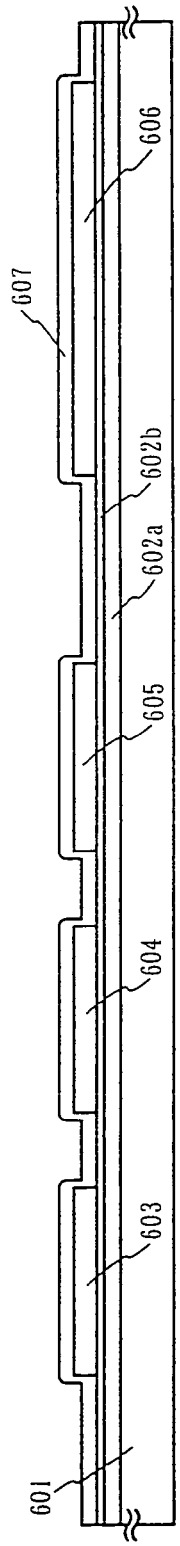
FIGS. 6A to 6D are schematic sectional views showing a fabrication process of a pixel unit and a driving circuit.

Next, the crystalline silicon film is patterned to form active layers 603, 604, 605 and 606, and a gate insulation film 607 is so formed as to cover these active layers 603 to 606. The gate insulation film 607 is a silicon nitride oxide film prepared from $SiH_4$ and $N_2O$, and is formed to a thickness of 10 to 200 nm, preferably 50 to 150 nm (FIG. 6A).

Figure 6B:
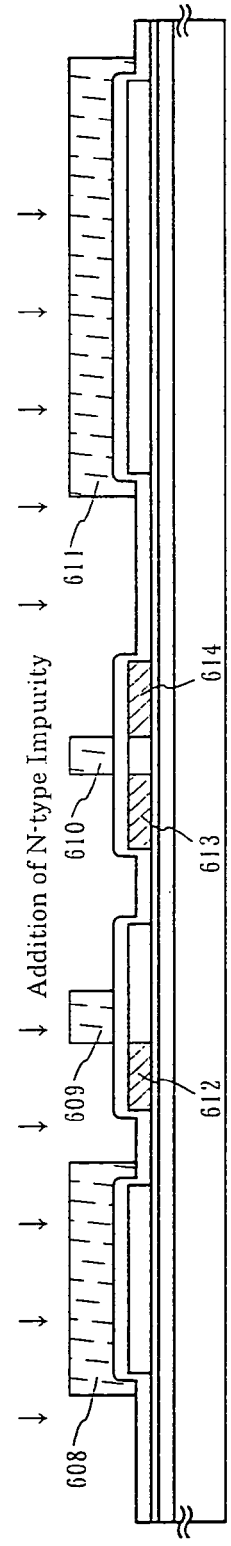

Resist masks 608, 609, 610 and 611 are then formed in such a fashion as to cover the entire surface of the active layers 603 and 606 and a part of the active layers 604 and 605 (inclusive of the channel formation region). After an n-type imparting impurity element (phosphorus in this example) is doped by the ion doping method that uses phosphine ($PH_3$), n⁻ regions 612, 613 and 614 that are to serve as the Lov region or the Loff region are formed. Since phosphorus is added to the active layers beneath the gate insulation film 607 through this film 607, an acceleration voltage is set to 65 keV. The concentration of phosphorus added to the active layers is preferably within the range of $2 \times 10^6$ to $5 \times 10^{19}$ atoms/cm³, and is hereby $1 \times 10^{18}$ atoms/cm³ (FIG. 6B).

Figure 6C:
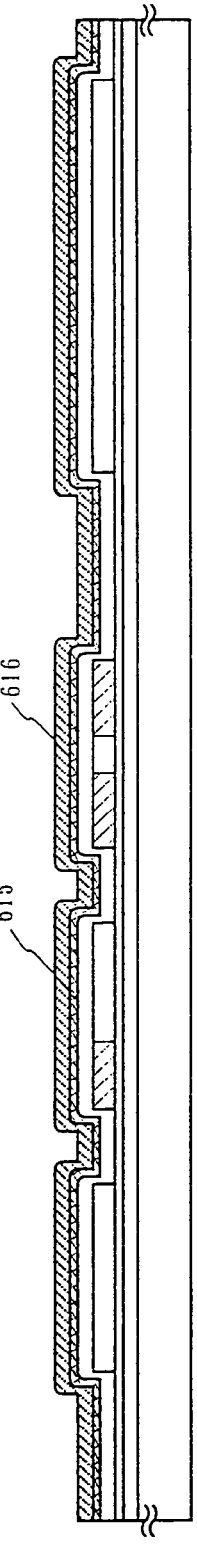

Next, tantalum nitride (TaN) is sputtered to form a first conductive film 615. Subsequently, a second conductive film 616 consisting essentially of aluminum (Al) as the principal component is formed to a thickness of 100 to 300 nm (FIG. 6C).

Figure 6D:
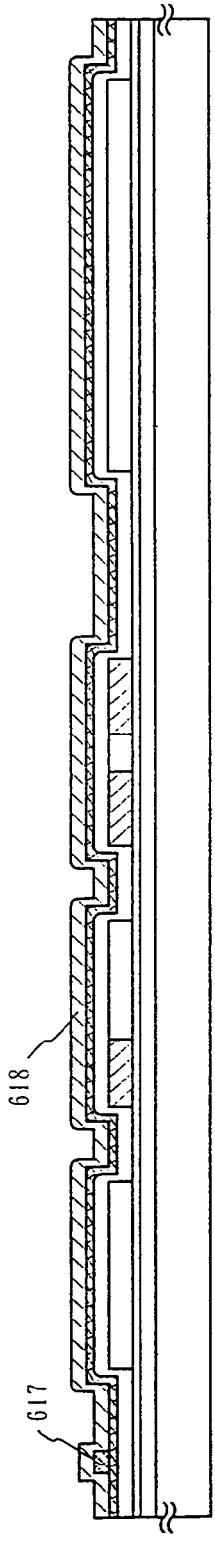

The second conductive film 616 is etched to form a wiring 617. Since the second conductive film is made of Al in this example, a selection ratio to the TaN film as the underlying film by a phosphoric acid solution is excellent. A third conductive film 618 of tantalum (Ta) is formed to a thickness of 100 to 400 nm (to 200 nm in this example) over the first conductive film 615 and the wiring 617. A tantalum nitride film may be formed further on this tantalum film 618 (FIG. 6D).

Next, resist masks 619, 620, 621, 622, 623 and 624 are formed. A part of the first and third conductive films is etched away to form a connection wiring 625 having a low resistance, a gate wiring 626 of the p-channel TFT and a gate wiring 627 of the pixel unit. The conductive films 628, 629 and 630 are left on the region that is to serve as the n-channel TFT. The connection wiring 625 is formed at a portion at which the wiring resistance is minimized (for example, a wiring portion from input/output terminals of external signals to input/output terminals of the driving circuit). Because the wiring width becomes great to a certain extent from the structural limitation, the connection wiring is not suitable for the portion that requires a miniature wiring.

The first conductive film (TaN film) and the second conductive film (Ta film) can be etched by a mixed gas of $CF_4$ and $O_2$. While the resist masks 619, 620, 621, 622, 623 and 624 are left as they are, a process step of doping a p-type imparting impurity element to a part of the active layer 603 at which the p-channel TFT is formed. Here, boron is used as the impurity element, and ion doping using diborane ($B_2H_6$) is carried out. (Needless to say, ion implantation can be used, too.) The boron concentration is $5\times10^{21}$ to $3\times10^{21}$ atoms/cm$^3$ ($2\times10^2$ atoms/cm$^3$ in this example). In this way, there are formed p$^{++}$ regions 631 and 632 containing boron in a high concentration (FIG. 7A).

In this process step, it is also possible to conduct the process step that etches the gate insulation film 107 using the resist masks 619, 620, 621, 622, 623 and 624 as the mask to expose a part of the active layer 603 and then to add boron. In this case, since the acceleration voltage may be low, damage to the active layer is small and throughput can be improved.

Next, after the resist masks 619, 620, 621, 622, 623 and 624 are removed, resist masks 633, 634, 635, 636, 637 and 638 are formed afresh. They are for forming the gate wiring of the n-channel TFTs, and gate wirings 639, 640 and 641 of then-channel TFTs are formed. At this time, the gate wirings 639 and 640 are formed in such a manner as to overlap with a part of the n$^-$ regions 612, 613 and 614 (FIG. 7B).

Next, after the resist masks 633, 634, 635, 636, 637 and 638 are removed, resist masks 642, 643, 644, 645, 646 and 647 are formed afresh. The resist masks 644 and 646 are so formed as to cover the gate wirings 640 and 641 and a part of the n$^-$ regions 612, 613 and 614.

An n-type imparting impurity element (phosphorus in this example) is added in a concentration of $1\times10^{20}$ to $1\times10^{21}$ atoms/cm$^3$ ($5\times10^{20}$ atoms/cm$^3$ in this example) to form n$^+$ regions 647, 648, 649, 650, 651, 652 and 653 in the active layers 604, 605 and 606 (FIG. 7C).

In this process step, it is also possible to conduct a process step that etches away the gate insulation film 107 using the resist masks 642, 643, 644, 645, 646 and 647 to expose a part of the active layers 604, 605 and 606 and then adds phosphorus. In this case, since the acceleration voltage may be low, damage to the active layers is small and throughput can be improved.

After the resist masks 642, 643, 644, 645 and 646 are removed, a process step of adding an n-type imparting impurity element (phosphorus in this example) to the active layer 606, that is to serve as the n-channel TFT of the pixel unit, is carried out. In this way, n$^-$ regions 654, 655, 656 and 657 to which phosphorus is added in a concentration of ½ to ⅒ (concretely, $1\times10^{16}$ to $5\times10^{18}$ atoms/cm$^3$) of the concentration of the n$^-$ region are formed (FIG. 8A).

In this process step, phosphorus is added in the concentration of n$^-$ to all the impurity regions other than the impurity regions 658, 659 and 660 that are hidden by the gate wiring. In practice, the concentration of n$^{--}$ is so low that it may be neglected. Strictly speaking, however, the regions represented by reference numerals 659 and 660 are the n$^-$ regions whereas the regions represented by reference numerals 661 and 662 are the (n$^-$+n$^{--}$) regions that contain phosphorus in a somewhat higher concentration than the n$^-$ regions 659 and 660.

Next, a protective insulation film 663 having a thickness of 100 to 400 nm is formed with a silicon nitride oxide film that is formed by the plasma CVD method using SiH$_4$, N$_2$O and NH$_3$ as the starting materials. This silicon nitride oxide film is preferably formed so that its hydrogen concentration is 1 to 30 atomic %. A silicon oxide film, a silicon nitride film and their laminate film may be used for the protective insulation film 663.

Thereafter, a heat-treatment step is carried out so as to activate then-type or p-type imparting impurity element added in a respective concentration. This step can be carried out in accordance with the furnace annealing method, the laser annealing method or the rapid thermal annealing method (RTA method). This example employs the furnace annealing method for the activation treatment. The heat-treatment is carried out in a nitrogen atmosphere at 300 to 650° C., preferably 400 to 55° C., and at 450° C. in this example, for 2 hours.

A heat-treatment is further carried out in an atmosphere containing 3 to 100% hydrogen, at 300 to 450° C. for 1 to 12 hours so as to hydrogenate the active layers. This is the step that terminates the dangling bonds of the semiconductor layer by hydrogen that is thermally excited. Plasma hydrogenation (using hydrogen that is excited by plasma) may be used as another hydrogenation means (FIG. 8B).

After the activation step is completed, a 0.5 to 1.5 μm-thick inter-layer insulation film 664 is formed on the protective insulation film 663. A laminate film comprising the protective insulation film 663 and the inter-layer insulation film 664 is used as the first inter-layer insulation film.

Contact holes reaching the source region or the drain region of the respective TFT are bored, and the source wirings 665, 666, 667 and 668 and the drain wirings 669, 670, 671 and 672 are formed. Incidentally, the drain wirings 669 and 670 are connected as the same wiring in order to form the CMOS circuit, though they are not shown in the drawings. Connection wirings 673 and 674 that connect the input/output terminals with one another and circuits with one another are formed simultaneously. These wirings in this example comprise a laminate film having a three-layered structure of a 100 nm-thick Ti film, a 300 nm-thick Ti-containing aluminum film and a 150 nm-thick Ti film that are continuously formed by sputtering, though this laminate film is not shown in the drawings.

Next, a passivation film 675 is constituted by a silicon nitride film, a silicon oxide film or a silicon nitride oxide film each having a thickness of 50 to 500 nm (typically, 200 to 300 nm). This passivation film 675 may be formed from the silicon nitride oxide film prepared from SiH$_4$, N$_2$O and NH$_3$ by plasma CVD, or a silicon nitride film prepared from SiH$_4$, N$_2$ and NH$_3$.

Prior to the formation of the film, a hydrogenation step is carried out by a plasma hydrogenation treatment by introducing N$_2$O, N$_2$, NH$_3$, or the like. Hydrogen that is excited by this plasma treatment is supplied into the first inter-layer insulation film. As the substrate is heated to 200 to 400° C., hydrogen can be diffused into the lower layer side, too, and the active layers can be thus hydrogenated. The fabrication condition of the passivation film is not particularly restrictive, but the film is preferably a close film.

The hydrogenation step may be further carried out after the passivation film is formed. Similar effects can be obtained by, for example, carrying out heat-treatment in an atmosphere containing 3 to 100% hydrogen at 300 to 450° C. for 1 to 12 hours, or by the plasma hydrogenation method. In this instance, openings may be formed in the passivation film 151 at positions where contact holes for connecting the pixel electrodes to the drain wiring are to be formed afterwards.

A second inter-layer insulation film 676 made of an organic resin is then formed to a thickness of about 1 μm. Polyimide, acrylic, polyamide, polyimideamide or BCB (benzocyclobutene) can be used as the organic resin. The advantages brought forth by the use of the organic resin film are that the formation method of the film is simple, the parasitic capacitance can be reduced because the specific dielectric constant is low, and planarity is high. Organic resin films other than those described above and organic SiO compounds can be used, too. This example uses polyimide of the type that is thermally polymerized after being applied to the substrate, and the film is fabricated by firing the resin at 300° C.

Next, a shading film 677 is formed on the second inter-layer insulation film 676 in a region that is to serve as the pixel unit. The shading film 153 is a film made of the element selected from the group consisting of aluminum (Al), titanium (Ti) and tantalum (Ta), or a film consisting of any of these elements as the principal component. The film is formed to a thickness of 100 to 300 nm. If an insulation film such as silicon oxide film is formed to a thickness of 5 to 50 nm on the second inter-layer insulation film 676, adhesion of the shading film to be formed on the second inter-layer insulation film 676 can be improved. If a plasma treatment using a $CF_4$ gas is applied to the surface of the second inter-layer insulation film 676 made of the organic resin, adhesion of the shading film to be formed on this film 676 can be improved through surface modification.

Other connection wiring can be formed besides the shading film. For example, the connection wiring for connecting circuits with one another inside the driving circuit can be formed. In this case, however, the contact holes must be bored in advance before the materials for shaping the shading film or the connection wiring are formed.

Next, an anodic oxide 678 is formed on the surface of the shading film 677 to a thickness of 30 to 150 nm (preferably, 50 to 75 nm) by an anodic oxidation method or a plasma oxidation method (by the anodic oxidation method in this example). Since this example uses an aluminum film or a film consisting essentially of aluminum as the principal component for the shading film 677, an aluminum oxide film (alumina film) is formed as the anodic oxide 678.

To conduct the anodic oxidation treatment, an ethylene glycol tartrate solution having a sufficiently low alkali ion concentration is first prepared. This is the solution prepared by mixing a 15% aqueous ammonium tartrate solution with ethylene glycol at a mixing ratio of 2:8, and aqueous ammonia is added to this solution to adjust the pH to 7±0.5. A platinum electrode to serve as a cathode is dipped into this solution, and the substrate having the shading film 677 formed thereon is then immersed. A predetermined DC current (several to dozens of mA) is applied with the shading film 677 as the anode. The voltage between the cathode and the anode in the solution changes with time and with the growth of the oxide. However, the voltage is regulated so that the current remains constant, and the voltage is kept constant at the point when the voltage reaches 150 V. This constant voltage is kept for 15 minutes. In this way, an anodic oxide having a thickness of 50 to 75 nm can be formed on the surface of the shading film 677. Incidentally, the numerical values relating to the anodic oxidation method illustrated hereby are merely illustrative, and the optimum values naturally change in accordance with the size of the device to be fabricated, and other factors.

This example employs the construction in which the insulation film is disposed only on the surface of the shading film. However, the insulation film may be formed by the gaseous phase method such as the plasma CVD method, the thermal CVD method or the sputtering method. In such a case, too, the film thickness is 30 to 150 nm (preferably, 50 to 75 nm). The insulation film may use a silicon oxide film, a silicon nitride film, a silicon nitride oxide film, a DLC (Diamond-Like Carbon) film or an organic resin film. Furthermore, a laminate film of these films may be also used.

Next, contact holes reaching the drain wiring 672 are bored in the second inter-layer insulation film 676 and the passivation film 675 so as to form the pixel electrode 679.

Incidentally, pixel electrodes 680 and 681 are the pixel electrodes of other adjacent pixels. A transparent conductive film is used as the pixel electrodes 679, 680 and 681 when a transmission type liquid crystal display device is fabricated. A metal film is used as the pixel electrodes when a reflection type liquid crystal display device is fabricated. In this example, a film of a compound of indium oxide and tin oxide (ITO) is formed to a thickness of 100 nm by sputtering to fabricate the transmission type liquid crystal display device.

At this time, a region in which the pixel electrode 679 and the shading film 677 overlap with each other through the anodic oxide 678 forms the holding capacitance.

In this way, the active matrix substrate having the CMOS circuit to serve as the driving circuit and the pixel unit on the same substrate is completed. In the driving circuit are formed the p-channel TFT 801 and the n-channel TFTs 802 and 803, and in the pixel unit is formed the pixel TFT 804 comprising the n-channel TFT (FIG. 8C).

In the p-channel TFT 801 of the CMOS circuit, the channel formation region 701, the source region 702 and the drain region 703 are formed. Each of the source region 702 and the drain region 703 is formed of the $p^{++}$ region.

In the n-channel TFT 802 are formed the channel formation region 704, the source region 705, the drain region 706, and the Lov region 707 on one of the sides of the channel formation region. At this time, the source region 705 and the drain region 706 are formed of the $(n^-+n^+)$ region, and the Lov region 707 is formed of $n^-$ region. The Lov region 707 is formed in such a manner as to fully overlap with the gate wiring.

In the n-channel TFT 803 are formed the channel formation region 708, the source region 709, the drain region 710, and the Lov regions 711a, 712a and the Loff regions 711b and 712b on both sides of the channel formation region. In this instance, the source region 709 and the drain region 710 are formed of the $(n^-+n^+)$ region, respectively. The Lov regions 711a and 712a are formed of the $n^-$ region, and the Loff regions 711b and 712b are formed of the $(n^{--}+n^-)$ region. According to this construction, the Lov regions and the Loff regions are accomplished because a part of the LDD region is so arranged as to overlap with the gate wiring.

In the pixel TFT 804 are formed the channel formation regions 713 and 714, the source region 715, the drain region 716, the Loff regions 717, 718, 719 and 720 and the $n^+$ region 721 keeping contact with the Loff regions 718 and 719. At this time, the source region 715 and the drain region 716 are formed of the $n^+$ region, respectively, and the Loff regions 717, 718, 719 and 720 are formed of the $n^{--}$ region.

This example optimizes the structure of the TFTs for forming each circuit in accordance with the circuit specifications required for the pixel unit and for the driving circuit, and can improve operation performance and reliability of the semiconductor device. More concretely, the LDD region of the n-channel TFT is arranged in a different way in accordance with the circuit specification, and the TFT structure that lays stress on the high-speed operation or on the countermeasure against the hot carriers, and the TFT structure that lays stress on the low OFF current operation, are accomplished on the same substrate.

When the active matrix type liquid crystal display device is considered, for example, the n-channel TFT 802 is suitable for the logic circuit that requires the high speed operation such as a shift register circuit, a frequency division circuit, a signal division circuit, a level shifter circuit and a buffer circuit. In other words, then-channel TFT employs the structure that arranges the Lov region only on one of the sides (the drain region side) of the channel formation region, and thus lays stress on the countermeasure against the hot carrier while the resistance component is reduced as much as possible. This is because the function of the source region is the same as that of the drain region in the group of the circuits described above and the moving direction of the carriers (electrons) is constant. However, the Lov regions can be arranged on both sides of the channel formation region, whenever necessary.

The n-channel TFT 803 is suitable for a sampling circuit (sample-and-hold circuit) that requires both of the countermeasure against the hot carriers and the low OFF current operation. In other words, the countermeasure against the hot carriers is achieved as the Lov region is disposed and the low OFF current operation is achieved as the Loff region is disposed. In the sampling circuit, the function of the source region is reversed to that of the drain region and the moving direction of the carriers changes by 180°. Therefore, the structure must have symmetry of line with the gate wiring as the center. Incidentally, only the Lov region is disposed depending on cases.

The n-channel TFT 804 is suitable for the pixel unit and the sampling circuit (sample-and-hold circuit) that lays stress on the low OFF current operation. In other words, the Lov region that might increase the OFF current value is not disposed but only the Loff region is disposed so as to attain the low OFF current operation. The LDD region having a lower concentration than that of the LDD region of the driving circuit is used as the Loff region so that even when the ON current value drops to a certain extent, the OFF current value can be reduced as much as possible. Furthermore, it has been confirmed that the $n^+$ region 721 is extremely effective for reducing the OFF current value.

The length (width) of the Lov region 707 of the n-channel TFT 802 may be 0.5 to 3.0 µm, typically 1.0 to 1.5 µm, for the channel length of 3 to 7 µm. The length (width) of the Lov regions 711a and 712a of the n-channel TFT 803 may be 0.5 to 3.0 µm and typically 1.0 to 1.5 µm. The length (width) of the Loff regions 711b and 712b may be 1.0 to 3.5 µm and typically 1.5 to 2.0 µm. The length (width) of the Loff regions 717, 718, 719 and 720 disposed in the pixel TFT 804 may be 0.5 to 3.5 µm and typically 2.0 to 2.5 µm.

It is another feature of the present invention that the p-channel TFT 801 is formed in self-alignment and the n-channel TFTs 802, 803 and 804 are formed in non-self-alignment.

Incidentally, this example is based on the construction of the active matrix substrate explained in Example 1 and only the structure of the n-channel TFT 803 is added to this construction. Therefore, the conditions of the thin film materials during the fabrication process, the range of the numerical values of the impurity doping process, the range of the film thickness of the thin films, and so forth, explained in Example 1, can be as such used in this example, too. The construction of this example can be combined with the construction of Example 2 or Example 3.

EXAMPLE 5

Figure 9:
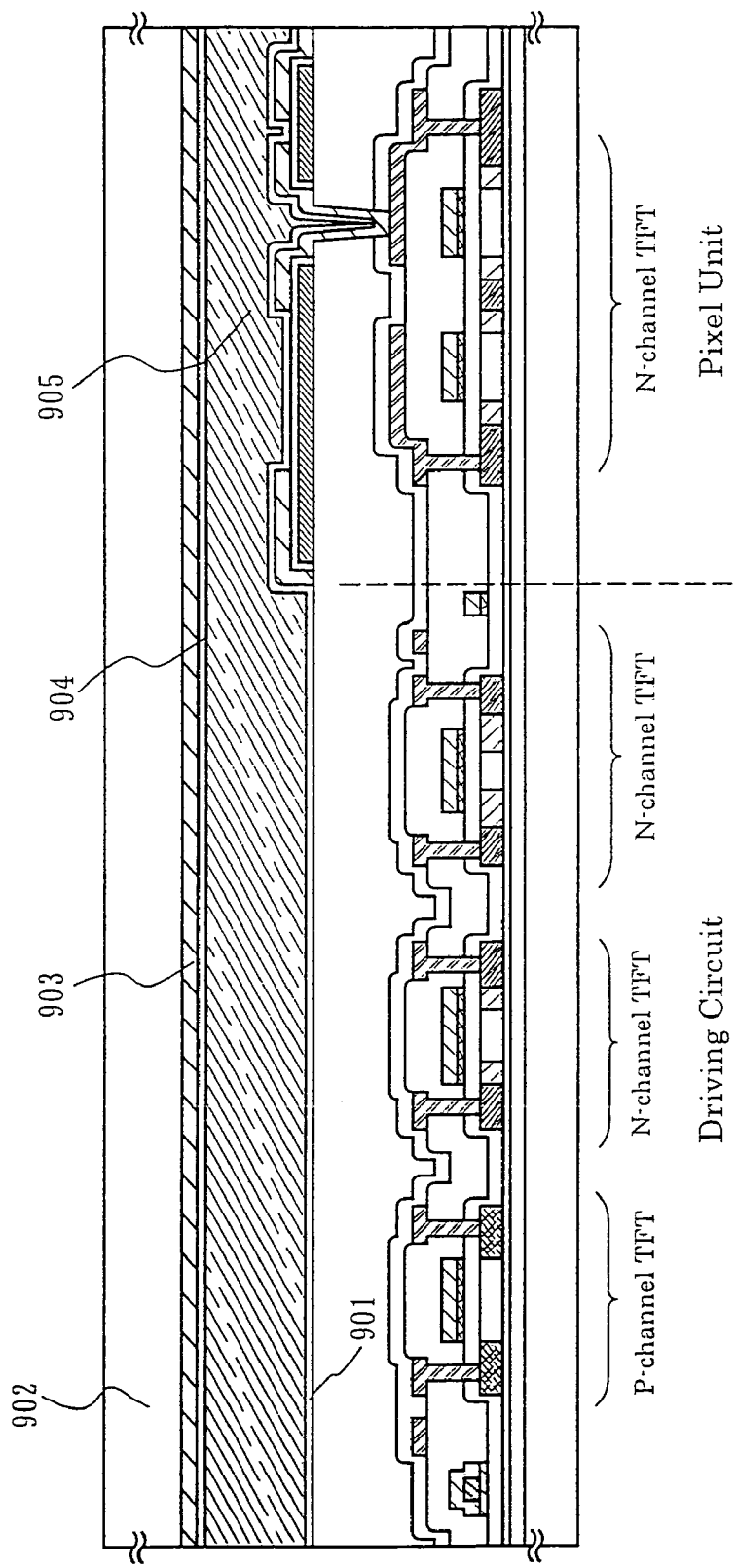
FIG. 9 is a sectional structural view showing an active matrix type liquid crystal display device.

In this example, the fabrication process of fabricating an active matrix type liquid crystal display device from an active matrix substrate will be explained. As shown in FIG. 9, an orientation film 901 is formed on the substrate under the condition shown in FIG. 8C. A polyimide resin is used in most cases for the orientation film of the liquid crystal display device. A transparent conductive film 903 and an orientation film 904 are formed on an opposing substrate 902. After the orientation films are formed, rubbing treatment is carried out so that the liquid crystal molecules are oriented with a certain predetermined pre-tilt angle. The active matrix substrate having the pixel unit and the CMOS circuit formed thereon and the opposing substrate are bonded to each other through a sealing material or a spacer (both being not shown) by a known cell assembly step. Thereafter, a liquid crystal material 905 is charged between both substrates and is completely sealed by a sealant (not shown). A known liquid crystal material may be used as the liquid crystal material. In this way, the active matrix type liquid crystal display device shown in FIG. 9 is completed.

Figure 10:
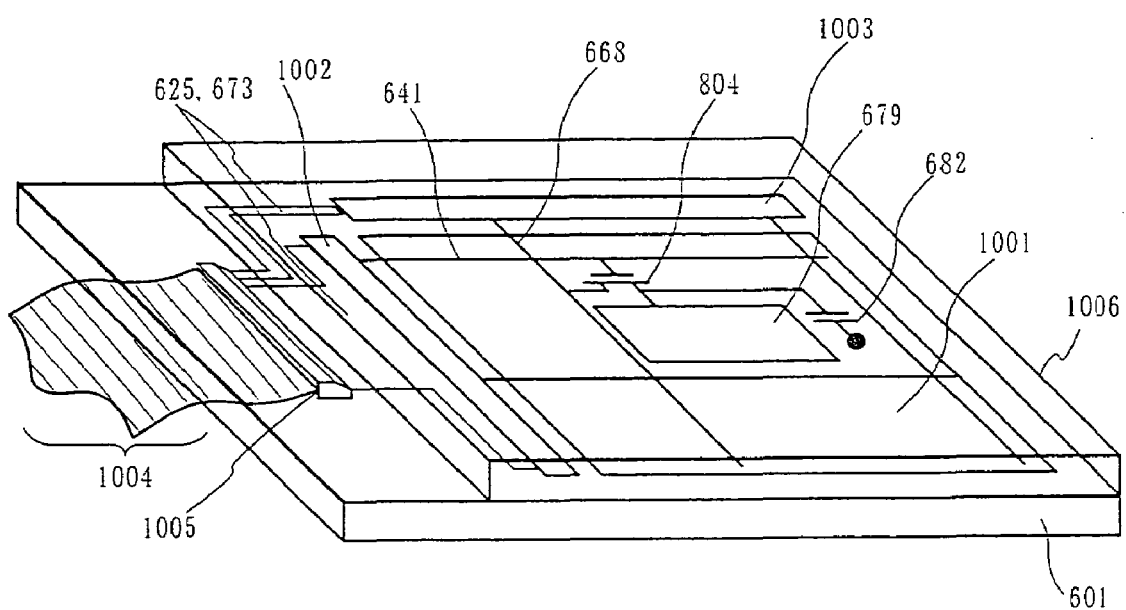
FIG. 10 is a perspective view of an active matrix type liquid crystal display device.

Next, the construction of this active matrix type liquid crystal display device will be explained with reference to a perspective view of FIG. 10 and top views of FIGS. 11A and 11B. Incidentally, common reference numerals will be used because FIGS. 10, 11A and 11B correspond to the structural sectional view of FIGS. 6A to 6D, 7A to 7C and 8A to 8C. The sectional structure along a line A-A' shown in FIG. 11B corresponds to the sectional view of the pixel unit shown in FIG. 8C.

The active matrix substrate comprises a pixel unit 1001, a scanning (gate) line driving circuit 1002 and a signal (source) line driving circuit 1003 that are formed on a glass substrate 601. The pixel TFT 804 of the pixel unit is the n-channel TFT, and the driving circuit disposed in the periphery of the pixel unit comprises a CMOS circuit as a basic circuit. The scanning (gate) line driving circuit 1002 and the signal (source) line driving circuit 1003 are connected to the pixel unit 1001 by gate wiring 641 and source wiring 668, respectively. Connection wirings 625 and 673 are so disposed as to extend from external input/output terminals 1005, to which the FPC 1004 is connected, to input/output terminals of the driving circuit.

Figure 11A:
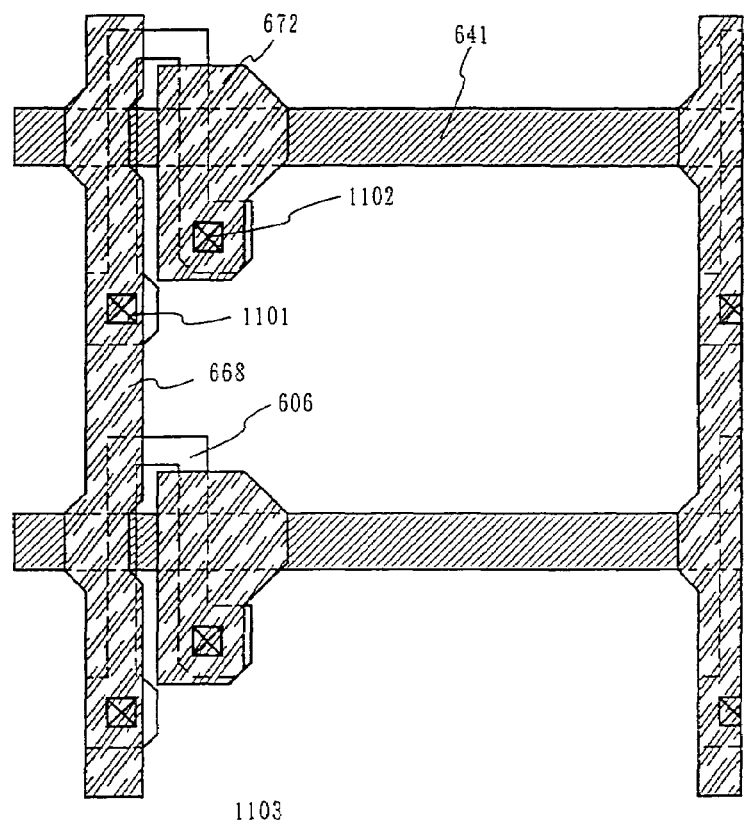
FIGS. 11A and 11B are top views of a pixel unit.
Figure 11B:
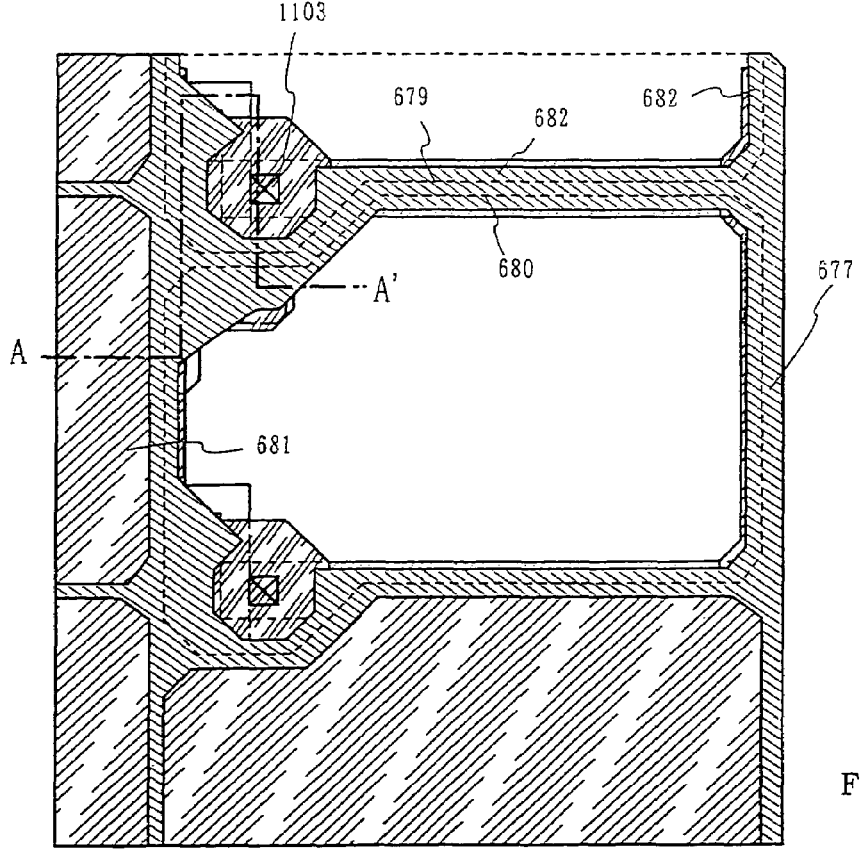

FIGS. 11A and 11B are top views showing a part (one pixel) of the pixel unit 1001. FIG. 11A is a top view showing in superposition the active layer, the gate wiring and the source wiring. FIG. 11B is a top view showing in super position a shading film and a pixel electrode on the members shown in FIG. 11A. Referring to FIG. 11A, the gate wiring 641 crosses the active layer 606 below it through a gate insulation film, not shown. A source region, a drain region and an Loff region comprising an $n^{--}$ region are formed in the active layer 606, though they are not shown in the drawings. Reference numeral 1101 denotes a contact portion between the source wiring 668 and the active layer 606 and reference numeral 1102 denotes a contact portion between the drain wiring 672 and the active layer 606.

In FIG. 11B, there are formed the shading film 677 having an anodic oxide (which is not hereby shown but corresponds to the anodic oxide 678 shown in FIG. 8C) formed on the pixel TFT and the pixel electrode 679, 680 and 681 for each pixel. A holding capacitance 682 is fabricated by the region in which the shading film 677 and the pixel electrode 679 overlap with each other through the anodic oxide. Incidentally, reference numeral 1103 denotes a contact portion between the drain wiring 672 and the pixel electrode 679.

This example uses an alumina film having a high specific dielectric constant of 7 to 9 for the dielectric of the holding capacitance, and can therefore reduce the area for securing the necessary capacitance. Furthermore, because this example uses the shading film formed on the pixel TFT as one of the electrodes of the holding capacitance, it can improve the aperture ratio of the image display part of the active matrix type liquid crystal display device.

Incidentally, the active matrix type liquid crystal display device of this example has been explained with reference to the construction explained in Example 4, but it can be freely combined with the construction of any of Examples 1, 2 and 3 so as to fabricate the active matrix type liquid crystal display device.

EXAMPLE 6

The holding capacitance provided to each pixel of the pixel unit can be constituted by using the electrode, that is not connected to the pixel electrode (the shading film in the present invention), as the fixed potential. In such a case, the shading film is preferably kept under the floating condition (under the electrically isolated condition) or under the common potential (at an intermediate potential of the image signals that are sent as data).

Figure 12A:
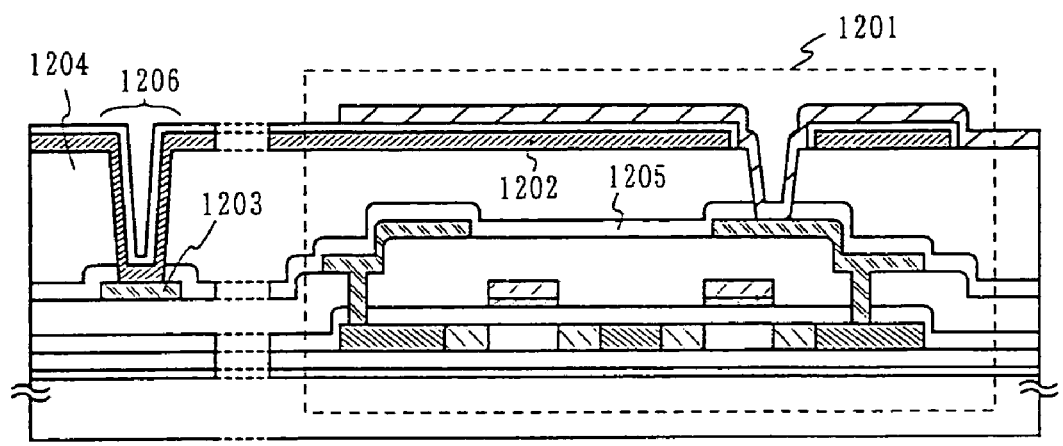
FIGS. 12A and 12B are sectional views showing a structure of a holding capacitance.

In this example, therefore, a connection method when the shading film is fixed to the common potential will be explained with reference to FIGS. 12A and 12B. Referring to FIG. 12A, reference numeral 1201 denotes the pixel TFT that is fabricated in the same way as in Example 1, and reference numeral 1202 denotes the shading film that functions as one of the electrodes of the holding capacitance. The shading film 1202 extends outside the pixel unit and is connected to a power source line 1203 that gives the common potential through a contact hole 1206 bored in a second inter-layer insulation film 1204 and a passivation film 1205.

When the shading film 1202 is electrically connected to the power source line giving the common potential outside the pixel unit in this way, the common potential can be secured. In this case, therefore, a process step of etching the second inter-layer insulation film 1204 and the passivation film 1205 prior to the formation of the shading film 1202 becomes necessary.

Figure 12B:
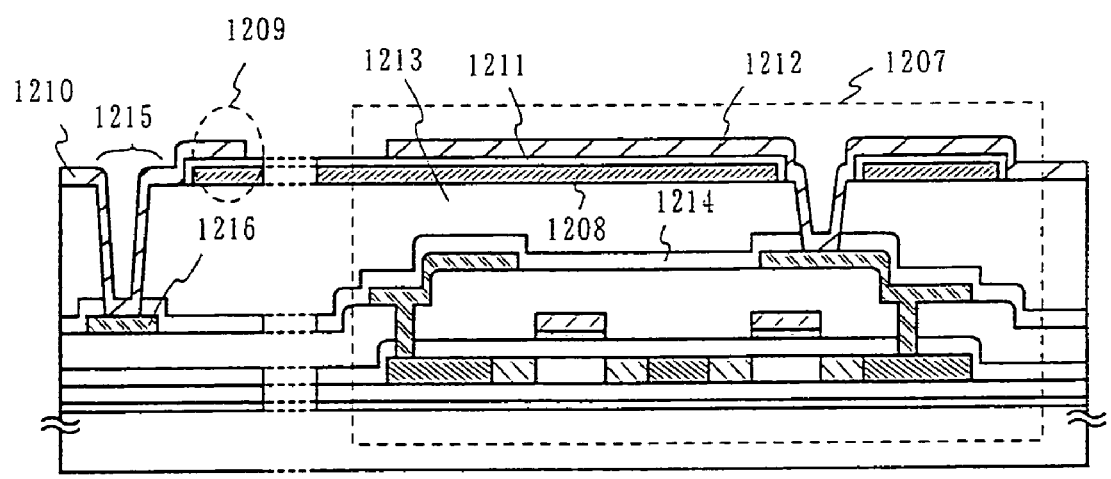

Referring next to FIG. 12B, reference numeral 1207 denotes the pixel TFT that is fabricated in the same way as in Example 1, and reference numeral 1208 denotes the shading film that functions as one of the electrodes of the holding capacitance. The shading film 1208 extends outside the pixel unit and overlaps with a conductive film 1210 through an oxide 1211 in the region that is represented by reference numeral 1209. This conductive film 1210 is formed simultaneously with a pixel electrode 1212.

The conductive film 1210 is connected to a power source line 1216 giving a common potential through a contact hole 1215 that is bored in a second inter-layer insulation film 1213 and a passivation film 1214. At this time, a capacitor comprising the shading film 1208, the oxide 1211 and the conductive film 1210 is constituted in the region 1209. When driven by an AC, this capacitor undergoes substantial short-circuit. In other words, since the shading film 1208 and the conductive film 1210 are electrically connected to each other by electrostatic coupling in the region 1209, the shading film 1208 and the power source line 1216 are connected substantially to each other.

Since this example employs the construction shown in FIG. 12B, it can set the shading film to the common potential without increasing the number of process steps.

Incidentally, the construction of this example can be freely combined with the construction of any of Examples 1 to 5.

EXAMPLE 7

Figure 13:
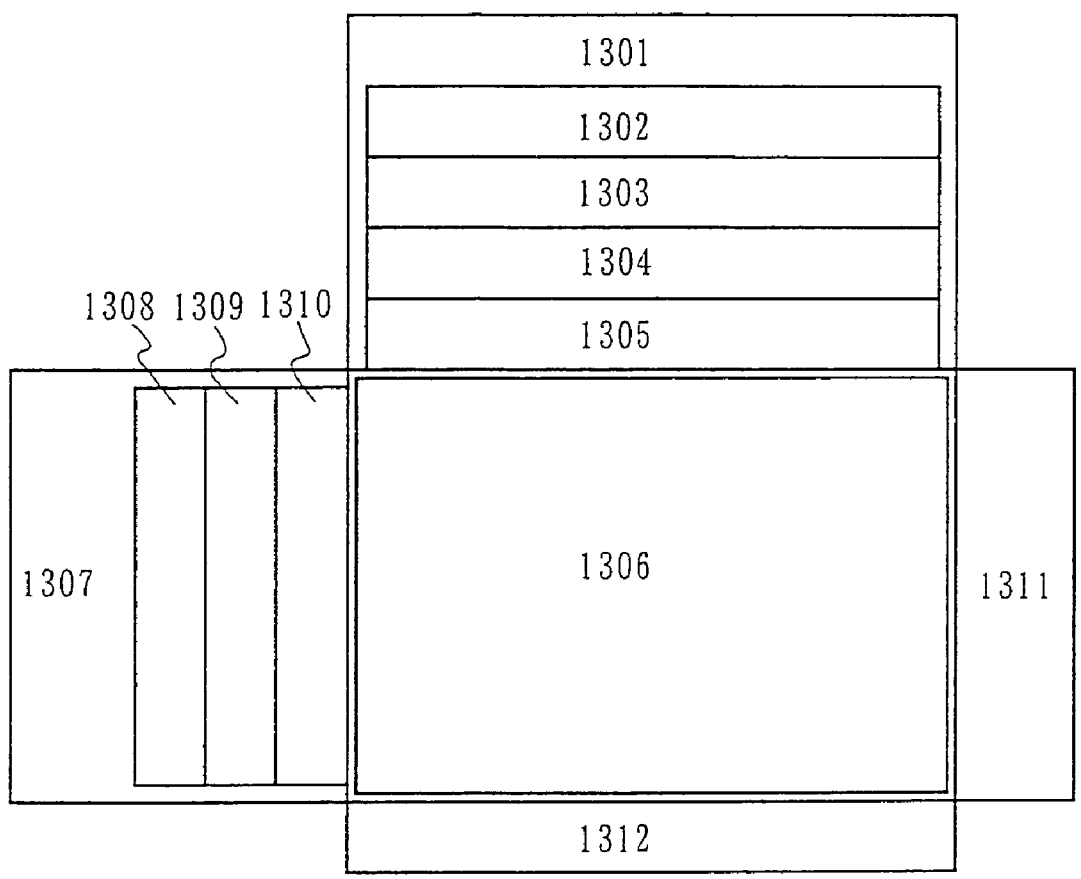
FIG. 13 is a block circuit diagram of an active matrix type liquid crystal display device.

FIG. 13 shows an example of the circuit construction of the active matrix substrate represented by Example 4. The active matrix substrate of this example includes a source signal line side driving circuit 1301, a gate signal line side driving circuit (A) 1307, a gate signal line side driving circuit (B) 1311, a pre-charge circuit 1312 and a pixel unit 1306. The source signal line side driving circuit 1301 includes a shift register circuit 1302, a level shifter circuit 1303, a buffer circuit 1304 and a sampling circuit 1305. The gate signal line side driving circuit (A) 1307 includes a shift register circuit 1308, a level shifter circuit 1309 and a buffer circuit 1310. The gate signal line side driving circuit (B) 1311 has a similar construction.

A driving voltage of each shift register circuit 1302, 1308 is 5 to 16 V (typically, 10V), and the n-channel TFT used for a CMOS circuit that constitutes the shift register circuit has suitably the structure represented by reference numeral 802 in FIG. 8C.

The level shifter circuits 1303 and 1309 and the buffer circuits 1304 and 1310 use a high driving voltage of 14 to 16 V. A CMOS circuit containing the n-channel TFT 802 shown in FIG. 8C is suitable for them in the same way as the shift register circuit. Incidentally, it is effective to use a double-gate structure for the gate wiring so as to improve reliability of the circuit.

The sampling circuit 1305 uses a driving voltage of 14 to 16 V. A CMOS circuit containing the n-channel TFT 803 shown in FIG. 8C is suitable because the source region is inverted relative to the drain region and moreover, the OFF current value must be reduced. Incidentally, the n-channel TFT and the p-channel TFT are combined with one another when the sampling circuit is fabricated in practice.

The pixel unit 1306 uses a driving voltage of 14 to 16 V. A lower OFF current value is required for this pixel unit 1306 than for the sampling circuit 1305. Therefore, a complete LDD structure (in which the Lov region is not disposed) is preferably employed, and the n-channel TFT 804 shown in FIG. 8C is preferably used, too.

The construction of this example can be freely combined with the construction of any of Examples 2 to 6.

EXAMPLE 8

In this example, a process step of forming an active layer to function as an active layer of the TFT will be explained with reference to FIGS. 14A to 14E. To begin with, an underlying film 1402 comprising a 200 nm-thick silicon nitride oxide film and a 50 nm-thick amorphous semiconductor film 1403 (an amorphous silicon film in this example) are continuously formed on a substrate 1401 (a glass substrate in this example) without exposing them to the atmospheric air.

Next, an aqueous solution (an aqueous nickel acetate solution) containing 10 ppm by weight of a catalytic element (nickel in this example) is applied by spin coating to form a catalytic element-containing layer 1404 on the entire surface of the amorphous semiconductor film 1403. Examples of the catalytic elements that can be used in this example include germanium (Ge), iron (Fe), palladium (Pd), tin (Sn), lead (Pb), cobalt (Co), platinum (Pt), copper (Cu) and gold (Au) (FIG. 14A) besides nickel (Ni).

Though this example employs a spin coating as the method of adding nickel, a thin film (a nickel film in this example) of a catalytic element may be formed by a vapor deposition or a sputtering on the surface of the amorphous semiconductor film.

Figure 14A:
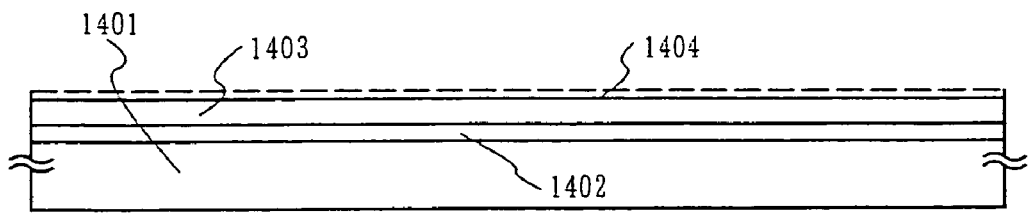
FIGS. 14A to 14E are sectional views showing a fabrication process of a crystalline semiconductor film.
Figure 14B:
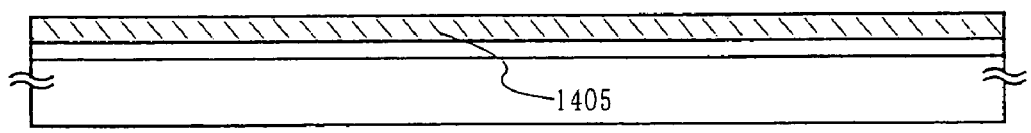

Next, prior to the crystallization step, a heat-treatment step is carried out at 400 to 500° C. for about 1 hour so as to dissociate hydrogen from inside the film. A heat-treatment is further carried out at 500 to 650° C. (preferably at 550 to 570° C.) for 4 to 12 hours (preferably for 4 to 6 hours). In this example, this heat-treatment is carried out at 550° C. for 4 hours to form a crystalline semiconductor film (a crystalline silicon film in this example) 1405 (FIG. 14B).

Figure 14C:
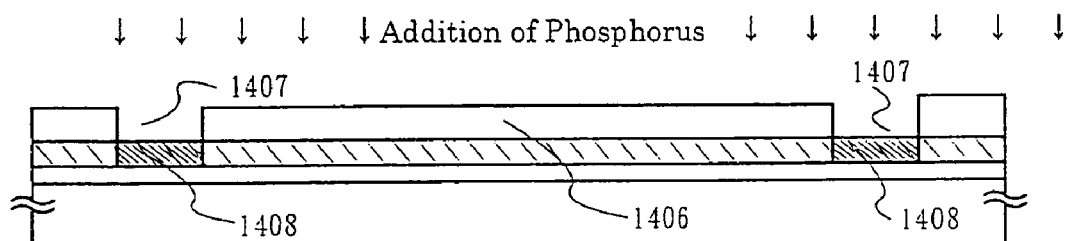

Next, a gettering step is carried out in order to remove nickel used in the crystallization step from the crystalline silicon film. First, a mask insulation film 1406 is formed to a thickness of 150 nm on the surface of the crystalline semiconductor film 1405, and an opening 1407 is bored by patterning. A process step of adding an element of the Group 15 of the Periodic Table (phosphorus in this example) to the exposed crystalline semiconductor film is carried out. This process step gives a gettering region 1408 containing phosphorus in a concentration of $1\times10^{19}$ to $1\times10^{20}$ atoms/cm$^3$ (FIG. 14C).

Figure 14D:
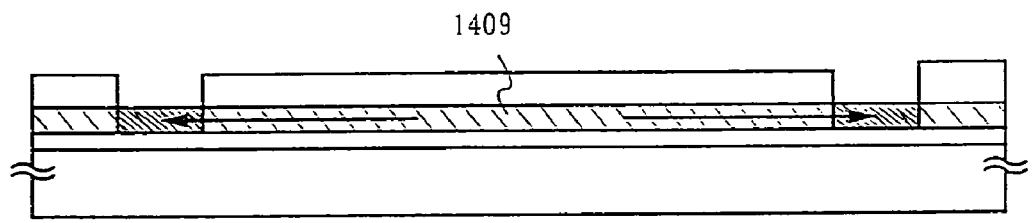

A heat-treatment is then carried out in a nitrogen atmosphere at 450 to 650° C. (preferably at 500 to 550° C.) for 4 to 24 hours (preferably for 6 to 12 hours). Due to this heat-treatment, nickel in the crystalline semiconductor film moves in a direction represented by an arrow in the drawing and is collected into the gettering region 1408 by the gettering operation of phosphorus. In other words, since nickel is removed from inside the crystalline semiconductor film, the nickel concentration in the crystalline semiconductor film 1409 can be lowered to $1\times10^{17}$ atoms/cm$^3$ or lower, preferably $1\times10^{16}$ atoms/cm$^3$ or lower (FIG. 14D).

Figure 14E:
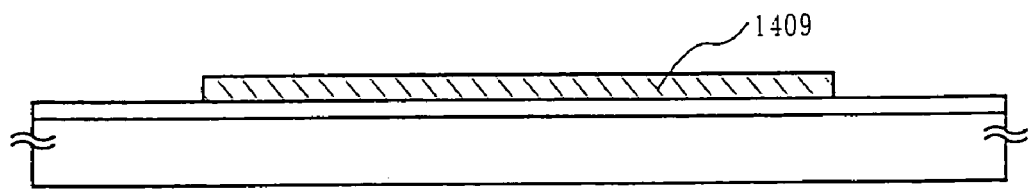

After the mask insulation film 1406 is removed, patterning is conducted in such a manner as to completely remove the gettering region 1408 to acquire an active layer 1410. Incidentally, though FIG. 14E shows only one active layer 1410, a plurality of active layers are naturally formed simultaneously over the substrate.

Each active layer 1410 so formed comprises a crystalline semiconductor film having extremely high crystallinity because it uses the catalytic element (nickel in this example) for promoting crystallization. The catalytic element is removed by the gettering operation of phosphorus after crystallization, and the concentration of the catalytic element remaining in the active layer 1410 is $1\times10^{17}$ atoms/cm$^3$ or lower, preferably $1\times10^{16}$ atoms/cm$^3$ or lower.

Incidentally, the construction of this example can be freely combined with the construction of any of Examples 1 to 7.

EXAMPLE 9

In this example, a process step of forming an active layer to function as an active layer of the TFT will be explained with reference to FIGS. 15A to 15E. More concretely, this example employs the technology described in Japanese Patent Laid-Open No. 10-247735 (corresponding to U.S. patent application Ser. No. 09/034,041).

First, an underlying film 1502 comprising a 200 nm-thick silicon nitride oxide film and a 50 nm-thick amorphous semiconductor film (an amorphous silicon film in this example) 1503 are formed continuously on a substrate 1501 (a glass substrate in this example) without exposing them to the atmospheric air. Next, a mask insulation film 1504 comprising a silicon oxide film is formed to a thickness of 200 nm to form an opening 1505.

Figure 15A:
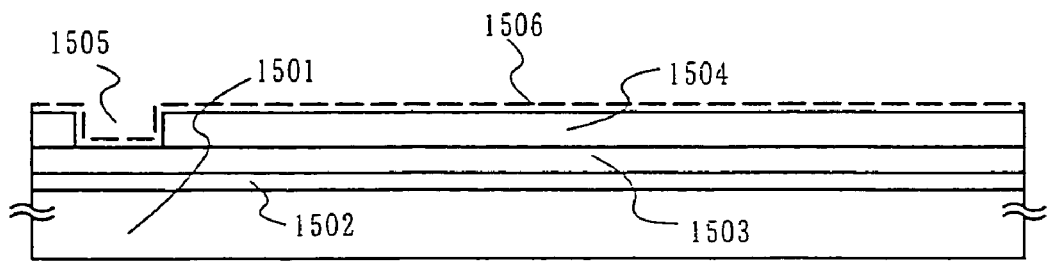
FIGS. 15A to 15E are sectional views showing a fabrication process of a crystalline semiconductor film.

Next, an aqueous solution (an aqueous nickel acetate solution in this example) containing 100 ppm by weight of a catalytic element (nickel in this example) is applied by spin coating to form a catalytic element-containing layer 1506. At this time, the catalytic element-containing layer 1506 comes into selective contact with the amorphous semiconductor film 1503 in the region in which the opening 1505 is formed. Examples of the catalytic elements that can be used hereby include germanium (Ge), iron (Fe), palladium (Pd), tin (Sn), lead (Pb), cobalt (Co), platinum (Pt), copper (Cu) and gold (Au), besides nickel (Ni) (FIG. 15A).

Though this example employs a spin coating as the method of adding nickel, it is possible to employ means for forming a thin film made of a catalytic element (the nickel film in this example) on the amorphous semiconductor film by a vapor deposition or a sputtering.

Figure 15B:
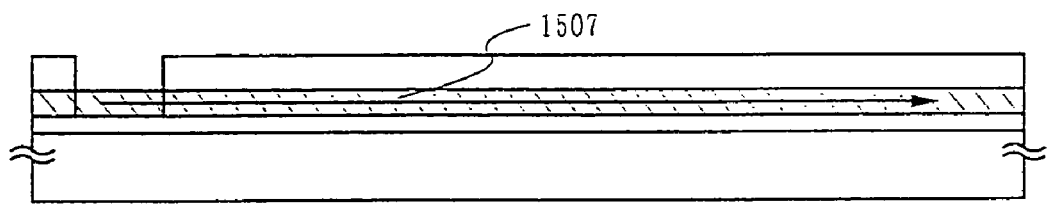

Next, prior to a crystallization step, heat-treatment is carried out at 400 to 500° C. for about 1 hour to dissociate hydrogen in the film. A heat-treatment is carried out further at 500 to 650° C. (preferably at 550 to 600° C.) for 6 to 16 hours (preferably, for 8 to 14 hours). In this example, the heat-treatment is carried out at 570° C. for 14 hours. As a result, the crystallization proceeds in a direction indicated by the arrow substantially parallel to the substrate drawn in the FIG. 15B with the opening 1505 as the start point. A crystalline semiconductor film (a crystalline silicon film in this example) 1507, in which the crystal growing direction is macroscopically aligned, is thus formed (FIG. 15B).

Figure 15C:
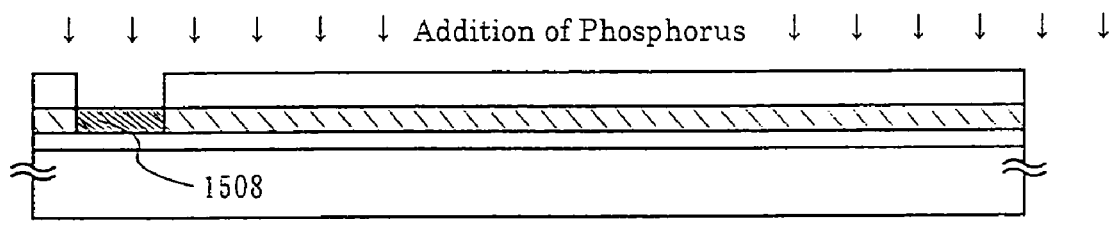

Next, a gettering step is carried out so as to remove nickel used in the crystallization step from the crystalline silicon film. In this example, a process step of adding an element (phosphorus in this example) belonging to the Group 15 of the Periodic Table is carried out using as such the mask insulation film 1504 formed previously. A gettering region 1508 containing phosphorus in a concentration of $1\times10^{19}$ to $1\times10^{20}$ atoms/cm$^3$ is thus formed in the crystalline semiconductor film exposed in the opening 1505 (FIG. 15C).

Figure 15D:
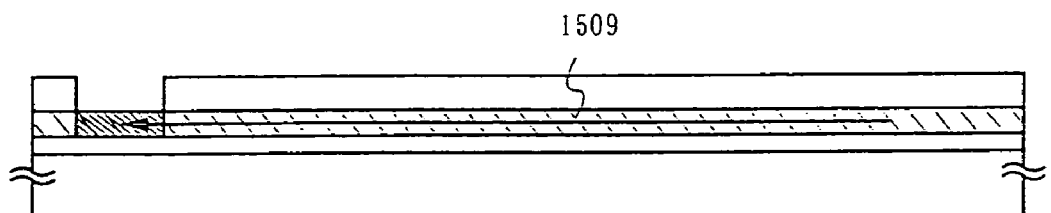

Next, a heat-treatment is carried out in a nitrogen atmosphere at 450 to 650° C. (preferably at 500 to 550° C.) for 4 to 24 hours (preferably for 6 to 12 hours). Nickel in the crystalline semiconductor film moves in a direction indicated by the arrow drawn in the FIG. 15D due to this heat-treatment and is collected into the gettering region 1508 by the gettering operation of phosphorus. In other words, since nickel is removed from inside the crystalline semiconductor film, the nickel concentration in the crystalline semiconductor film 1509 can be reduced to $1\times10^{17}$ atoms/cm$^3$ or lower, preferably $1\times10^{16}$ atoms/cm$^3$ or lower (FIG. 15D).

Figure 15E:
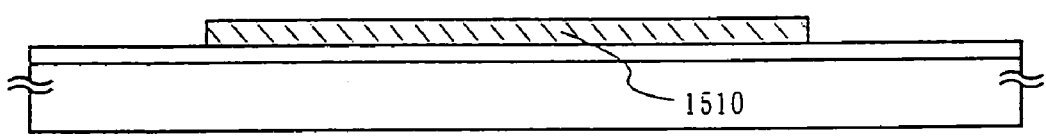

After the mask insulation film 1504 is removed, patterning is so conducted as to completely remove the gettering region 1508 to acquire an active layer 1510. Incidentally, FIG. 15E shows only one active layer 1510, but a plurality of active layers can be of course formed simultaneously on the substrate.

The active layer 1510 formed in the way described above comprises a crystalline semiconductor film having extremely high crystallinity because the crystallization is effected by selectively adding the catalytic element (nickel in this example) that promotes crystallization. More concretely, this film has a crystal structure in which rod-like or pillar-like crystal grains are aligned with specific directivity. The catalytic element is removed after the crystallization by the gettering operation of phosphorus, and the concentration of the catalytic element remaining in the active layer 1510 is not higher than $1\times10^{17}$ atoms/cm$^3$, preferably not higher than $1\times10^{16}$ atoms/cm$^3$.

Incidentally, the construction of this example can be combined freely with the construction of any of Examples 1 to 7.

EXAMPLE 10

Examples 8 and 9 use phosphorus for gettering the catalytic element used for crystallizing the semiconductor film. In this example, a method of gettering the catalytic element by the use of other elements will be explained.

First, the crystalline semiconductor film is obtained in the same way as in Example 8 or 9. However, the substrate that can be used in this example is a heat-resistant substrate that can withstand a temperature of 700° C. or more, and its typical examples include a quartz substrate, a metal substrate and a silicon substrate. The concentration of the catalytic element (nickel, for example) used for crystallization is lowered as much as possible in this example. More concretely, a nickel-containing layer containing 0.5 to 3 ppm by weight is formed on the amorphous semiconductor film and a heat-treatment is then carried out to attain crystallization. The concentration of nickel contained in the resulting crystalline semiconductor film is $1\times10^{17}$ to $1\times10^{19}$ atoms/cm$^3$ (typically, $5\times10^{17}$ to $1\times10^{18}$ atoms/cm$^3$).

After the crystalline semiconductor film is formed, a heat-treatment is carried out in an oxidizing atmosphere containing a halogen element. The temperature is 800 to 1,150° C. (preferably, at 900 to 1,000° C.), and the treatment time is 10 minutes to 4 hours (preferably, 30 minutes to 1 hour).

In this example, the heat-treatment is carried out in an atmosphere containing 3 to 10 volume % of hydrogen chloride at 950° C. for 30 minutes. As a result of this heat-treatment, nickel in the crystalline semiconductor film is converted to a volatile chloride (nickel chloride) and dissociates into the treatment atmosphere. In other words, nickel can be removed by the gettering operation of the halogen element. If the nickel concentration in the crystalline semiconductor film is too high, however, the problem develops in that an oxidation proceeds abnormally at the segregation portion of nickel. Therefore, the concentration of nickel used in the crystallization step must be reduced as low as possible.

The concentration of nickel remaining in the crystalline semiconductor film so formed is not higher than $1\times10^{17}$ atoms/cm$^3$, preferably not higher than $1\times10^{16}$ atoms/cm$^3$. Thereafter, the crystalline semiconductor film is patterned to form the active layer, which can be used as the active layer of the TFT.

Incidentally, the construction of this example can be freely combined with the construction of any of Examples 1 to 9. In other words, it can be used in combination with the gettering step by phosphorus that is described in Examples 8 and 9.

EXAMPLE 11

In this example, a process step for improving crystallinity of a crystalline semiconductor film (a crystalline silicon film byway of example) used in the present invention will be explained. First, an active layer is formed in accordance with the step of any of Examples 8, 9 and 10. However, a substrate capable of withstanding to the temperature of 800 to 1,150° C. must be used as a substrate on which TFTs are to be formed. Examples of such substrates include a quartz substrate, a metal substrate, a silicon substrate and a ceramic substrate (inclusive of a ceramic glass substrate).

A gate insulation film comprising a silicon nitride oxide film, a silicon oxide film or a laminate film of a silicon nitride film and a silicon oxide film is formed on the substrate. The film thickness of the gate insulation film is 20 to 120 nm (typically, 60 to 80 nm). In this example, the silicon oxide film is formed at 800° C. by using a mixture of $SiH_4$ and $N_2O$ as a starting material.

After the gate insulation film is formed, a heat-treatment is carried out in an oxidizing atmosphere. The temperature is 800 to 1,150° C. (preferably, 900 to 1,000° C.) and the treatment time is 10 minutes to 4 hours (preferably, 30 minutes to 1 hour). In this case, a dry oxidation method is the most preferred method but a wet oxidation method may be used, as well. The oxidizing atmosphere may be a 100% oxygen atmosphere, or a halogen element may be contained in the same way as in Example 10.

As a result of this heat-treatment, the active layer formed of the crystalline semiconductor film is oxidized in the proximity of the interface between the active layer and the gate insulation film, thereby forming a thermal oxide film. In consequence, the interface level is reduced and the particularly excellent interface performance can be obtained. Furthermore, since the active layer is oxidized, the film thickness of the active layer is decreased. Excessive silicon that is generated at the time of oxidation drastically improves the defects in the film, and a semiconductor film comes to possess an extremely small defect density and excellent crystallinity.

The process steps of this example are regulated, when the example is worked in practice, so that the final film thickness of the active layer is 20 to 60 nm and that of the gate insulation film is 50 to 150 nm (typically, 80 to 120 nm). In order to make the most of the reducing effect of the defect density, it is preferred to oxidize the active layer by at least 50 nm.

An n$^-$ region that is to serve as the Lov region is then formed by doping an n-type imparting impurity element. Further, a heat-treatment is carried out in an inert atmosphere at 700° C. to 950° C. (more preferably at 750° C. to 800° C.) for the purpose of activating the n-type imparting impurity element. The process steps subsequent to the heat-treatment are followed by the process steps subsequent to FIG. 1C of Example 1 or the process steps subsequent to FIG. 6C of Example 4.

The crystal structure of the active layer after these process steps of this example becomes a peculiar crystal structure having continuity in the crystal lattice. The feature will be explained next.

The active layer formed by the steps described above has microscopically a crystal structure of the aggregate of a plurality of needle-like or rod-like crystals (hereinafter called the "rod-like crystals"). This can be confirmed easily by the observation through TEM (transmission electron microscope).

It has been confirmed through an electron diffraction and a X-ray diffraction that the surface (the channel formation portion) of the active layer has a {110} plane as a main orientation plane, though some variances exist in the crystal axes. The inventors of the present invention have examined in detail an electron diffraction photograph having a spot diameter of about 1.5 μm and have confirmed that the diffraction spots corresponding to the {110} plane appear beautifully but each dot has a distribution on the same concentric circle.

The inventors of the present invention have also observed the crystal grain boundary formed by the contact portions of the individual rod-like crystals through HR-TEM (high-resolution transmission electron microscope) and have confirmed that continuity of the crystal lattice exists in the crystal grain boundary. This can be confirmed easily from the fact that the lattice fringes are continuously linked with one another in the crystal grain boundary.

Incidentally, continuity of the crystal lattice in the crystal grain boundary results from the fact that its crystal grain boundary is the grain boundary that is called a "planar grain boundary". The definition of the planar grain boundary in this specification corresponds to the term "planar boundary" described in "Characterization of High-Efficiency Cast-Si Solar Cell Wafers by MBIC Measurement", by Ryuichi Shimokawa and Yutaka Hayashi, Japanese Journal of Applied Physics, Vol. 27, No. 5, pp. 751-758, 1988.

According to the article mentioned above, the term "planar boundary" includes a twin boundary, a special laminar defect, a special twist boundary, and so forth. This planar boundary has a feature in that it is electrically inactive. In other words, though it is a crystal grain boundary, the planar boundary does not function as a trap that impedes movement of the carriers. For this reason, it can be regarded as being substantially absent.

Particularly when the crystal axis (an axis perpendicular to the crystal plane) is the <110> axis, the {211} twin boundary is also called correspondence boundary $\Sigma 3$. It is known that the $\Sigma$ value is a parameter as the index that represents the degree of matching of the correspondence boundary, and smaller this $\Sigma$ value, the higher matching the grain boundary has.

As a result of detailed observation of the crystalline silicon film obtained by working this example through TEM, the inventors of the present invention have clarified that almost all of the crystal grain boundary (at least 90%, typically at least 95%) is the $\Sigma 3$ correspondence boundary, that is, the {211} twin boundary.

It is known that when the plane orientation of both of two crystals is {110} in the crystal grain boundary formed between two crystal grains, the grain boundary becomes the $\Sigma 3$ correspondence boundary when the angle $\theta$ between the lattice fringes corresponding to the {111} plane is 70.5°.

In the crystalline silicon film of this example, each lattice fringe of the adjacent crystal grain in the crystal grain boundary exactly continues one another at an angle of about 70.5°. The present inventors have reached from this fact the conclusion that this crystal grain boundary is the {211} twin boundary.

Incidentally, when the angle $\theta$ is 38.9°, the grain boundary becomes the correspondence boundary of $\Sigma 9$, and such other boundaries also exist in this film.

Such a crystal structure (speaking more strictly, the structure of the crystal grain boundary) represents that two different crystal grains are bonded to each other with extremely high matching in the crystal grain boundary. In other words, this is the crystal structure in which the crystal lattices continue one another continuously in the crystal grain boundary, and the trap level resulting from the crystal defect or the like is extremely difficult to be created. Therefore, the semiconductor thin film having such a crystal structure can be regarded as a film not having substantially the crystal grain boundary.

Furthermore, the TEM observation reveals that the defects existing in the crystal grains are almost extinguished as a result of a heat-treatment at a temperature as high as 700 to 1,150° C. (that corresponds to the thermal oxidation step or to the gettering step in this example). This is clear from the fact that the number of defects after the heat-treatment step becomes drastically smaller than that of before the heat-treatment.

The difference of the number of defects appears as the difference of the spin density in electron spin resonance (ESR). It has been found out at present that the spin density of the crystalline silicon film formed by the process steps of this example is not greater than $5\times10^{17}$ spins/cm³ (preferably, not greater than $3\times10^{17}$ spins/cm³). However, because this measurement value is approximate to the detection limit of existing measuring instruments, the practical spin density is expected to be further lower.

From the observation described above, it may be possible to believe that the crystalline silicon film obtained by this example is substantially free from the crystal grain boundary in the crystal grains, and is a single crystal silicon film or a substantial single crystal silicon film.

(Observation of Electrical Characteristics of TFT):

The TFT using the active layer of this example exhibits the electric characteristics approximate to those of a MOS-FET. The following data can be obtained from the TFT fabricated tentatively by the present inventors (with the proviso that the film thickness of the active layer is 30 nm and the film thickness of the gate insulation film is 100 nm).

(1) A sub-threshold coefficient as an index of switching performance (rapidness of ON/OFF switching operation) is as small as 60 to 100 mV/decade (typically, 60 to 85 mV/decade) in both the n-channel TFT and the p-channel TFT.
(2) Field effect mobility ($\mu_{FE}$) as an index of the operation speed of the TFT is as great as 200 to 650 cm²/Vs (typically, 300 to 500 cm²/Vs) for the n-channel TFT and 100 to 300 cm²/Vs (typically, 150 to 200 cm²/Vs) for the p-channel TFT.
(3) A threshold voltage ($V_{th}$) as an index of the driving voltage of the TFT is as small as −0.5 to 1.5 V for the n-channel TFT and −1.5 to 0.5 V for the p-channel TFT.

As described above, it has been confirmed that extremely excellent switching characteristics and high-speed operation characteristics can be accomplished. Incidentally, the construction of this example can be freely combined with the construction of any of Examples 1 to 10. It is of importance, however, that this example uses the catalytic element, that promote crystallization as illustrated in Examples 8 to 10, for crystallizing the amorphous semiconductor film.

EXAMPLE 12

In this example, means for gettering the catalytic element (nickel in this example by way of example) used for crystallization from the crystalline semiconductor film (the crystalline silicon film, by way of example) that is crystallized by the means of Example 8 or 9 is explained. Incidentally, this explanation will be given with reference to FIGS. 16A to 16C.

First, the condition shown in FIG. 2B is reached in the same way as in Example 1. Next, phosphorus is added in the same way as the process step shown in FIG. 2C. In this instance, this example uses a resist mask 1601 shown in FIG. 16A in place of the resist mask 132 shown in FIG. 2C. In other words, whereas the resist mask is so disposed in FIG. 2C as to cover the entire region that serves as the p-channel TFT, the resist mask is formed in FIG. 16A in such a manner as not to hide the end portion of the $p^{++}$ regions.

Phosphorus is added under this condition in the same way as the step shown in FIG. 2C. As a result, phosphorus is added also to the end portions of the $p^{++}$ regions 124 and 125 of the p-channel TFT, and ($p^{++}+n^+$) regions 1602 and 1603 are thus formed. However, the p-type imparting impurity element contained in the $p^{++}$ regions is added in a sufficiently higher concentration than phosphorus contained in the $n^+$ region. Therefore, these regions can be kept as the $p^{++}$ regions.

Next, after the resist masks 1601, 133 and 134 are removed, the phosphorus-doping step is carried out in the same concentration as that of FIG. 3A of Example 1. As a result, the n⁻⁻ regions 140, 141, 142 and 143 are formed (FIG. 16B).

The activation step of the impurity element (phosphorus or boron) added is then carried out in the same way as in the step FIG. 3B of Example 1. In this example, the activation step is preferably conducted by means of a furnace annealing or a lamp annealing. When the furnace annealing is employed, the heat-treatment is carried out at 450 to 650° C., preferably at 500 to 550° C., and 500° C. in this Example, for 4 hours (FIG. 16C).

In this example, the source regions or the drain regions of both the n-channel TFT and the p-channel TFT always include the region that contains phosphorus in the concentration corresponding to the n⁺ region. For this reason, the nickel-gettering effect by phosphorus can be obtained in the heat-treatment step for thermal activation. In other words, nickel moves from the channel formation region in the direction indicated by arrow drawn in FIG. 16C, and is gettered by the operation of phosphorus contained in the source region or the drain region.

When this example is executed, the activation step of the impurity element added to the active layer functions also as the gettering step of the catalytic element used for crystallization. As a result, the process steps can be simplified effectively.

The construction of this example can be freely combined with the construction of any of Examples 1 to 11. However, this example provides the technology that is effective when the catalytic element that promotes crystallization is used for crystallizing the amorphous semiconductor film.

EXAMPLE 13

In this example, explanation will be given with reference to FIGS. 17A and 17B about the case where the construction of the pixel unit is different from the construction of Example 5 (see FIGS. 11A and 11B). Incidentally, since the basic construction is the same as the construction of Examples 4 and 5, the same reference numeral will be used to identify the same portion.

Figure 17A:
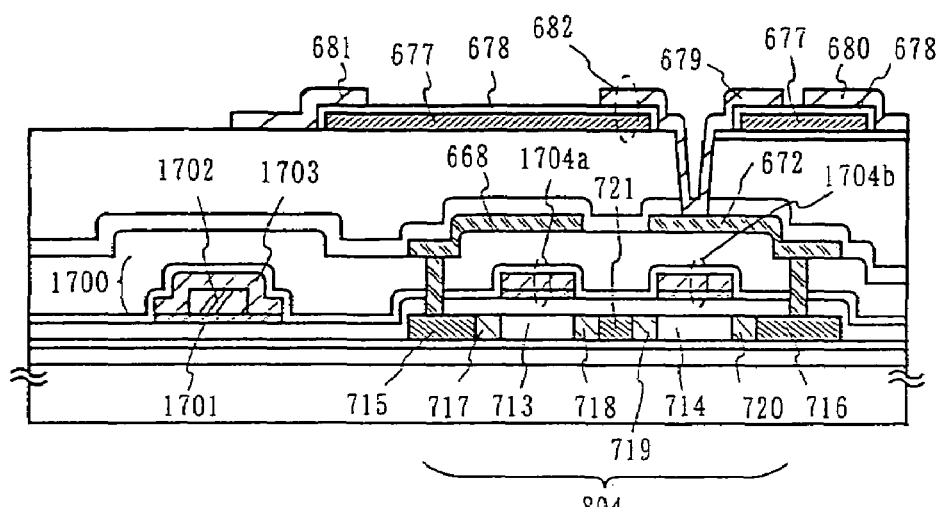
FIGS. 17A and 17B are a sectional view and a top view of a pixel unit.

FIG. 17A is a sectional view of the pixel unit in this example. This example has the feature in that a gate wiring 1700 (except for the overlapping portion with the active layer) is formed by laminating a first conductive film 1701, a second conductive film 1702 and a third conductive film 1703. This gate wiring 1700 is formed simultaneously with the connection wiring 625 explained in Example 4. Therefore, the first conductive film is consisting essentially of tantalum nitride as the principal component, the second conductive film consists essentially of aluminum as the principal component and the third conductive film is the tantalum film.

Figure 17B:
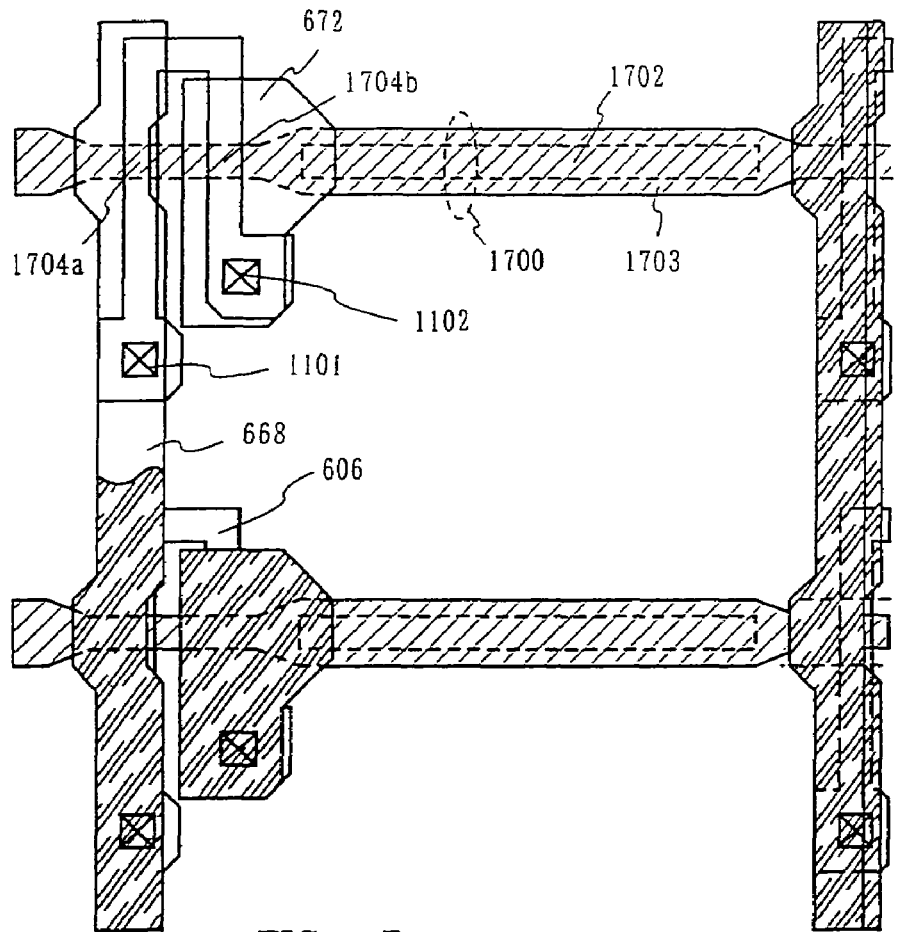

The top view at this time is shown in FIG. 17B. The portions of the gate wiring, that overlap with the active layer (that may be called the "gate electrode"), 1704a and 1704b have a laminate structure of the first and third conductive films. On the other hand, the gate wiring 1700 has a greater wiring width than the gate wirings 1704a and 1704b and has a three-layered structure as shown in FIG. 17A. In other words, among the gate wirings, the portions that are merely used for the wiring preferably employ the construction of this example in order to reduce the wiring resistance as much as possible.

Incidentally, the construction of this example may be freely combined with the construction of any of Examples 1 to 12.

EXAMPLE 14

Figure 18A:
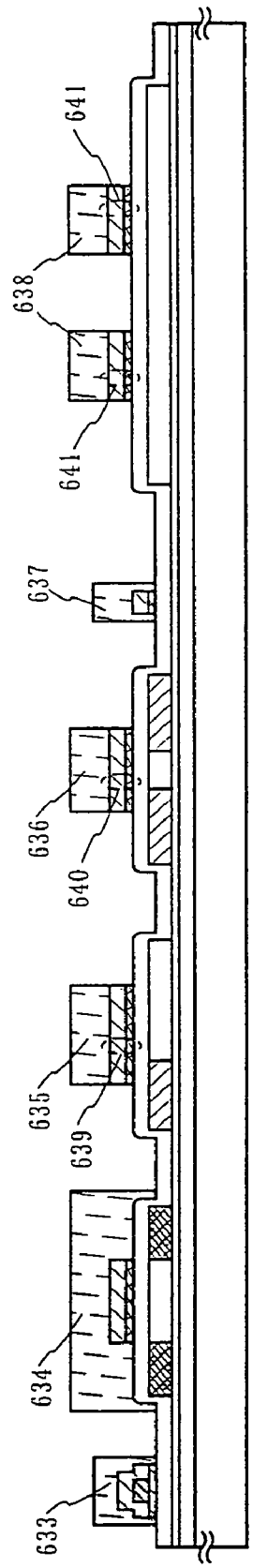
FIGS. 18A to 18C are schematic sectional views showing a fabrication process of a pixel unit and a driving circuit.
Figure 18B:
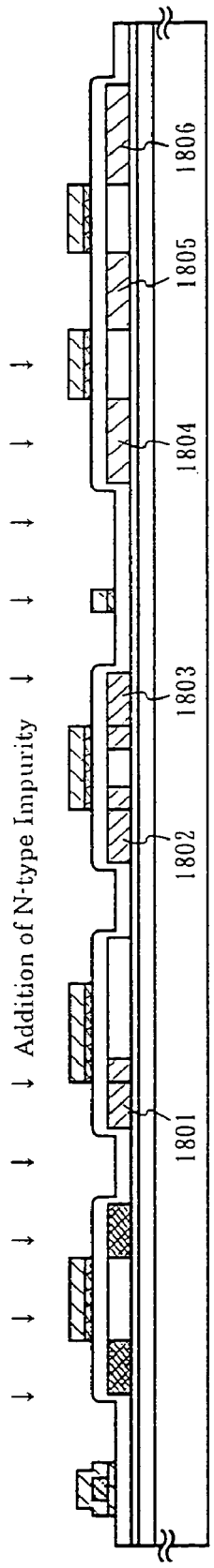
Figure 18C:
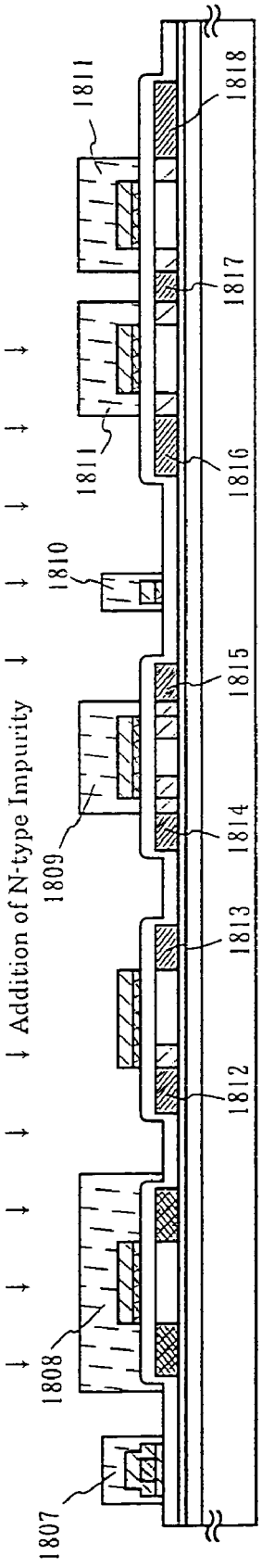

In this example, explanation will be given with reference to FIGS. 18A to 18C about the case where the TFT is fabricated in the process steps different from those of Example 4. Since the intermediate steps are the same as those of Example 4, the same reference numeral will be used for the same process step. The impurity element added is the same as the impurity element used in Example 4, by way of example.

First, the condition shown in FIG. 7B is reached in accordance with the steps of Example 4. This condition is shown in FIG. 18A in this example. Next, the resist masks 633, 634, 635, 636, 637 and 638 are removed, and the phosphorus doping step is carried out to form the n⁻⁻ region. The doping condition is the same as that of the process step of Example 4 shown in FIG. 8A. In FIG. 18B, the regions represented by reference numerals 1801, 1802 and 1803 are the regions in which phosphorus corresponding to the n⁻⁻ region is added to the n⁻ region. Reference numerals 1804, 1805 and 1806 denote the n⁻⁻ regions that serve as the Loff region of the pixel TFT (FIG. 18B).

Next, resist masks 1807, 1808, 1809, 1810 and 1811 are formed, and phosphorus is added under the same condition as that of FIG. 7C. This process step provides the regions 1812, 1813, 1814, 1815, 1816, 1817 and 1818 to which phosphorus is added in a high concentration (FIG. 18C).

Thereafter, the process steps of FIG. 8B and so on are carried out in accordance with the process steps of Example 4, and the pixel unit having the structure explained with reference to FIG. 8C can be obtained. When this example is employed, phosphorus in the concentration corresponding to the n⁺ region is not added to the source and drain regions of the p-channel TFT that constitute the CMOS circuit. Therefore, the boron concentration necessary for the p++addition step may be low, and throughput can be improved. If phosphorus is added to the end portions of the p⁺⁺ regions of the n-channel TFT in the process step shown in FIG. 18C, the gettering step of Example 12 can be carried out.

When the n⁺ region or the p⁺⁺ region that constitutes the source region or the drain region is formed, it is possible to etch the gate insulation film to expose a part of the active layer before the impurity element is added, and then to add the impurity element to the portion so exposed. In this case, since the acceleration voltage may be low, damage to the active layer is small and throughput can be improved.

When this example is executed, the concentration of the impurity element contained in the impurity regions formed finally in the active layer, may be sometimes different from that of Example 4. However, since the substantial function of each impurity region remains unchanged, the explanation of the construction of FIG. 8C can be as such applied to the explanation of the final construction of this example. The construction of this example can be applied to Example 1 or 4, and can be freely combined with the construction of any of Examples 2, 3 and 5 to 13.

EXAMPLE 15

In this example, explanation will be given with reference to FIGS. 19A to 19C on the case where the TFT is fabricated in the process steps different from those of Example 4. Since these steps up to the intermediate steps are the same as those of Example 4, the same reference numeral will be used for the same process step. The impurity element added is the same as the impurity element used in Example 4, by way of example.

First, the condition shown in FIG. 6D is reached in accordance with the process steps of Example 4. Next, the gate wiring of the n-channel TFT and other connection wirings are formed. In FIG. 19A, reference numerals 1901 and 1902 denote connection wirings and reference numerals 1903, 1904 and 1905 denote gate wirings of the n-channel TFT. Reference numeral 1906 denotes a conductive film for forming the gate wiring of the p-channel TFT.

Next, resist masks 1907, 1908, 1909, 1910 and 1911 are formed, and phosphorus is added under the same condition as that of the step of FIG. 7C in Example 4. In this way, there are formed the impurity regions 1912, 1913, 1914, 1915, 1916, 1917 and 1918 containing phosphorus in a high concentration (FIG. 19A).

After the resist masks 1907, 1908, 1909, 1910 and 1911 are removed, resist masks 1919, 1920, 1921, 1922, 1923 and 1924 are formed afresh, and a gate wiring 1925 of the p-channel TFT is formed. Boron is added under the same condition as that of FIG. 7A, forming $p^{++}$ regions 1926 and 1927 (FIG. 19B).

After the resist masks 1919, 1920, 1921, 1922, 1923 and 1924 are removed, phosphorus is added under the same condition as that of FIG. 8A. As a result, the $(n^-+n^{--})$ regions 1930 and 1931 and the $n^{--}$ regions 1932, 1933, 1934 and 1935 are formed (FIG. 19C).

Thereafter, the process steps of FIG. 8B and so on are carried out in accordance with Example 4, and the pixel unit having the construction explained with reference to FIG. 8C can be obtained. When this example is employed, the construction becomes the one in which phosphorus having the concentration corresponding to the $n^+$ region is not added to the source and drain regions of the p-channel TFT that constitutes the CMOS circuit. For this reason, the boron concentration required for the $p^{++}$ addition step may be low, and throughput can be improved.

When the $n^+$ region or the $p^{++}$ region that constitutes the source or drain region is formed, it is possible to etch the gate insulation film so as to expose a part of the active layer before the addition of the impurity element, and then to add the impurity element to the portion so exposed. In this case, since the acceleration voltage may be low, damage to the active layer is small and throughput can be improved.

When this example is executed, there may be the case where the concentration of the impurity element contained in the impurity regions formed finally in the active layer is different from that of Example 4. However, because the substantial function of each impurity region remains unchanged, the explanation of the construction of FIG. 8C can be applied as such to the explanation of the final construction obtained by executing this example. The construction of this example can be applied to the construction of Example 1 or 4, and can be freely combined with the construction of any of Examples 2, 3, 5 to 11 and 13.

EXAMPLE 16

In this example, explanation will be given with reference to FIGS. 20A to 20C on the case where the TFT is fabricated in the different process order as those of Example 4. Incidentally, the same reference numeral will be used in the same process steps because the process steps up to the intermediate steps are the same as those of Example 4. The impurity element added is also the same as that of Example 4, by way of example.

Figure 19A:
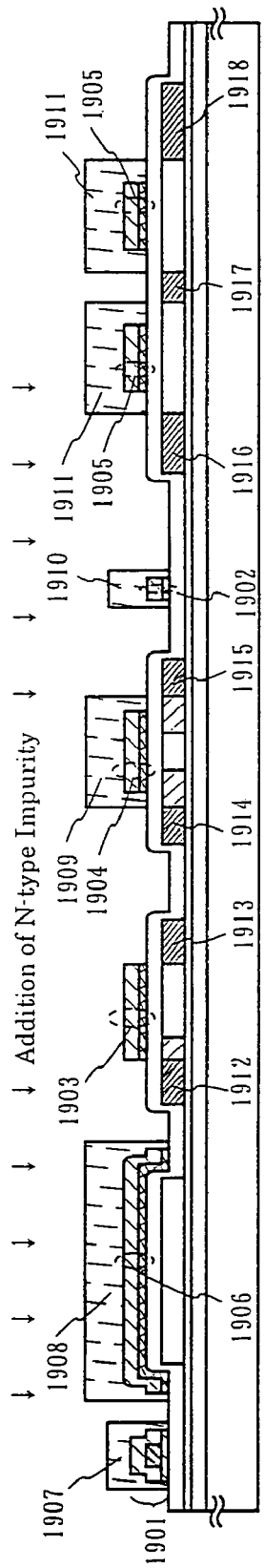
FIGS. 19A to 19C are schematic sectional views showing a fabrication process of a pixel unit and a driving circuit.
Figure 19B:
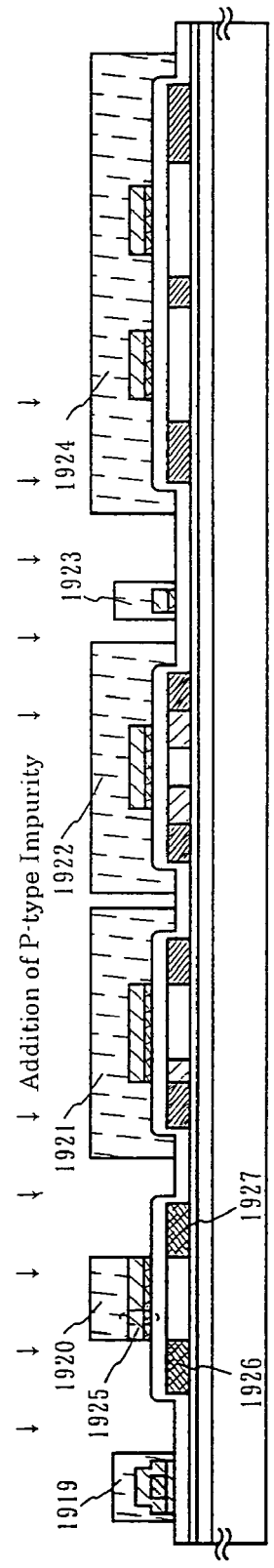
Figure 19C:
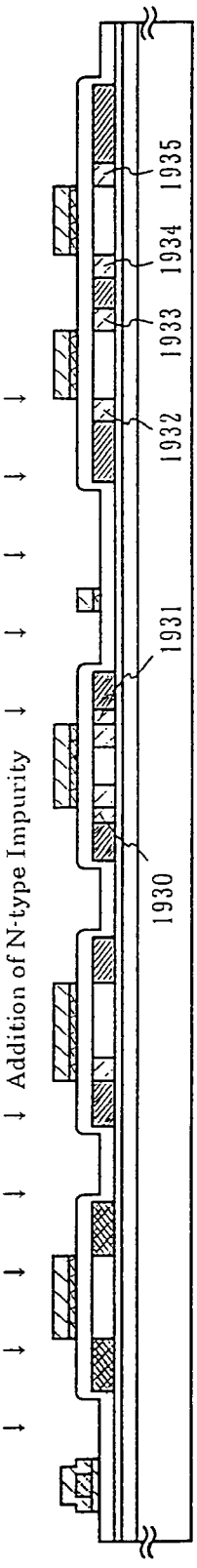

First, the condition shown in FIG. 6D is reached in accordance with the process steps of Example 4, and then the condition shown in FIG. 19A is reached in accordance with the process steps of Example 15. This condition is shown in FIG. 20A in this example. Incidentally, reference numerals used in FIG. 20A are the same as those used in FIG. 19A.

After the resist masks 1907, 1908, 1909, 1910 and 1911 are removed, phosphorus is added under the same condition as that of FIG. 8A. As a result, $(n^-+n^{--})$ regions 2001 and 2002 and the $n^{--}$ regions 2003, 2004, 2005 and 2006 are formed (FIG. 20B).

Next, resist masks 2007, 2008, 2009, 2010, 2011 and 2012 are formed, and a gate wiring 2013 of the p-channel TFT is formed. Boron is added under the same condition as that of FIG. 7A, thereby forming the $p^{++}$ regions 2014 and 2015 (FIG. 20C).

Thereafter, the process steps of FIG. 8B and so on are carried out in accordance with Example 4, and the pixel unit having the construction explained with reference to FIG. 8C can be obtained. When this example is employed, the construction becomes the one in which phosphorus is not at all added to the source and drain regions of the p-channel TFT that forms the CMOS circuit. Therefore, the boron concentration necessary for the $p^{++}$ addition step may be low, and throughput can be improved.

When the $n^+$ region or the $p^{++}$ region that constitutes the source region or the drain region is formed, the gate insulation film may be etched away before the addition of the impurity element so as to expose a part of the active layer and then the impurity element may be added to the portion so exposed. In this case, since the acceleration voltage may be low, damage to the active layer is small and throughput can be improved.

When this example is executed, there may be the case where the concentration of the impurity element contained in the impurity regions formed finally in the active layer is different from that of Example 4 due to the change of the process order. However, because the substantial function of each impurity region remains unchanged, the explanation of the construction of FIG. 8C can be applied as such to the explanation of the final construction obtained by this example. The construction of this example can be applied to Example 1 or 4, or can be freely combined with the construction of any of other Examples 2, 3, 5 to 11 and 13.

EXAMPLE 17

In this example, explanation will be given with reference to FIGS. 21A to 21D on the case where the TFT is fabricated in the different process order from that of Example 4. Incidentally, the process steps are the same as those of Example 4 up to the intermediate steps, the same reference numeral is used in the same process step. The impurity element added is the same as that of Example 4 by way of example.

First, the condition shown in FIG. 6D is reached in accordance with Example 4. Next, the gate wiring of then-channel TFT and other connection wirings are formed in the same way as in FIG. 7B without conducting the process step shown in FIG. 7A (the formation step of the gate wiring of the p-channel TFT and the $p^{++}$ regions). Incidentally, the same reference numerals are used in FIG. 21A as those in FIG. 7B. As to the region that functions as the p-channel TFT, however, a resist mask 2101 is formed, and a conductive film 2102 that will later serve as the gate wiring of the p-channel TFT is left.

While the resist mask is left unremoved, phosphorus is added under the same condition as that of FIG. 8A. As a result, there are formed (n⁻+n⁻⁻) regions 2103, 2104 and 2105 and n⁻⁻ regions 2106, 2107 and 2108 (FIG. 21B).

Next, resist masks 2109, 2110, 2111, 2112 and 2113 are formed, and phosphorus is added under the same condition as that of FIG. 7C of Example 4. In this way, impurity regions 2114, 2115, 2116, 2117, 2118, 2119 and 2120 containing phosphorus in a high concentration are formed (FIG. 21C).

After the resist masks 2109, 2110, 2111, 2112 and 2113 are removed, resist masks 2121, 2122, 2123, 2124, 2125 and 2126 are formed afresh, and a gate wiring 2127 of the p-channel TFT is formed. Boron is added under the same condition as that of FIG. 7A, thereby forming $p^{++}$ regions 2128 and 2129 (FIG. 21D).

Thereafter, the process steps after the step shown in FIG. 8B are carried out in the same way as in Example 4, and the pixel unit having the construction explained with reference to FIG. 8C can be obtained. When this example is employed, the construction becomes the one in which phosphorus is not at all added into the source and drain regions of the p-channel TFT that constitutes the CMOS circuit. Therefore, the boron concentration necessary for the $p^{++}$ addition step may be low, and throughput can be improved.

When the $n^+$ region or the $p^{++}$ region that constitutes the source region or the drain region is formed, the gate insulation film may be so etched as to expose a part of the active layer before the addition of the impurity element and the impurity element may be added to the portion so exposed. In this case, since the acceleration voltage may be small, damage to the active layer is small and throughput can be improved.

When this example is executed, there may be the case where the concentration of the impurity element contained in the impurity regions formed finally in the active layer is different from that of Example 4 because the process order changes. However, since the substantial function of each impurity region remains unchanged, the explanation of the construction of FIG. 8C can be applied as such to the final construction obtained by this example. The construction of this example can be applied to the construction of Example 1 or 4, or can be freely combined with the construction of any of other Examples 2, 3, 5 to 11 and 13.

EXAMPLE 18

Figure 22A:
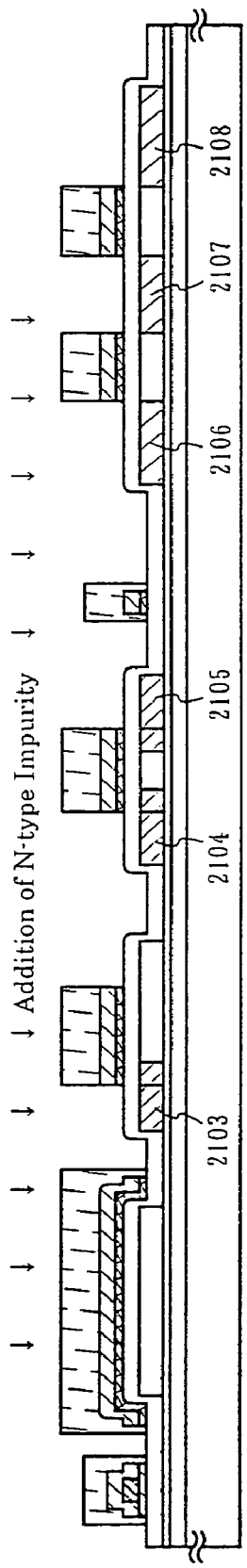
FIGS. 22A to 22C are schematic sectional views showing a fabrication process of a pixel unit and a driving circuit.
Figure 22B:
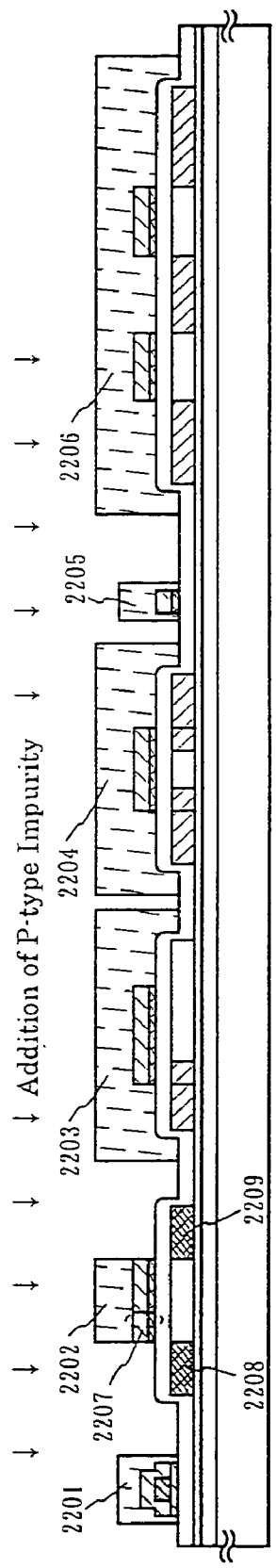
Figure 22C:
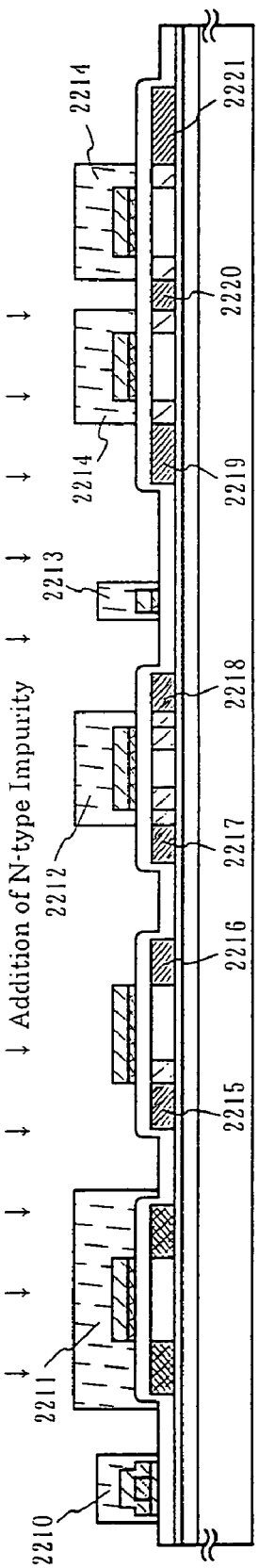

In this example, explanation will be given with reference to FIGS. 22A to 22C on the case where the TFT is fabricated by different process order from those of Example 4. Incidentally, since the process steps up to the intermediate step are the same as those of Example 4, the same reference numerals are used in the same process step. The impurity element added is also the same as that of Example 4, by way of example.

First, the condition shown in FIG. 6D is reached in accordance with Example 4, and the condition shown in FIG. 21B is reached in accordance with Example 17. In this example, this condition is shown in FIG. 22A. Incidentally, the reference numerals used in FIG. 22A are the same as those of FIG. 21B.

After the resist masks are removed, resist masks 2201, 2202, 2203, 2204, 2205 and 2206 are formed afresh, and a gate wiring 2207 of the p-channel TFT is formed. Boron is then added under the same condition as that of FIG. 7A, thereby forming $p^{++}$ regions 2208 and 2209 (FIG. 22B).

Next, resist masks 2210, 2211, 2212, 2213 and 2214 are formed, and phosphorus is added in the same way as in FIG. 7C. In this way, impurity regions 2215, 2216, 2217, 2218, 2219, 2220 and 2221 containing phosphorus in a high concentration are formed (FIG. 22C).

Thereafter, the process steps of FIG. 8B and so on are carried out in accordance with Example 4, and the pixel unit having the construction explained with reference to FIG. 8C can be obtained. When this example is employed, the construction becomes the one in which phosphorus is not at all added to the source and drain regions of the p-channel TFT that constitutes the CMOS circuit. Therefore, the boron concentration necessary for the $p^{++}$ addition step may be small, and throughput can be improved. If phosphorus is added also to the end portions of the $p^{++}$ regions 2208 and 2209 in the step shown in FIG. 22C, the gettering step of Example 12 can be carried out.

When the $n^+$ region or the $p^{++}$ region that constitutes the source region or the drain region is formed, the gate insulation film may be so etched as to expose a part of the active layer before the addition of the impurity element. The impurity element may be then added to the portion so exposed. In this case, since the acceleration voltage may be low, damage to the active layer is small and throughput can be improved.

When this example is executed, there may be the case where the concentration of the impurity element contained in the impurity regions formed finally in the active layer is different from that of Example 4 because the process order changes. However, since the substantial function of each impurity region remains unchanged, the explanation of the construction of FIG. 8C can be as such applied to the explanation of the final construction obtained by this example. The construction of this example can be applied to the construction of Example 1 or 4, and can be freely combined with the construction of any of other Examples 2, 3 and 5 to 13.

EXAMPLE 19

The fabrication steps illustrated in Examples 4 and 14 to 18 are based on the premise that the n⁻ region, which is to later function as the Lov region, is formed in advance before the gate wiring of the n-channel TFT is formed. These process steps are characterized also in that both $p^{++}$ regions and the n⁻⁻ regions are formed in self-alignment.

However, the effect of the present invention can be acquired if the final construction is the one that is shown in FIG. 3C or FIG. 8C, and the process steps up to the final construction are not particularly restrictive. Therefore, the $p^{++}$ regions and the n⁻⁻ regions can be formed in some cases using resist masks. In such a case, the examples of the fabrication steps are not limited to Examples 4 and 14 to 18 but can be combined in every possible combination.

In order to add the impurity element for imparting one conductivity type to the active layer that is the active layer of the TFT, four process steps, that is, the formation of the n⁻ regions, the formation of the $n^+$ regions, the formation of the n⁻ regions and the formation of the $p^{++}$ regions, are necessary in the present invention. Therefore, there are 24 orders of the process steps in all by merely changing the order of these four steps. Examples 4 and 14 to 18 represent six orders among them. However, because the effects of the present invention can be obtained in all of the remaining 18 orders, the impurity regions may be formed in any of the orders.

When the $n^+$ region or the $p^{++}$ region that constitutes the source region or the drain region is formed, the gate insulation film may be etched in such a manner as to expose a part of the active layer before the addition of the impurity element. The impurity element may then be added to the portion so exposed. In this case, since the acceleration voltage may be low, damage to the active layer is small and throughput can be improved.

The construction of this example can be freely combined with the combination of any of Examples 2 to 11 and 13. It can be combined also with Example 12 depending on the order of the process steps.

EXAMPLE 20

Figure 23:
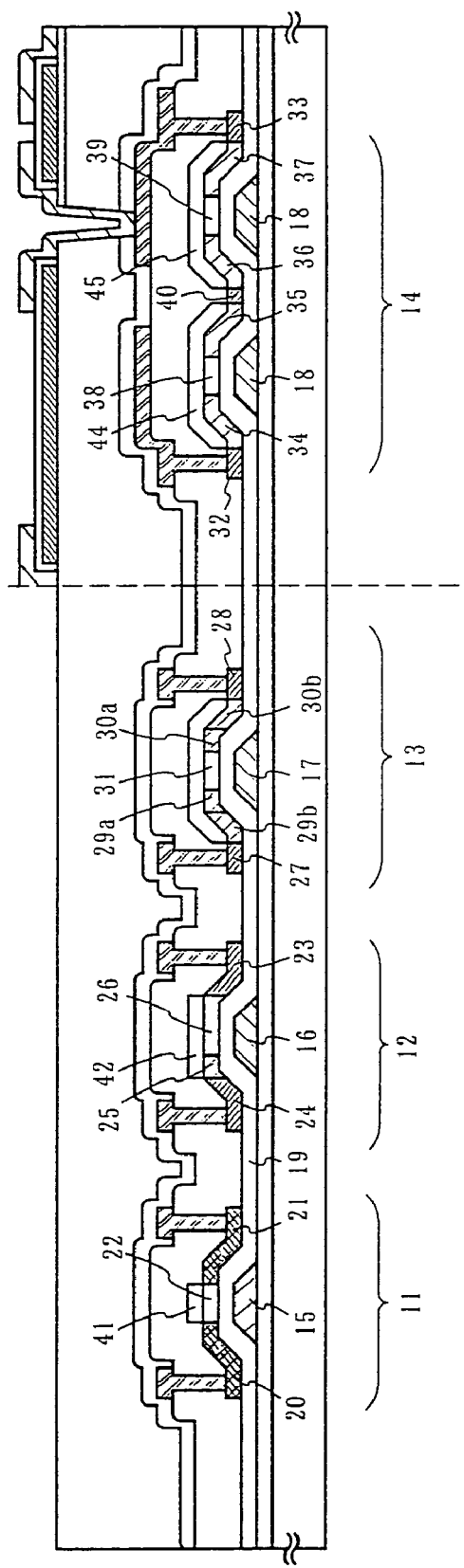
FIG. 23 is a schematic sectional view showing a structure of a pixel unit and a driving circuit.

In this example, explanation will be given on the case where the present invention is used for a bottom gate TFT. More concretely, FIG. 23 shows the case where the present invention is used for an inverted stagger type TFT. The inverted stagger type TFT does not have a remarkable difference from the top gate type TFT of the present invention except for the positional relationship between the gate wiring and the active layer is different. In this example, therefore, explanation will be given particularly on the remarkable difference from the construction shown in FIG. 8C and the explanation of the rest of the portions will be omitted because they are the same as those shown in FIG. 8C.

In FIG. 23, reference numerals 11 and 12 denote a p-channel TFT and an n-channel TFT of a CMOS circuit that constitutes a shift register circuit or the like, respectively. Reference numeral 13 denotes an n-channel TFT for forming a sampling circuit or the like, and reference numeral 14 denotes an n-channel TFT for forming a pixel unit. These thin film transistors are formed over the substrate on which an underlying film is formed.

Reference numeral 15 denotes a gate wiring of the p-channel TFT 11 and reference numeral 16 denotes a gate wiring of the n-channel TFT 12. Reference numeral 17 denotes a gate wiring of the n-channel TFT 13 and reference numeral 18 denotes a gate wiring of the n-channel TFT 14. Each of these gate wirings can be formed by using the same material as that of the gate wiring explained in Example 4. Reference numeral 19 denotes a gate insulation film, which can be formed by using the same material as that of Example 4, too.

An active layer of each TFT 11, 12, 13 and 14 is formed over the gate wirings and the gate insulation film described above. A source region 20, a drain region 21 and a channel formation region 22 are formed in the active layer of the p-channel TFT 11.

A source region 23, a drain region 24, an LDD region (an Lov region 25 in this case) and a channel formation region 26 are formed in the active layer of the n-channel TFT 12.

A source region 27, a drain region 28, LDD regions (Lov regions 29a, 30a and Loff regions 29b, 30b in this case) and a channel formation region 31 are formed in the active layer of the n-channel TFT 13.

A source region 32, a drain region 33, LDD regions (Loff regions 34, 35, 36 and 37 in this case), channel formation regions 38, 39 and an $n^+$ region 40 are formed in the active layer of the n-channel TFT 14.

Incidentally, insulation films represented by reference numerals 41, 42, 43, 44 and 45 are formed in order to protect the channel formation regions and to form the LDD regions.

As described above, the present invention can be easily applied to the bottom gate type TFT typified by the inverted stagger type TFT. To fabricate the inverted stagger type TFT of this example, the process steps described in other Examples of this specification may be applied to the known fabrication process of the inverted stagger type TFT. The construction of this example can also be applied to the active matrix type liquid crystal display device illustrated in Examples 5 and 7.

EXAMPLE 21

In this example, explanation will be given on the case where the present invention is applied to a reflection type liquid crystal display device fabricated on a silicon substrate (a silicon wafer). This example can be executed by adding an n-type or p-type imparting impurity element to the silicon substrate in place of the active layer comprising the crystalline silicon film in Example 1 or 4 so as to accomplish the TFT structure of the present invention. Since the liquid crystal display device is of the reflection type, a metal film having a high reflection factor is used for the pixel electrode.

In other words, the LDD regions of the n-channel TFTs that include at least the pixel unit and the driving circuit on the same substrate and form the driving circuit are arranged in such a fashion that at least a part or the entire part thereof overlap with the gate wirings. The LDD regions of the pixel TFTs that constitute the pixel unit are arranged in such a fashion as not to overlap with the gate wirings. Furthermore, the LDD regions of the n-channel TFTs that constitute the driving circuit contain the n-type imparting impurity element in a higher concentration than the LDD regions of the pixel TFTs.

Incidentally, the construction of this example can be freely combined with the construction of any of Examples 1 to 7 and 13 to 19.

EXAMPLE 22

In Examples 1 to 21, explanation has been given on the premise that the Lov regions and the Loff regions are arranged only in the n-channel TFTs and their positions are used properly in accordance with the circuit specification. This may hold true of the p-channel TFT when the TFT size becomes small (the channel length becomes short).

Namely, when the channel length is 2 µm or less, the short channel effect becomes remarkable, and it becomes necessary from time to time to dispose the Lov region also in the p-channel TFT. In other words, the p-channel TFT in the present invention is not limited particularly to the structure described in Examples 1 to 21 but may have the same structure as that of the n-channel TFT.

Needless to say, the construction of this example can be applied to the construction of any of Examples 1 to 21 and to their combinations.

EXAMPLE 23

Figure 33:
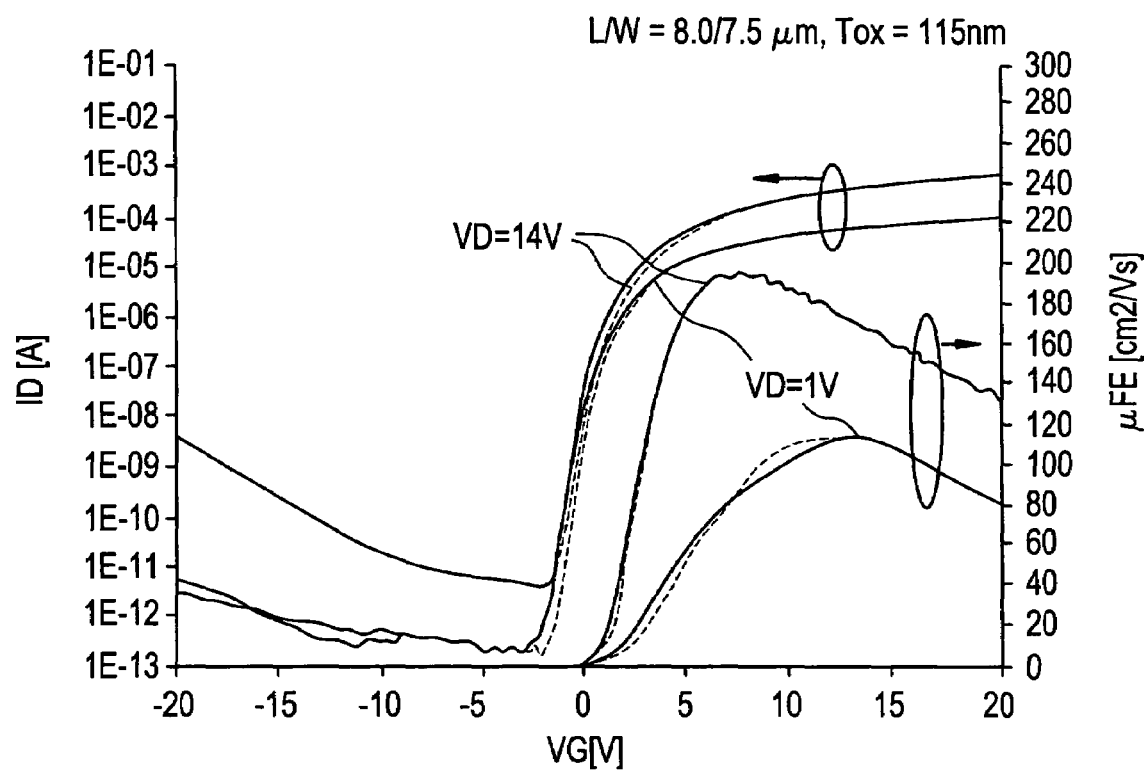
FIG. 33 is a graph showing ID-VG curves and $\mu_{FE}$ of an n-channel TFT.

FIG. 33 shows a graph of a relation between drain current (ID) and gate voltage (VG) of the n-channel TFT 802 fabricated by the process steps according to the Example 4. Hereinafter, the graph is called as ID-VG curve. FIG. 33 further shows a graph of a relation between field effect mobility ($\mu_{FE}$) and the gate voltage (VG) of the n-channel TFT 802. Here, a source voltage (VS) is 0V and a drain voltage (VD) is 1 V or 14 V. In this connection, the n-channel TFT 802 has a channel length (L) of 8 µm, a channel width (W) of 7.5/m and a thickness of a gate insulation film (Tox) of 115 nm.

The bold lines represent the first ID-VG curve prior to a stress test, and the dotted lines represent the second ID-VG curve subsequent to the stress test in FIG. 33. Because little change is observed between the first ID-VG curve and the second ID-VG curve, we find that the degradation owing to hot carriers is restricted. The stress test is the test for accelerating the degradation owing to hot carriers by applying a source voltage of 0V, a drain voltage of 20V and a gate voltage of 2V for 60 seconds at a room temperature.

Figure 34:
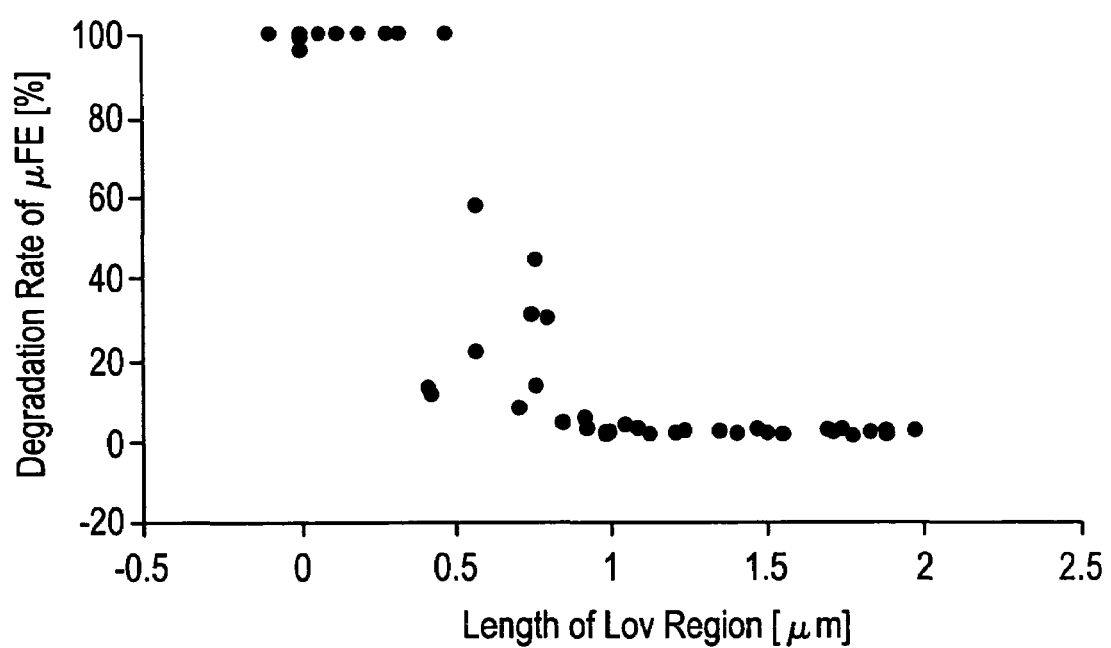
FIG. 34 is a graph showing the relation between degradation rate of the $\mu_{FE}$ and the Lov region length of the n-channel TFT.

FIG. 34 shows the change of degradation rate of the field effect mobility ($\mu_{FE}$) dependent on the length of the Lov region. The degradation rate of the $\mu_{FE}$ is represented as a following expression.

1−($\mu_{FE}$ prior to the stress test/$\mu_{FE}$ subsequent to the stress test)×100

As a result, we find that the degradation of the $\mu_{FE}$ owing to hot carriers is restricted when the length of the Lov region is 0.5 μm or more (preferably, 1.0 μm or more).

Figure 35A:
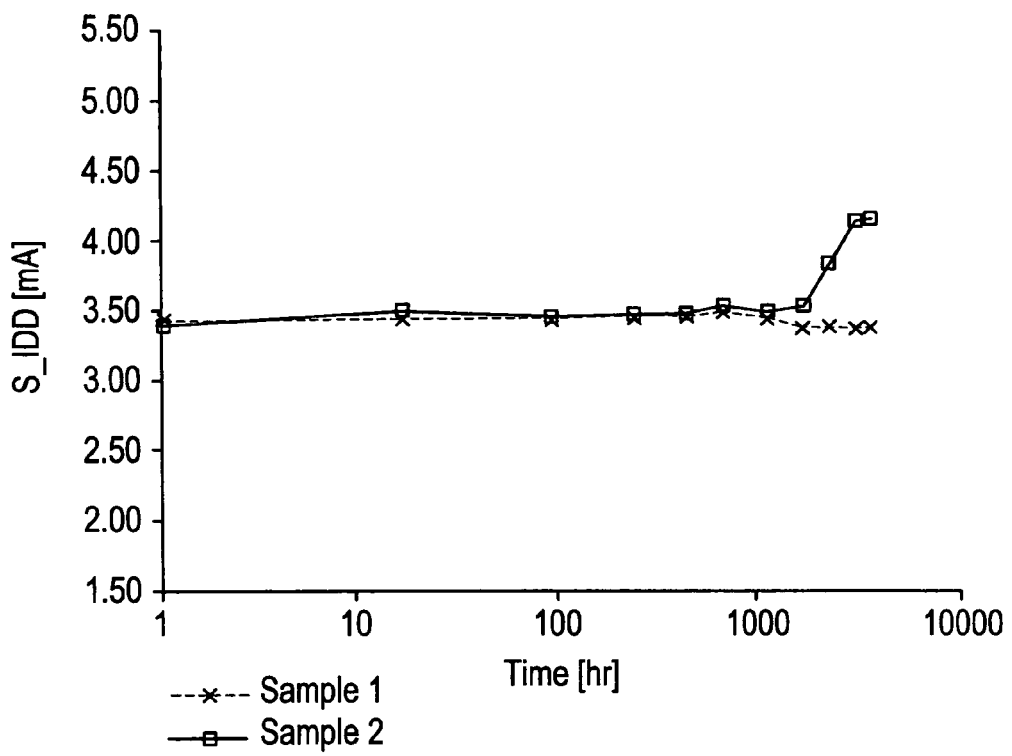
FIGS. 35A and 35B are graphs showing time dependent change of current consumption and the lowest operation voltage.
Figure 35B:
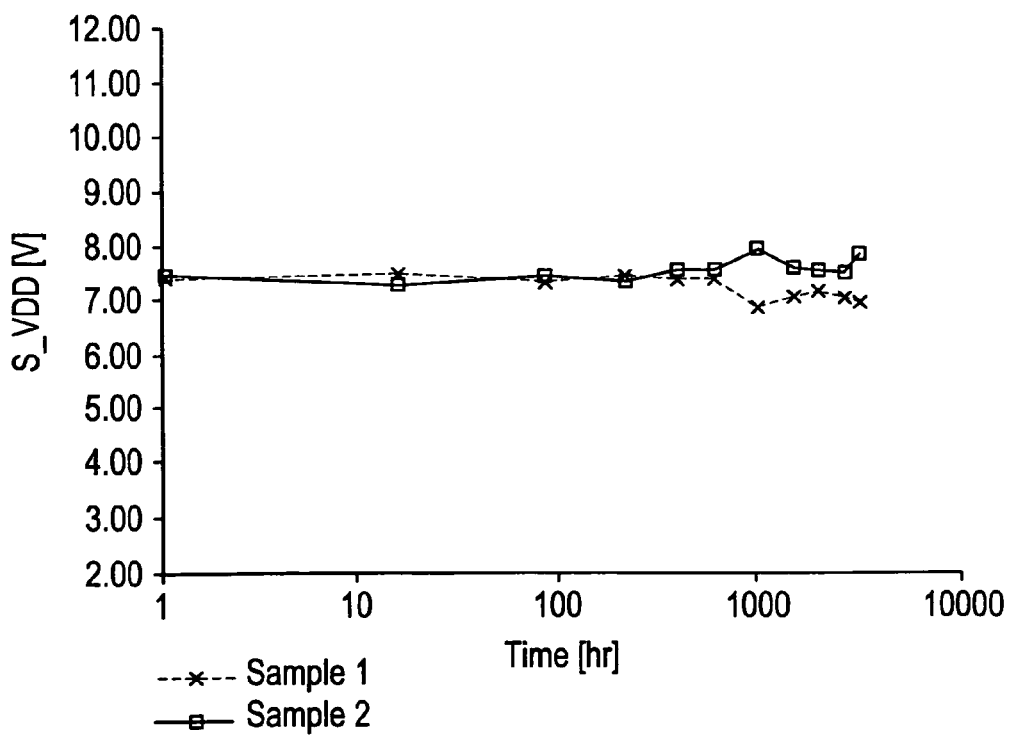

FIGS. 35A and 35B show the result of a long time reliability test with respect to the liquid crystal display device fabricated by the process steps in accordance with the Examples 4 and 5. The reliability test is performed in an atmosphere of 85° C. The power source of a first shift register constituting a source side driving circuit is kept at a positive power source 9.6V, a first negative power source −2.4V and a second negative power source −9.6V during the reliability test; the power source of a second shift register constituting a gate side driving circuit is kept at a positive power source 9.6V, a first negative power source −2.4V and a second negative power source −11.0V during the reliability test.

FIG. 35A shows the time dependent change of current consumption (S_IDD) in the case of the first shift register constituting the source side driving circuit, and little change is observed until 3000 hours. FIG. 35B shows the time dependent change of the lowest operation voltage (S_VDD) in the case of the first shift register constituting the source side driving circuit (the lowest voltage which the first shift register operates), and little change is also observed until 3000 hours. In the second shift register constituting the gate side driving circuit, almost the same results as the FIGS. 35A and 35B are obtained although not shown here.

EXAMPLE 24

Figure 36:
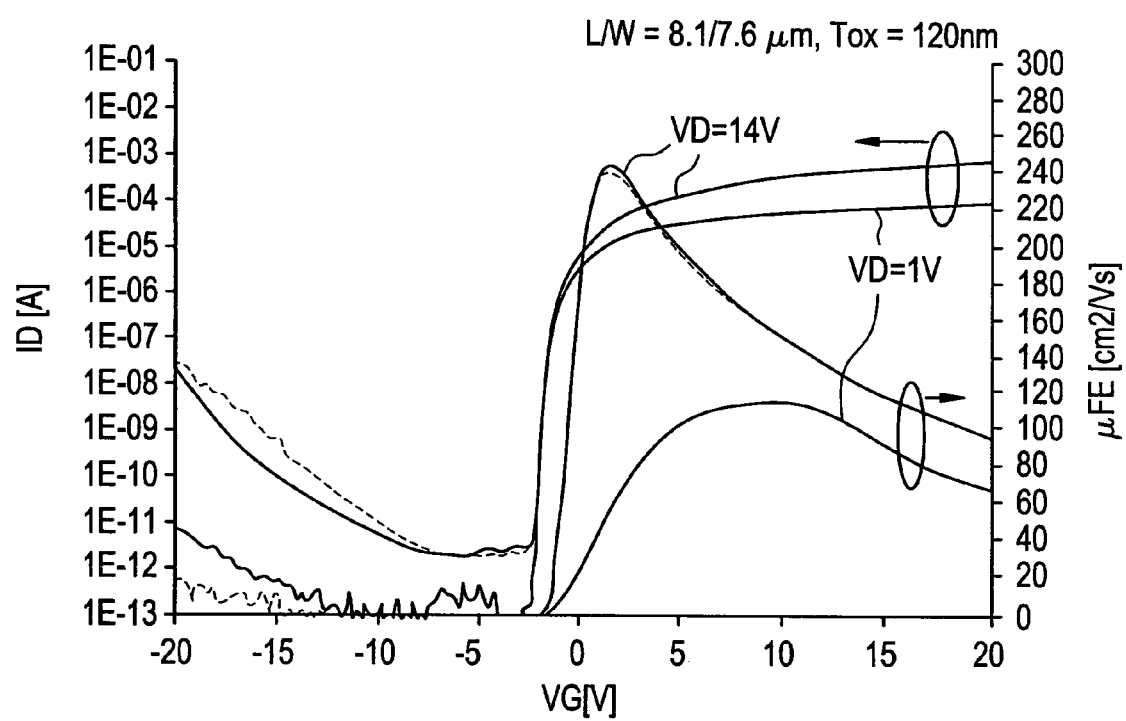
FIG. 36 is a graph showing ID-VG curves and $\mu_{FE}$ of an n-channel TFT.

FIG. 36 shows a graph of a relation between drain current (ID) and gate voltage (VG) of the n-channel TFT (the same structure as the n-channel TFT 802) fabricated by the process steps according to the Example 11. FIG. 33 further shows a graph of a relation between field effect mobility ($\mu_{FE}$) and the gate voltage (VG) of the n-channel TFT. Here, a source voltage (VS) is 0V and a drain voltage (VD) is 1V or 14V. In this connection, the n-channel TFT has a channel length (L) of 8.1 μm, a channel width (W) of 7.6 μm and a thickness of a gate insulation film (Tox) of 120 nm.

The bold lines represent the first characteristic prior to a stress test, and the dotted lines represent the second characteristic subsequent to the stress test in FIG. 36. FIG. 36 shows that the degradation owing to hot carriers is observed very little. The stress test is performed under a condition almost the same as the condition explained in Example 23 although a gate voltage is set at 4V.

Figure 37:
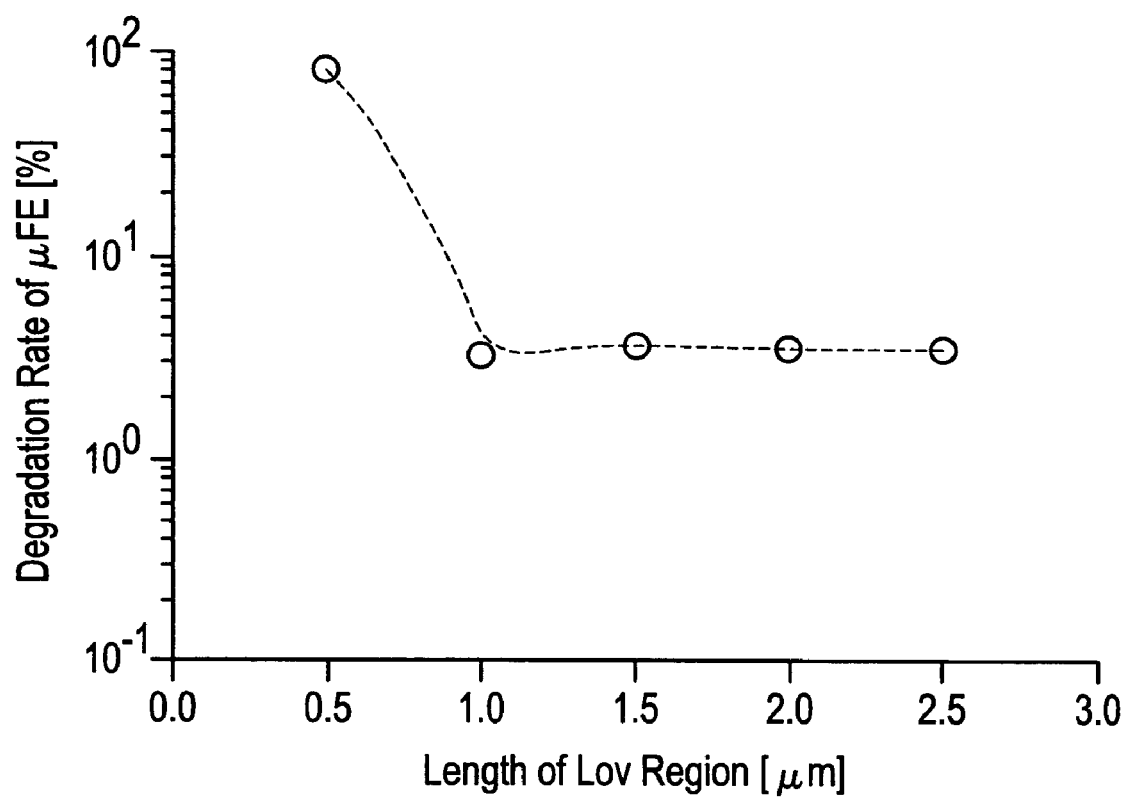
FIG. 37 is a graph showing the relation between degradation rate of the $\mu_{FE}$ and the Lov region length of the n-channel TFT.

FIG. 37 shows the change of degradation rate of the field effect mobility ($\mu_{FE}$) dependent on the length of the Lov region. The degradation rate of the $\mu_{FE}$ is defined in Example 23. FIG. 37 clearly shows that the degradation of the $\mu_{FE}$ due to hot carriers is restricted when the length of the Lov region is 1 μm or more.

Figure 38A:
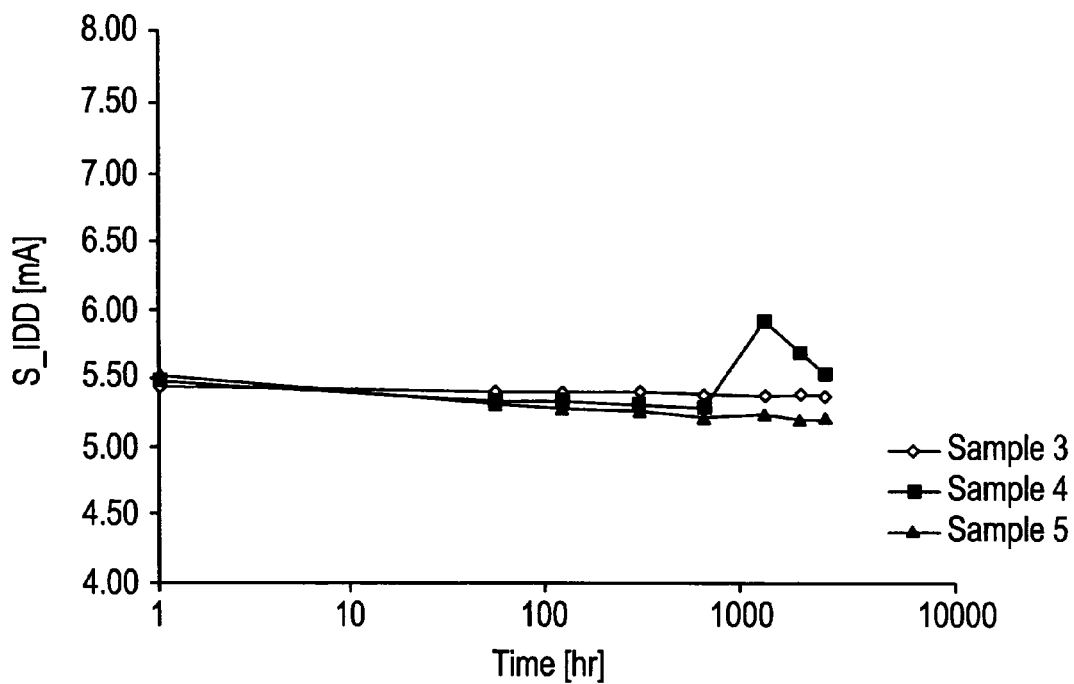
FIGS. 38A and 38B are graphs showing time dependent change of current consumption and the lowest operation voltage.
Figure 38B:
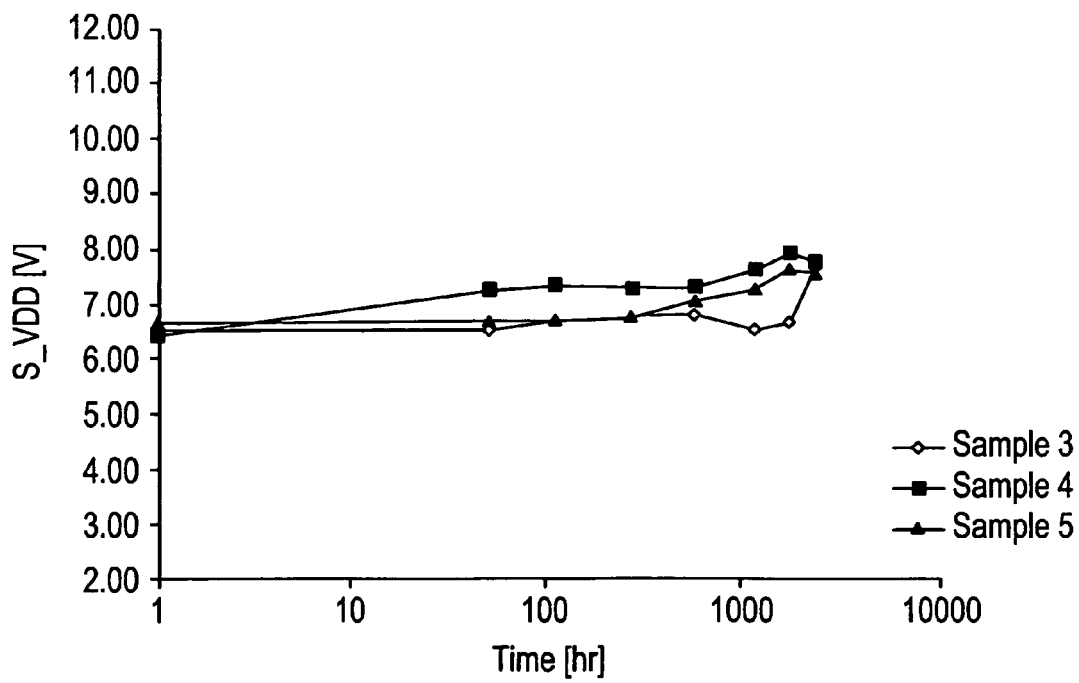

FIGS. 38A and 38B show the result of along time reliability test with respect to the liquid crystal display device fabricated by the process steps in accordance with the Examples 4, 5 and 11. The reliability test is performed in an atmosphere of 80° C. The power source of a first shift register constituting a source side driving circuit and a second shift register constituting a gate side driving circuit are kept at a first positive power source 8.5V, a second positive power source 4.2V and a negative power source −8.0V during the reliability test.

FIG. 38A shows the time dependent change of current consumption (S_IDD) in the case of the first shift register constituting the source side driving circuit, and little change is observed until 2000 hours. FIG. 38B shows the time dependent change of the lowest operation voltage (S_VDD) in the case of the first shift register constituting the source side driving circuit, and little change is also observed until 2000 hours. In the second shift register constituting the gate side driving circuit, almost the same results as the FIGS. 38A and 38B are obtained although not shown here.

EXAMPLE 25

The present invention can be employed also for the case where an inter-layer insulation film is formed on a conventional MOSFET and then a TFT is formed on this film. In other words, a semiconductor device having a three-dimensional structure can be accomplished, too. SOI substrates such as a SIMOX, Smart-Cut (trade name of SOITEC Co.), ELTRAN (trade name of Canon Co.), and so forth, can be used for the substrate.

Incidentally, the construction of this example can be freely combined with the construction of any of Examples 1 to 7, 13 to 19, 21 and 22.

EXAMPLE 26

The liquid crystal display device fabricated by the present invention can use various liquid crystal materials. Examples of such materials include a TN liquid crystal, a PDLC (Polymer Dispersion type Liquid Crystal), an FLC (a Ferroelectric Liquid Crystal), an AFLC (Anti-Ferroelectric Liquid Crystal) and a mixture of the FLC and the AFLC.

For example, it is possible to use those liquid crystal materials which are described in H. Furue et al.; "Characteristics and Driving Scheme of Polymer-Stabilized Monostable FLCD Exhibiting Fast Response Time and High Contrast Ratio with Gray-Scale Capability, SID, 1998", T. Yoshida et al.; "A Full-Color Threshold less Antiferroelectric LCD Exhibiting Wide Viewing Angle with Fast Response Time, 841, SID97 DIGEST, 1997", and U.S. Pat. No. 5,594,569.

Particularly when the thresholdless antiferroelectric LCD (hereinafter abbreviated as "TL-AFLC") is used, the operating voltage of the liquid crystal can be lowered to about +2.5 V, and the power source voltage may be from about 5 to 8-V in some cases. In other words, the driving circuit and the pixel unit can be operated at the same power source voltage, and power consumption of the liquid crystal device can be reduced as a whole.

The ferroelectric liquid crystal and the antiferroelectric liquid crystal have the advantage that their response time is higher than that of the TN liquid crystal. Because the crystalline silicon TFT used in the present invention can achieve the TFT having an extremely high operation speed, the present invention can accomplish a liquid crystal display device having a high image response speed by making the most of the high response speed of the ferroelectric liquid crystal and the antiferroelectric liquid crystal.

Needless to say, the liquid crystal display device of this example can be used effectively as a display unit of electric/electronic appliances such as a personal computer.

The construction of this example can be combined freely with the construction of any of Examples 1 to 22 and 25.

EXAMPLE 27

Figure 24:
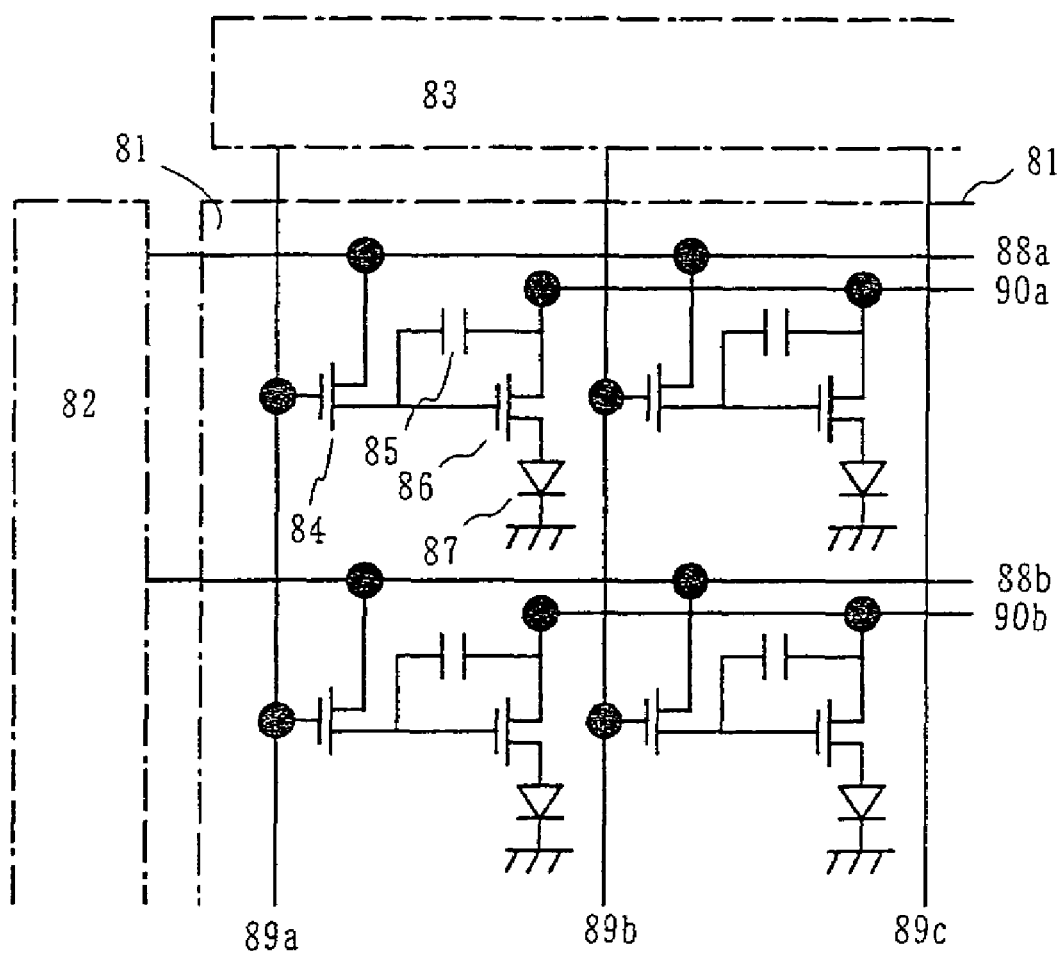
FIG. 24 is a circuit diagram showing the construction of an active matrix type EL display device.

The present invention can be applied to an active matrix type EL (electroluminescence) display (called also the "EL display device"). FIG. 24 shows its example.

FIG. 24 is a circuit diagram of the active matrix type EL display of this example. Reference numeral 81 denotes a display region. An X direction (source side) driving circuit 82 and a Y direction (gate side) driving circuit 83 are disposed round the display region 81. Each pixel of the display region 81 includes a switching TFT 84, a capacitor 85, a current controlling TFT 86 and an EL cell 87. An X direction signal line (source signal line) 88a (or 88b) and a Y direction signal line (gate signal line) 89a (or 89b, 89c) are connected to the switching TFT 84. Power source lines 90a and 90b are connected to the current controlling TFT 86.

The active matrix type EL display of this example can be combined with the construction of any of Examples 1 to 4, 6 and 8 to 22 and 25.

EXAMPLE 28

Figure 25A:
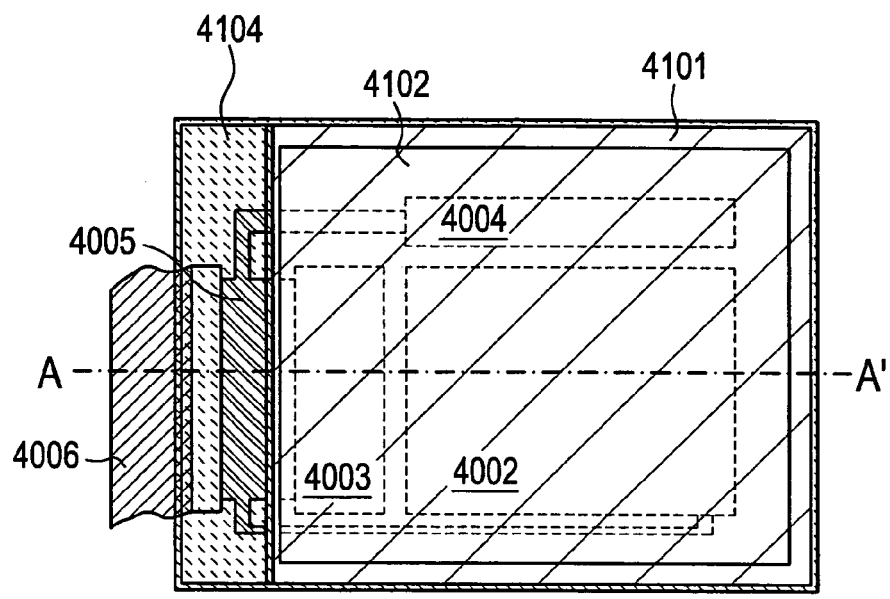
FIGS. 25A and 25B are a top view and a sectional view showing the construction of an EL display device.

In this example, explanation will be given on the case where the present invention is applied to the fabrication of an EL (electroluminescence) display device. FIG. 25A is a top view of the EL display device of this example and FIG. 25B is its sectional view.

Referring to FIG. 25A, reference numeral 4002 denotes a pixel unit, reference numeral 4003 denotes a source side driving circuit and reference numeral 4004 does a gate side driving circuit. Each driving circuit is extended via a wiring 4005 to an FPC (flexible printed circuit) 4006 and is then connected to an external appliance.

In this instance, a first seal member 4101, a cover member 4102, a filler 4103 and a second seal member 4104 are disposed in such a fashion as to encompass the pixel unit 4002, the source side driving circuit 4003 and the gate side driving circuit 4004.

Figure 25B:
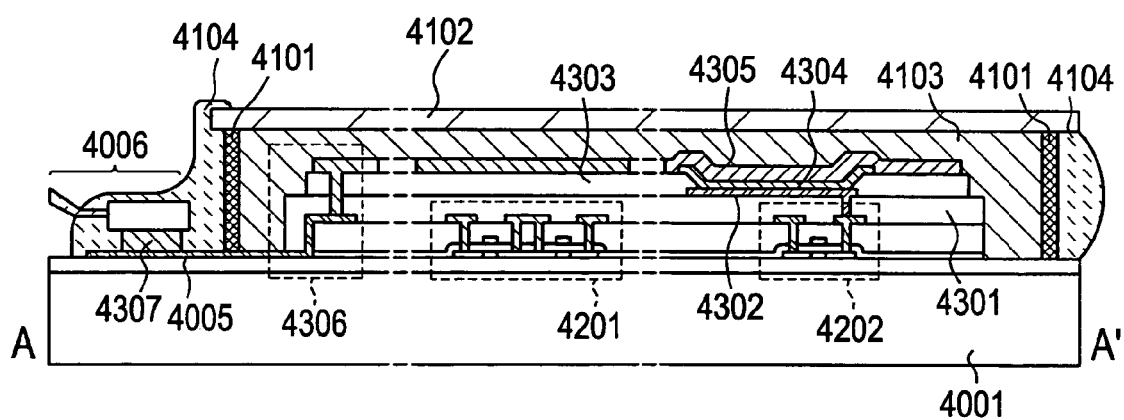

FIG. 25B is a sectional view taken along a line A-A' of FIG. 25A. Driving TFTs 4201 (an n-channel TFT and a p-channel TFT being shown hereby) contained in the source side driving circuit 4003 and a current controlling TFT 4202 (TFT for controlling the current to the EL cell) contained in the pixel unit 4002 are fabricated over the substrate 4001.

This example uses a TFT having the same structure as that of the p-channel TFT 181 and the n-channel TFT 182 shown in FIGS. 3A to 3C for the driving TFT 4201, and a TFT having the same structure as that of the p-channel TFT 181 shown in FIGS. 3A to 3C for the current controlling TFT 4202. A holding capacitance (not shown) connected to the gate of the current controlling TFT 4202 is disposed in the pixel unit 4002.

An inter-layer insulation film (planarization film) 4301 made of a resin material is formed over the driving TFT 4201 and the pixel TFT 4202, and a pixel electrode (anode) 4302 electrically connected to the drain of the pixel TFT 4202 is formed on the inter-layer insulation film 4301. A transparent conductive film having a high work function is used for the pixel electrode 4302. A compound between indium oxide and tin oxide or a compound between indium oxide and zinc oxide can be used for the transparent conductive film.

An insulation film 4303 is formed on the pixel electrode 4302, and an opening is bored in the insulation film 4303 on the pixel electrode 4302. An EL (electroluminescence) layer 4304 is formed at this opening on the pixel electrode 4302. A known organic or inorganic EL material can be used for the EL layer 4304. Low molecular weight type (monomer type) materials and polymer type materials can be used for the organic EL materials.

The EL layer 4304 can be formed by a known vapor deposition technology or application technology. The structure of the EL layer may be either a laminate structure or a single layer structure of a positive hole injection layer, a positive hole transportation layer, a light emitting layer, an electron transportation layer or an electron injection layer by combining them freely.

A cathode 4305 comprising a conductive film having a shading property (typically, a conductive film made of aluminum, copper or silver as the principal component or its laminate film with other conductive film) is formed on the EL layer 4304. The moisture and oxygen that may exist in the interface between the cathode 4305 and the EL layer 4304 are preferably removed as much as possible. Therefore, these films are continuously formed in vacuum, or the EL layer 4304 is first formed in a nitrogen or inert gas atmosphere and is shaped into the cathode 4305 without being brought into contact with oxygen and moisture. To achieve such film formation, this example uses a multi-chamber system (cluster tool system) film formation apparatus.

The cathode 43.05 is electrically connected to the wiring 4005 in the region represented by reference numeral 4306. The wiring 4005 applies a predetermined voltage to the cathode 4305 and is electrically connected to the FPC 4006 through an anisotropic conductive film 4307.

The EL cell comprising the pixel electrode (anode) 4302, the EL layer 4304 and the cathode 4305 are formed in the manner described above. This EL cell is encompassed by the first seal member and the cover material 4102 bonded to the substrate 4001 by the first seal member 4101. The EL cell is further sealed by the filler 4103.

Examples of the cover material 4102 include a glass sheet, a metal sheet (typically, a stainless steel sheet), a ceramic sheet, an FRP (fiberglass-reinforced plastic) sheet, a PVF (polyvinyl fluoride) film, a Mylar film, a polyester film and an acrylic resin film. A laminate sheet sandwiching an aluminum foil by the PVF films or the Mylar films can also be used.

When the radiation direction of light from the EL cell travels towards the cover material side, however, the cover material must be transparent. In this case, a transparent material such as a glass sheet, a plastic sheet, a polyester film or an acrylic resin film is used.

A UV-curing resin or a thermosetting resin can be used for the filler 4103. Examples include PVC (polyvinylchloride), an acrylic resin, a polyimide resin, an epoxy resin, a silicone resin, PVB (polyvinylbutyral) and EVA (ethylene-vinyl acetate). Degradation of the EL cell can be restrained if a hygroscopic material (preferably, barium oxide) is disposed inside this filler 4103.

The filler 4103 may further contain a spacer. If the spacer is made of barium oxide, the spacer itself becomes hygroscopic. When the spacer is disposed, it is also effective to dispose a resin film on the cathode 4305 as a buffer layer for buffering the pressure from the spacer.

The wiring 4005 is electrically connected to the FPC 4006 through the anisotropic conductive film 4307. The wiring 4005 transmits the signals transferred to the pixel unit 4002, the source side driving circuit 4003 and the gate side driving circuit 4004, to the FPC 4006. The wiring 4005 is electrically connected to the external appliance by the FPC 4006.

In this example, the second seal member 4104 is disposed in such a fashion as to cover the exposed portion of the first seal member 4101 and a part of the FPC 4006 and to completely cut off the EL cell from the external atmosphere. In this way, the EL display device having the sectional structure shown in FIG. 25B can be obtained. Incidentally, the EL display device of this example may be fabricated in combination with the construction of any of Examples 1 to 4, 6 to 20 and 22.

Figure 26:
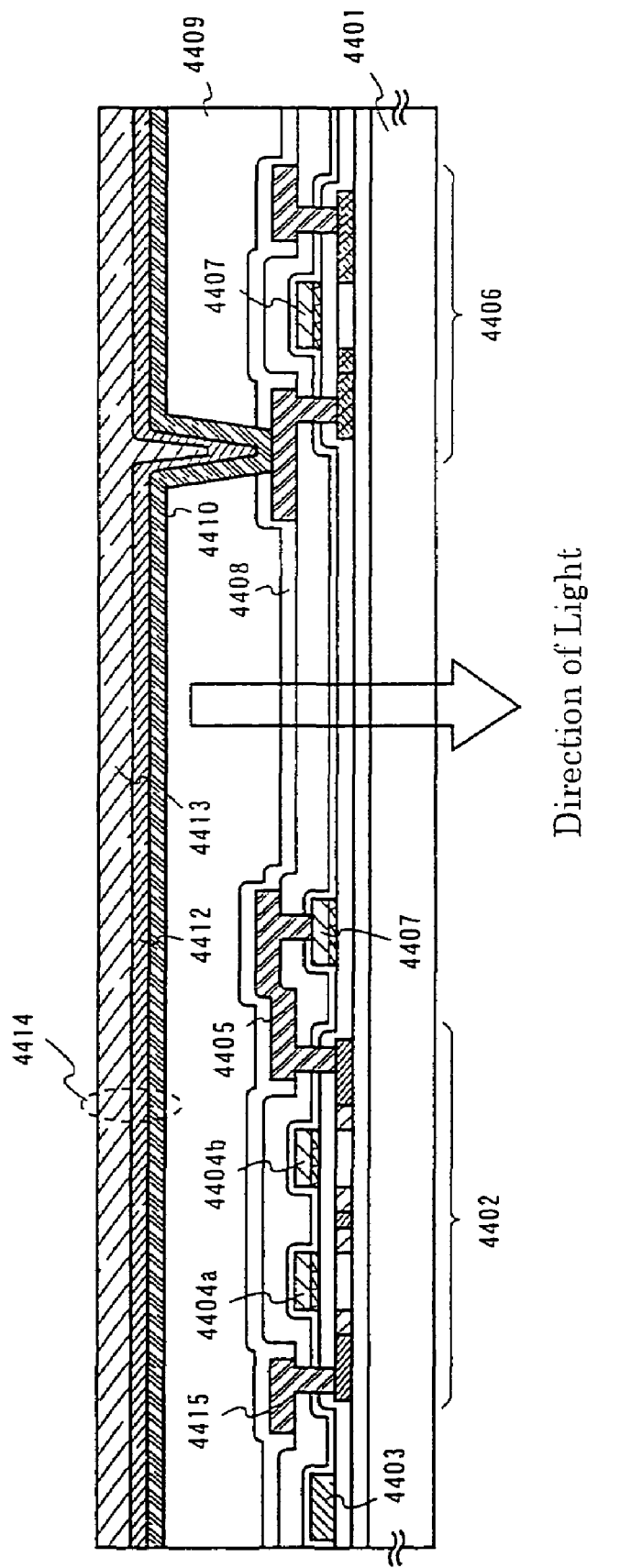
FIG. 26 is a schematic sectional view showing a sectional structure of an EL display device.
Figure 27A:
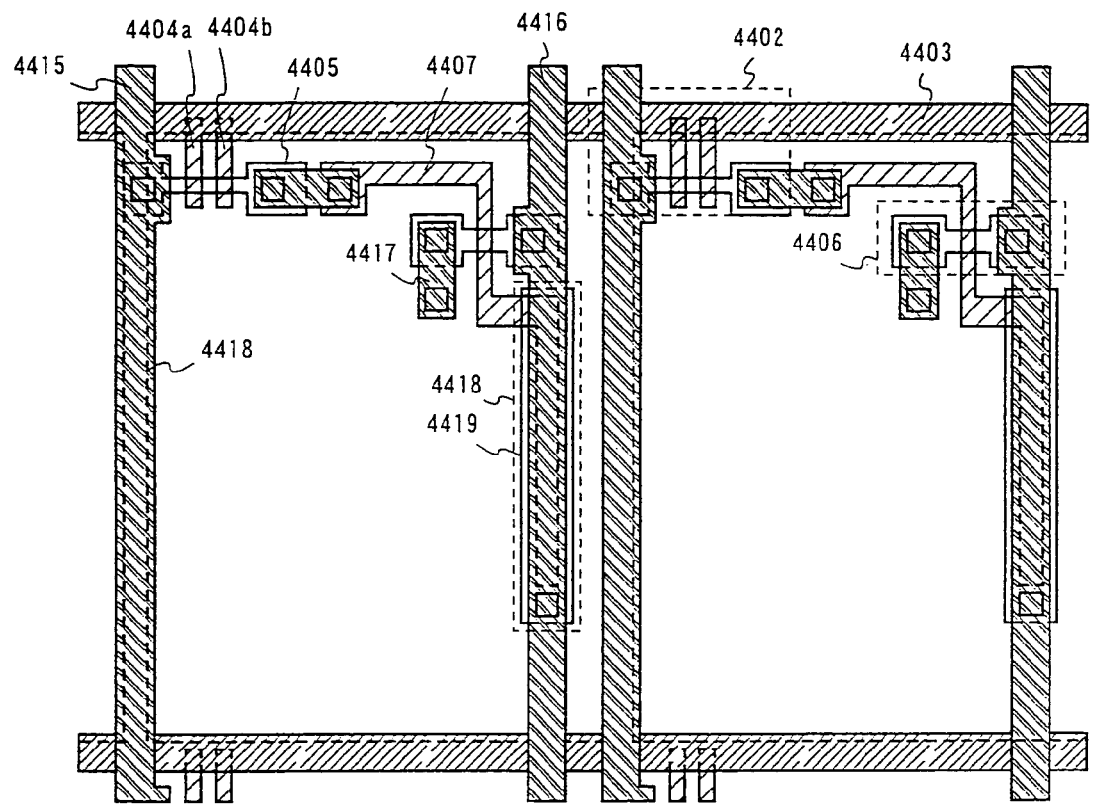
FIGS. 27A and 27B are a schematic view and a wiring diagram showing a top structure of a pixel unit of an EL display device.
Figure 27B:
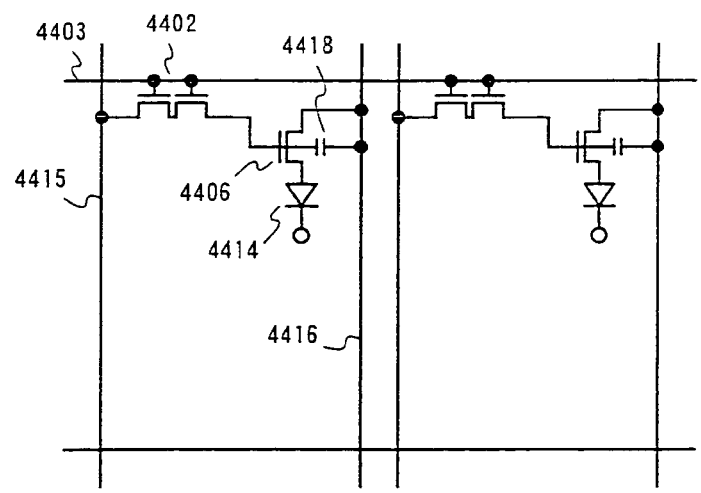

FIG. 26 shows a further detailed sectional structure of the pixel unit, FIG. 27A shows its top structure and FIG. 27B shows its circuit diagram. Since common reference numerals are used in these drawings, cross-reference should be made with one another.

In FIG. 26, the switching TFT 4402 disposed on the substrate 4401 is formed of the n-channel TFT 183 shown in FIG. 3C. Therefore, reference should be made to the explanation of the structure of the n-channel TFT 183 for the detail of the structure. The wiring represented by reference numeral 4403 is the one that electrically connects the gate wirings 4404a and 4404b of the switching TFT 4402.

Incidentally, this example has the double-gate structure in which two channel formation regions are formed, but it may have a single gate structure in which only one channel formation region is formed, or a triple-gate structure in which three channel formation regions are formed.

The drain wiring 4405 of the switching TFT 4402 is electrically connected to the gate electrode 4407 of the current controlling TFT 4406. Incidentally, the current controlling TFT 4406 is formed of the p-channel TFT 181 shown in FIG. 3C. Therefore, as to the explanation of the structure, reference should be made to the explanation of the p-channel TFT 181. Though this example employs the single gate structure, it may be a double-gate structure or a triple-gate structure.

A first passivation film 4408 is disposed on the switching TFT 4402 and the current controlling TFT 4406, and a planarization film 4409 made of a resin is formed on this passivation film 4408. It is of utmost importance to planarize the steps resulting from the TFTs by using this planarization film 4409. Since the EL layer to be formed later is extremely thin, the existence of any step may invite a luminescence defect. Therefore, planarization is preferably effected before the formation of the pixel electrodes so that the EL layer can be shaped into a plane as planar as possible.

Reference numeral 4410 denotes a pixel electrode (an anode of the EL cell) comprising a transparent conductive film. The pixel electrode 4410 is electrically connected to a drain wiring 4411 of the current controlling TFT 4406. A conductive film made of a compound between indium oxide and tin oxide or a compound between indium oxide and zinc oxide can be used for the pixel electrode 4410.

An EL layer 4412 is formed on the pixel electrode 4410. Though FIG. 26 shows only one pixel, the EL layers are formed properly so as to correspond to R (red), G (green) and B (blue) colors, respectively, in this example. In this example, a low molecular weight organic EL material is formed by vapor deposition. More concretely, the EL layer has a laminate structure in which a 20 nm-thick copper phthalocyanine (CuPc) film is disposed as a positive hole injection layer, and a 70 nm-thick tris-8-quinolinolatoaluminum complex ($Alq_3$) film as a light-emitting layer is disposed on the CuPc film. The luminescence color can be controlled when a fluorescent pigment is added to $Alq_3$.

However, the example given above represents merely one example of the organic EL materials that can be used for the EL layer, and does not restrict the invention. The EL layer (the layer for luminescence and for moving the carrier for luminescence) maybe formed by freely combining the luminescence layer, the charge transportation layer and the charge injection layer. Though this example uses the low molecular weight organic EL material for the EL layer, it can use a polymeric organic EL material, too. Inorganic materials such as silicon carbide can also be used for the charge transportation layer and the charge injection layer. Known materials can be used for these organic EL materials and the inorganic materials.

Next, a cathode 4413 comprising a shading conductive film is disposed on the EL layer 4412. In this example, an alloy film of aluminum and lithium is used for the shading conductive film. Needless to say, a known MgAg film (an alloy film of magnesium and silver) may be used, too. A conductive film made of the elements belonging to the Group 1 or 2 of the Periodic Table, or a conductive film containing any of these elements may be used for the cathode materials.

The EL cell 4414 is completed at the point of time when this cathode 4413 is completed. Incidentally, the term "EL cell 4414" hereby used means a capacitor comprising the pixel electrode (anode) 4410, the EL layer 4412 and the cathode 4413.

Next, the top structure of the pixel in this example will be explained with reference to FIG. 27A. The source of the switching TFT 4402 is connected to the source wiring 4415 and the drain is connected to the drain wiring 4405. The drain wiring 4405 is electrically connected to the gate electrode 4407 of the current controlling TFT 4406. The source of the current controlling TFT 4406 is electrically connected to a current supply line 4416 and the drain is electrically connected to the drain wiring 4417. The drain wiring 4417 is electrically connected to the pixel electrode (anode) 4418 represented by dotted line.

At this time, a holding capacitance is formed in a region represented by reference numeral 4419. The holding capacitance 4419 is defined by a semiconductor film 4420 electrically connected to the current supply line 4416, an insulation film (not shown) that is the same layer as the gate insulation film and the gate electrode 4407. A capacitance defined by the gate electrode 4407, the same layer (not shown) as the first inter-layer insulation film and the current supply line 4416 can also be used as the holding capacitance.

Incidentally, the construction of this example can be freely combined with the construction of any of Examples 1 to 4, 6 and 8 to 22 and 25.

EXAMPLE 29

In this example, explanation will be given with reference to FIG. 28 on the EL display device that has a different pixel structure from that of Example 28. For the explanation of the portions indicated by the same reference numerals as those in FIG. 26, reference should be made to the explanation of Example 26.

Figure 28:
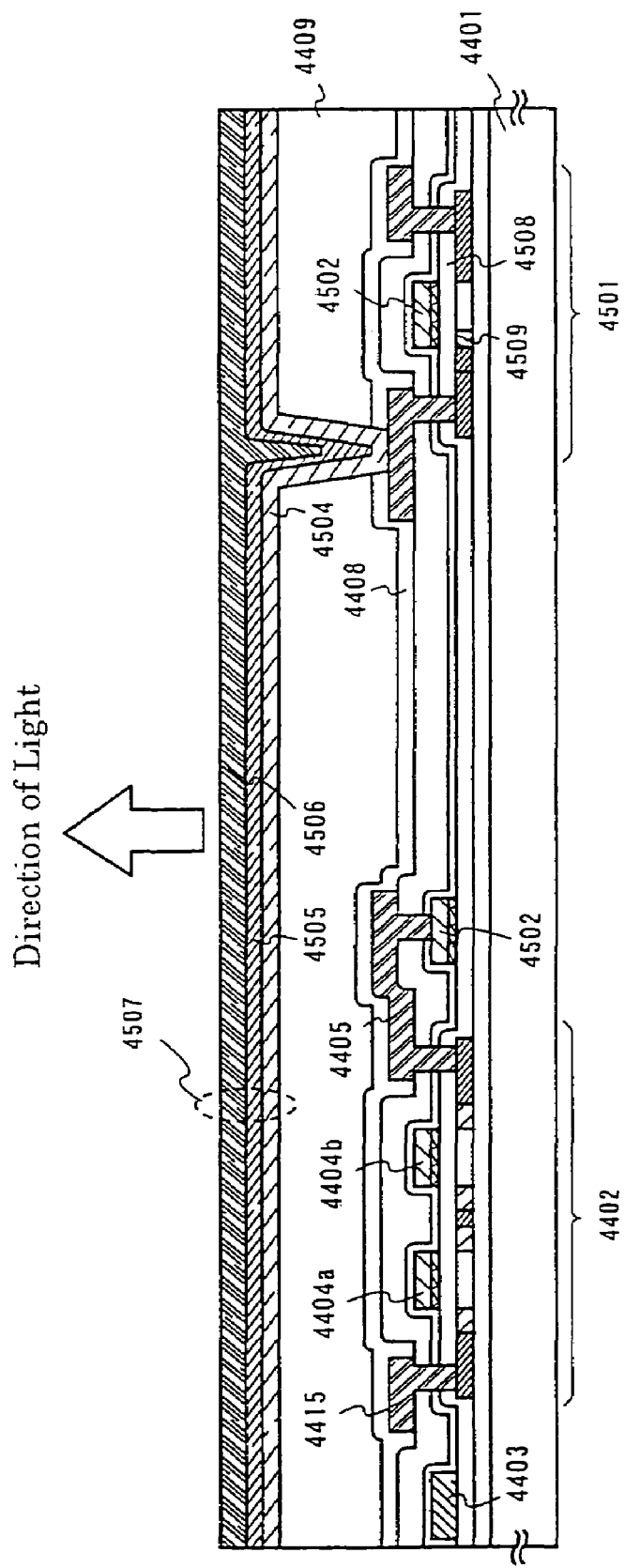
FIG. 28 is a schematic sectional view showing a sectional structure of an EL display device.

Referring to FIG. 28, a TFT having the same structure as that of the n-channel TFT 182 shown in FIG. 3C is used for the current controlling TFT 4501. Needless to say, the gate electrode 4502 of the current controlling TFT 4501 is connected to the drain wiring 4405 of the switching TFT

4402. The drain wiring 4503 of the current controlling TFT 4501 is electrically connected to the pixel electrode 4504.

In this example, the pixel electrode 4504 functions as the cathode of the EL cell, and is formed of a shading conductive film. More concretely, an alloy film of aluminum and lithium is used, but a conductive film made of any of the elements belonging to the Group 1 or 2 of the Periodic Table or a conductive film added with these elements may be used.

The EL layer 4505 is formed on the pixel electrode 4504. Though FIG. 28 shows only one pixel, the EL layer corresponding to G (green) is formed in practice by vapor deposition and coating (preferably, spin coating) in this example. More concretely, the EL layer has a laminate structure in which a 20 nm-thick lithium fluoride (LiF) film is disposed as the electron injection layer and a 70 nm-thick PPV (poly-paraphenylene vinylene) film is disposed as the luminescence layer on the LiF film.

Next, the anode 4506 comprising a transparent conductive film is disposed on the EL layer 4505. In this example, a conductive film made of a compound between indium oxide and tin oxide or a compound between indium oxide and zinc oxide is used as the transparent conductive film.

The EL cell 4507 is completed at the point when this anode 4506 is formed. Incidentally, the term "EL cell 4507" used hereby means a capacitor comprising the pixel electrode (cathode) 4504, the EL layer 4505 and the anode 4506.

At this time, it is of utmost importance that the current controlling TFT 4501 has the construction of the present invention. The current controlling TFT 4501 is a device for controlling the quantity of the current flowing through the EL cell 4507. Therefore, a large quantity of the current flows through this TFT and the TFT has a high possibility of degradation by heat and degradation by hot carriers. Therefore, the construction of the present invention, wherein the LDD region 4509 is so disposed as to overlap with the gate electrode 4502 through the gate insulation film 4508 on the drain side of the current controlling TFT 4501, is extremely effective.

The current controlling TFT 4501 in this example forms also a parasitic capacitance called a "gate capacitance" between the gate electrode 4502 and the LDD region 4509. The function equivalent to the holding capacitance 4419 shown in FIGS. 27A and 27B can be achieved by adjusting this gate capacitance. Particularly when the EL display device is operated in a digital driving system, the capacitance of the holding capacitance may be smaller than when the EL display device is driven by an analog driving system. Therefore, the gate capacitance can substitute the holding capacitance.

Incidentally, the construction of this example can be freely combined with the construction of Examples 1 to 4, 6 and 8 to 22 and 25.

EXAMPLE 30

Figure 29A:
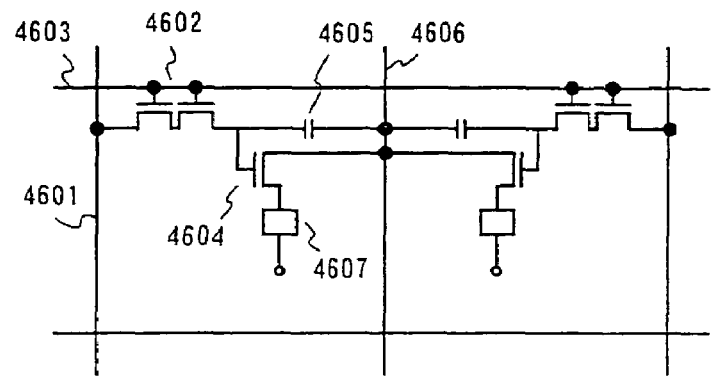
FIGS. 29A to 29C are circuit diagrams showing the circuit construction of a pixel unit of an EL display device.
Figure 29B:
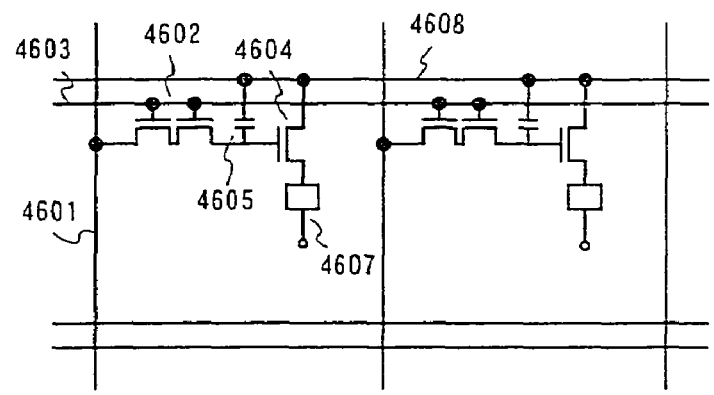
Figure 29C:
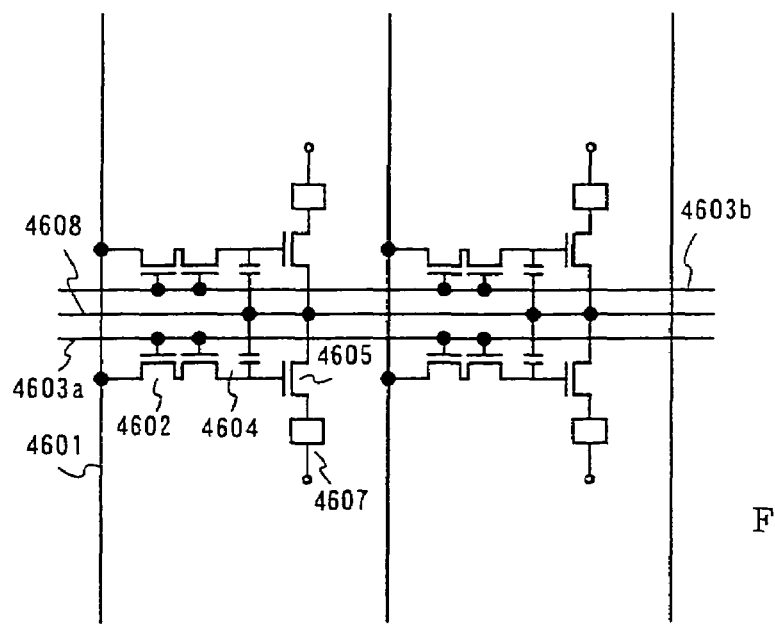

This example represents an example of a pixel structure that can be used for the pixel unit of the EL display device shown in Example 28 or 29, with reference to FIGS. 29A, 29B and 29C. In this example, reference numeral 4601 denotes a source wiring of a switching TFT 4602 and reference numeral 4603 denotes a gate wiring of the switching TFT 4602. Reference numeral 4604 denotes a current controlling TFT and reference numeral 4605 denotes a capacitor. Reference numerals 4606 and 4608 denote current supply lines and reference numeral 4607 denotes an EL cell.

FIG. 29A shows an example where the current supply line 4606 is shared in common between two pixels. In other words, this example has the feature in that two pixels are formed in symmetry of line with the current supply line 4606 as the center. In this case, since the number of current supply lines can be reduced, the pixel unit can be further miniaturized.

FIG. 29B shows an example where the current supply line 4608 is disposed in parallel with the gate wiring 4603. Incidentally, FIG. 29B shows a structure in which the current supply line 4608 and the gate wiring 4603 do not overlap with each other, but they may overlap with each other through an insulation film so long as they are formed in different layers. In this case, since the occupying area can be shared between the power supply line 4608 and the gate wiring 4603, the pixel unit can be further miniaturized.

The feature of the construction shown in FIG. 29C lies in that the current supply line 4608 is disposed in parallel with the gate wiring 4603 in the same way as in FIG. 29B, and that the two pixels are arranged in symmetry of line with the current supply line 4608 as the center. It is also effective to dispose the current supply line 4608 in such a fashion as to overlap with either one of the gate wirings 4603. In this case, since the number of current supply lines can be decreased, the pixel unit can be further miniaturized.

EXAMPLE 31

The electro-optical device and the semiconductor circuit according to the present invention can be used for the display portion of electrical appliances and signal processing circuits. Such electric appliances include video cameras, digital cameras, projectors, projection TVs, goggle type displays, head-mount displays, navigation systems, audio reproduction apparatuses, notebook type personal computers, game machines, portable information terminals (mobile computers, cellular telephones, portable game machines, electronic books, etc.), image reproduction apparatuses equipped with a recording medium, and so forth. FIGS. 30A to 30F, 31A to 31D, 32A and 32B show concrete examples of such electric appliances.

Figure 30A:
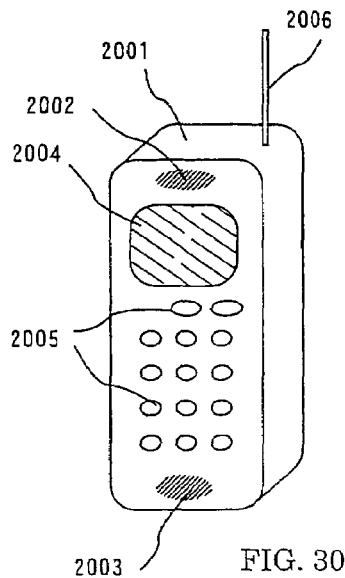
FIGS. 30A to 30F are perspective views showing an example of electrical appliances.

FIG. 30A shows the cellular telephone, which comprises a main body 2001, a sound output unit 2002, a sound input unit 2003, a display unit 2004, an operation switch 2005 and an antenna 2006. The electro-optical device of the present invention can be used for this display unit 2004, and the semiconductor circuit of the present invention can be used for the sound output unit 2002, the sound input unit 2003 or the CPU and the memory.

Figure 30B:
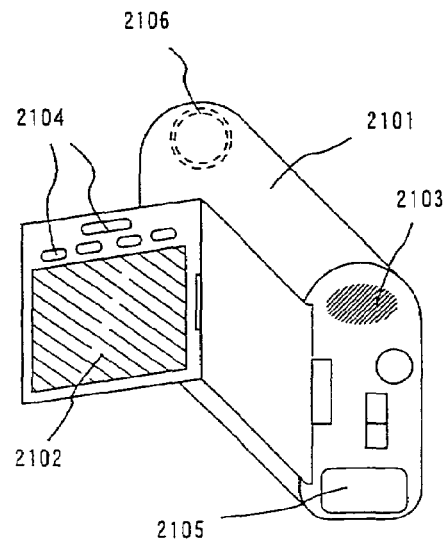

FIG. 30B shows the video camera, which comprises a main body 2101, a display unit 2102, a sound input unit 2103, an operation switch 2104, a battery 2105 and an image reception unit 2106. The electro-optical device of the present invention can be used for the display unit 2102, and the semiconductor circuit of the present invention can be used for the sound input unit 2103 or the CPU and the memory.

Figure 30C:
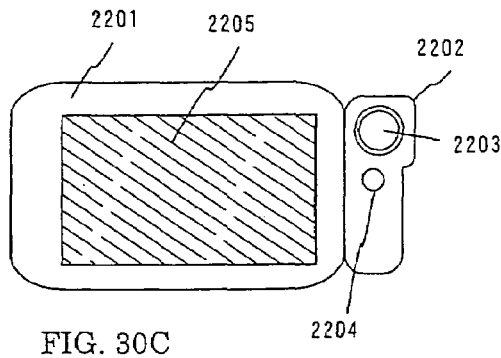

FIG. 30C shows the mobile computer, which comprises a main body 2201, a camera unit 2202, an image reception unit 2203, an operation switch 2204 and a display unit 2205. The electro-optical device of the present invention can be used for the display unit 2205; and the semiconductor circuit of the present invention can be used for the CPU and the memory.

Figure 30D:
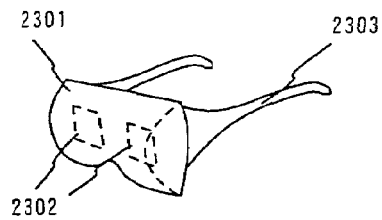

FIG. 30D shows the goggle type display, which comprises a main body 2301, a display unit 2302 and an arm unit 2303. The electro-optical device of the present invention can be used for the display unit 2302, and the semiconductor circuit of the present invention can be used for the CPU and the memory.

Figure 30E:
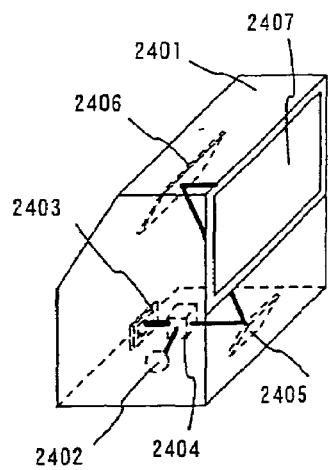

FIG. 30E shows the rear projector or the projection TV, which comprises a main body 2401, a light source 2402, a liquid crystal display device 2403, a polarization beam splitter 2404, reflectors 2405 and 2406 and a screen 2407. The present invention can be applied to the liquid crystal display device 2403, and the semiconductor circuit of the present invention can be used for the CPU and the memory.

Figure 30F:
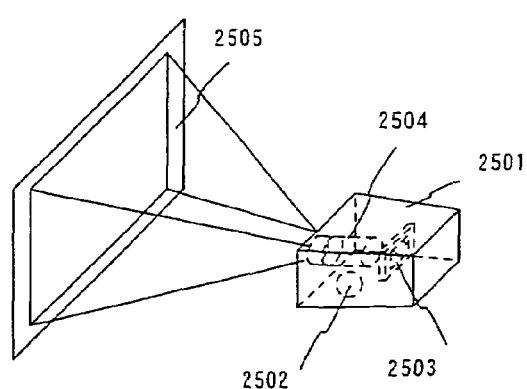

FIG. 30F shows the front projector, which comprises a main body 2501, a light source 2502, a liquid crystal display device 2503, an optical system 2504 and a screen 2505. The present invention can be applied to the liquid crystal display device 2503, and the semiconductor circuit of the present invention can be used for the CPU and the memory.

Figure 31A:
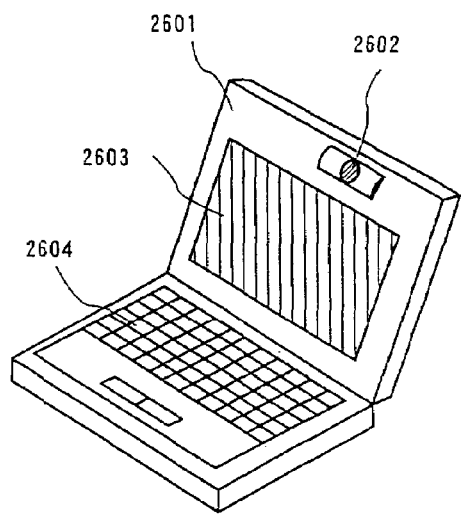
FIGS. 31A to 31D are perspective views showing an example of electrical appliances.

FIG. 31A shows the personal computer, which comprises a main body 2601, an image input unit 2602, a display unit 2603, a keyboard 2604 and so forth. The electro-optical device of the present invention can be used for the display unit 2603, and the semiconductor circuit of the present invention can be used for the CPU and the memory.

Figure 31B:
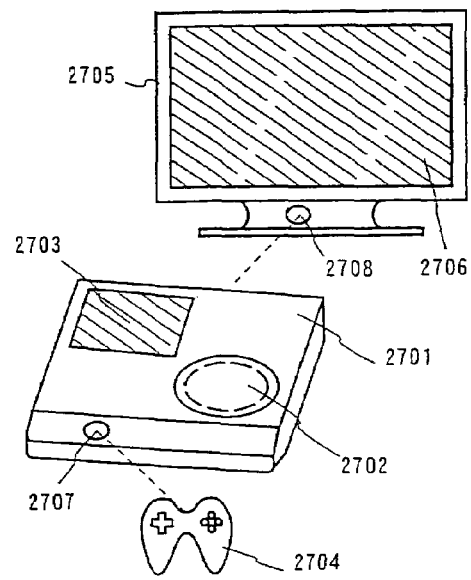

FIG. 31B shows the electronic game machine, which comprises a main body 2701, a memory medium 2702, a display unit 2703 and a controller 2704. The sound and the image outputted from this electronic game machine are reproduced by a display including a casing 2705 and a display unit 2706. Wired communication, wireless communication or optical communication can be used as communication means between the controller 2704 and the main body 2701 or between the electronic game machine and the display. In this example, sensor units 2707 and 2708 detect infrared rays. The electro-optical device of the present invention can be used for the display units 2703 and 2706, and the semiconductor circuit of the present invention can be used for the CPU and the memory.

Figure 31C:
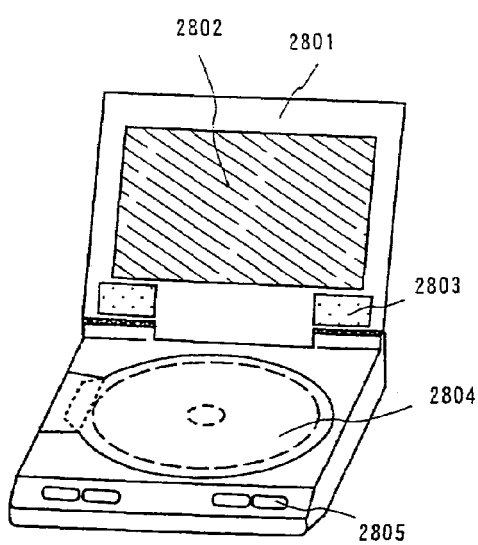

FIG. 31C shows a player (image reproduction apparatus) using a recording medium having a program recorded thereon (hereinafter called the "recording medium"). The player comprises a main body 2801, a display unit 2802, a speaker unit 2803, a recording medium 2804 and an operation switch 2805. Incidentally, this image reproduction apparatus uses a DVD (Digital Versatile Disc), a CD and so forth as the recording medium, and can enjoy listening to music, movies, games and Internet communication. The electro-optical device of the present invention can be used for the display unit 2802, the CPU and the memory.

Figure 31D:
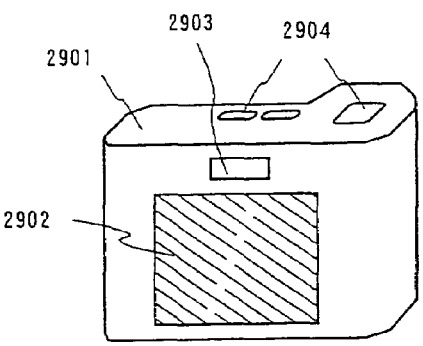

FIG. 31D shows the digital camera, which comprises a main body 2901, a display unit 2902, an eyepiece unit 2903, an operation switch 2904 and an image reception unit (not shown). The electro-optical device of the present invention can be used for the display unit 2902, the CPU and the memory.

Figure 32A:
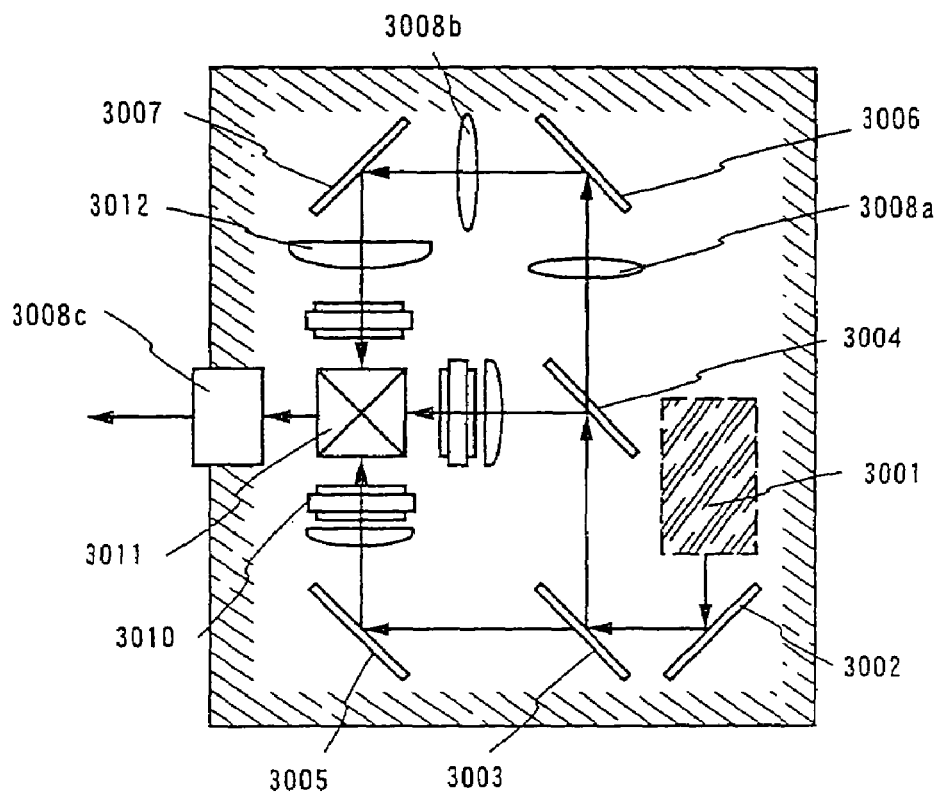
FIGS. 32A and 32B are schematic views showing the construction of an optical engine.
Figure 32B:
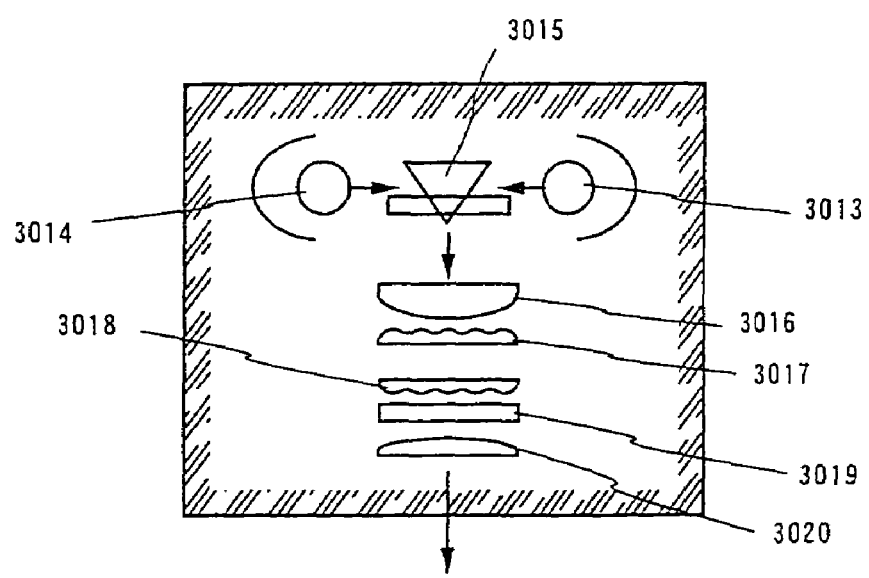

FIGS. 32A and 32B show detailed explanation of the optical engine that can be used for the rear projector shown in FIG. 30E and the front projector shown in FIG. 30F. Incidentally, FIG. 32A shows the optical engine and FIG. 32B shows the light source optical system that is assembled in the optical engine.

The optical engine shown in FIG. 32A includes alight source optical system 3001, mirrors 3002, 3005, 3006 and 3007, dichroic mirrors 3003 and 3004, optical lenses 3008a, 3008b and 3008c, a prism 3011, liquid crystal display devices 3010 and a projection optical system 3012. The projection optical system 3012 is the optical system that is equipped with a projection lens. Though this example illustrates a three-plate system using three liquid crystal display devices 3010, a single plate system may also be used. Optical lenses, a film having a polarization function, a film for adjusting a phase difference, an IR film and so forth, may be disposed in the optical paths represented by arrows drawn in FIG. 32A.

As shown in FIG. 32B, the light source optical system 3001 includes light sources 3013 and 3014, a synthetic prism 3015, collimator lenses 3016 and 3020, lens arrays 3017 and 3013, and a polarization-conversion element 3019. Though the light source optical system shown in FIG. 32B uses two light sources, the light source may be one, or three or more. Optical lenses, a film having a polarization function, a film for adjusting a phase difference, an IR film and so forth, may be inserted into any positions of the light source optical system.

As described above, the range of the application of the present invention is extremely broad, and the present invention can be applied to electric/electronic appliances of all fields. The electric/electronic appliances of this example can be accomplished by any combination of Examples 1 to 30.

The present invention makes it possible to arrange those circuits that have appropriate performance in accordance with the required specifications, and to drastically improve the operation performance and the reliability of a semiconductor device (more concretely, the electro-optical device).

The present invention can form the holding capacitance having a large capacity with a small area in the pixel unit of the electro-optical device typified by the AM-LCD. Therefore, the present invention can secure a sufficient holding capacity even in the AM-LCD having an interior opposing angle of not greater than 1 inch without lowering the aperture ratio.

Moreover, the present invention can improve the operation performance and the reliability of a semiconductor device (more concretely, the electrical appliance) including the electro-optical device used as a display medium.

What is claimed is:

1. A portable information terminal comprising:
   a display device, the display device comprising a driving circuit and a pixel portion formed over a substrate,
   the driving circuit comprising:
   a first thin film transistor comprising a first semiconductor layer and a first gate electrode adjacent to the first semiconductor layer with a gate insulating film interposed therebetween,
   wherein the first semiconductor layer comprises a first LDD region wholly overlapped with the first gate electrode with the gate insulating film interposed therebetween,
   the pixel portion comprising:
   a second thin film transistor comprising a second semiconductor layer and a second gate electrode adjacent to the second semiconductor layer with the gate insulating film interposed therebetween,
   wherein the second semiconductor layer comprises a second LDD region not overlapped with the second gate electrode with the gate insulating film interposed therebetween.

2. A semiconductor device according to claim 1, wherein each of the first and second LDD regions contains an impurity element belonging to the Group 15 of the Periodic Table, and a concentration of the impurity element in the first LDD region is higher than in the second LDD region.

3. A portable information terminal according to claim 1, wherein at least one of the first and second gate electrodes has a first layer comprising tantalum nitride and a second layer comprising tungsten on the first layer.

4. A portable information terminal according to claim 1, wherein the portable information terminal is one of a mobile computer, a cellular telephone, a portable game machine, or an electronic book.

5. A portable information terminal comprising:
a display device, the display device comprising a driving circuit and a pixel portion formed over a substrate,
the driving circuit comprising:
a first thin film transistor comprising a first semiconductor layer and a first gate electrode adjacent to the first semiconductor layer with a gate insulating film interposed therebetween,
wherein the first semiconductor layer comprises a first LDD region wholly overlapped with the first gate electrode with the gate insulating film interposed therebetween,
the pixel portion comprising:
a second thin film transistor comprising a second semiconductor layer and a second gate electrode adjacent to the second semiconductor layer with the gate insulating film interposed therebetween; and
a capacitor comprising a shading film disposed on a resin film, an oxide of the shading film, and a pixel electrode disposed on the oxide,
wherein the second semiconductor layer comprises a second LDD region not overlapped with the second gate electrode with the gate insulating film interposed therebetween.

6. A semiconductor device according to claim 5, wherein each of the first and second LDD regions contains an impurity element belonging to the Group 15 of the Periodic Table, and a concentration of the impurity element in the first LDD region is higher than in the second LDD region.

7. A portable information terminal according to claim 5, wherein at least one of the first and second gate electrodes has a first layer comprising tantalum nitride and a second layer comprising tungsten on the first layer.

8. A portable information terminal according to claim 5, wherein the portable information terminal is one of a mobile computer, a cellular telephone, a portable game machine, or an electronic book.

9. A portable information terminal according to claim 5, wherein the shading film comprises an aluminum film or a film consisting of aluminum as the principal component.

10. A portable information terminal according to claim 5, wherein the oxide is a film comprising an aluminum oxide.

11. A portable information terminal comprising:
a display device, the display device comprising a driving circuit and a pixel portion formed over a substrate,
the driving circuit comprising:
a first thin film transistor comprising a first semiconductor layer and a first gate electrode adjacent to the first semiconductor layer with a gate insulating film interposed therebetween; and
a second thin film transistor comprising a second semiconductor layer and a second gate electrode adjacent to the second semiconductor layer with the gate insulating film interposed therebetween,
wherein the first semiconductor layer comprises a first LDD region wholly overlapped with the first gate electrode with the gate insulating film interposed therebetween, and
wherein the second semiconductor layer comprises a second LDD region partly overlapped with the second gate electrode with the gate insulating film interposed therebetween,
the pixel portion comprising:
a third thin film transistor comprising a third semiconductor layer and a third gate electrode adjacent to the third semiconductor layer with the gate insulating film interposed therebetween,
wherein the third semiconductor layer comprises a third LDD region not overlapped with the third gate electrode with the gate insulating film interposed therebetween.

12. A semiconductor device according to claim 11, wherein each of said first, second and third LDD regions contains an impurity element belonging to the Group 15 of the Periodic Table, and a concentration of said impurity element in each of said first and second LDD regions is higher than in said third LDD region.

13. A portable information terminal according to claim 11, wherein at least one of the first and second gate electrodes has a first layer comprising tantalum nitride and a second layer comprising tungsten on the first layer.

14. A portable information terminal according to claim 11, wherein the portable information terminal is one of a mobile computer, a cellular telephone, a portable game machine, or an electronic book.

15. A portable information terminal comprising:
a display device, the display device comprising a driving circuit and a pixel portion formed over a substrate,
the driving circuit comprising:
a first thin film transistor comprising a first semiconductor layer and a first gate electrode adjacent to the first semiconductor layer with a gate insulating film interposed therebetween; and
a second thin film transistor comprising a second semiconductor layer and a second gate electrode adjacent to the second semiconductor layer with the gate insulating film interposed therebetween,
wherein the first semiconductor layer comprises a first LDD region wholly overlapped with the first gate electrode with the gate insulating film interposed therebetween, and
wherein the second semiconductor layer comprises a second LDD region partly overlapped with the second gate electrode with the gate insulating film interposed therebetween,
the pixel portion comprising:
a third thin film transistor comprising a third semiconductor layer and a third gate electrode adjacent to the third semiconductor layer with the gate insulating film interposed therebetween; and
a capacitor comprising a shading film disposed on a resin film, an oxide of the shading film, and a pixel electrode disposed on the oxide,
wherein the third semiconductor layer comprises a third LDD region not overlapped with the third gate electrode with the gate insulating film interposed therebetween.

16. A semiconductor device according to claim 15, wherein each of said first, second and third LDD regions contains an impurity element belonging to the Group 15 of the Periodic Table, and a concentration of said impurity element in each of said first and second LDD regions is higher than in said third LDD region.

17. A portable information terminal according to claim 15, wherein at least one of the first and second gate electrodes has a first layer comprising tantalum nitride and a second layer comprising tungsten on the first layer.

18. A portable information terminal according to claim 15, wherein the portable information terminal is one of a mobile computer, a cellular telephone, a portable game machine, or an electronic book.

19. A portable information terminal according to claim 15, wherein the shading film comprises an aluminum film or a film consisting of aluminum as the principal component.

20. A portable information terminal according to claim 15, wherein the oxide is a film comprising an aluminum oxide.

21. A computer comprising:
   a display device, the display device comprising a driving circuit and a pixel portion formed over a substrate,
   the driving circuit comprising:
   a first thin film transistor comprising a first semiconductor layer and a first gate electrode adjacent to the first semiconductor layer with a gate insulating film interposed therebetween,
   wherein the first semiconductor layer comprises a first LDD region wholly overlapped with the first gate electrode with the gate insulating film interposed therebetween,
   the pixel portion comprising:
   a second thin film transistor comprising a second semiconductor layer and a second gate electrode adjacent to the second semiconductor layer with the gate insulating film interposed therebetween,
   wherein the second semiconductor layer comprises a second LDD region not overlapped with the second gate electrode with the gate insulating film interposed therebetween.

22. A computer according to claim 21, wherein each of the first and second LDD regions contains an impurity element belonging to the Group 15 of the Periodic Table, and a concentration of the impurity element in the first LDD region is higher than in the second LDD region.

23. A computer according to claim 21, wherein at least one of the first and second gate electrodes has a first layer comprising tantalum nitride and a second layer comprising tungsten on the first layer.

24. A computer comprising:
   a display device, the display device comprising a driving circuit and a pixel portion formed over a substrate,
   the driving circuit comprising:
   a first thin film transistor comprising a first semiconductor layer and a first gate electrode adjacent to the first semiconductor layer with a gate insulating film interposed therebetween,
   wherein the first semiconductor layer comprises a first LDD region wholly overlapped with the first gate electrode with the gate insulating film interposed therebetween,
   the pixel portion comprising:
   a second thin film transistor comprising a second semiconductor layer and a second gate electrode adjacent to the second semiconductor layer with the gate insulating film interposed therebetween; and
   a capacitor comprising a shading film disposed on a resin film, an oxide of the shading film, and a pixel electrode disposed on the oxide,
   wherein the second semiconductor layer comprises a second LDD region not overlapped with the second gate electrode with the gate insulating film interposed therebetween.

25. A computer according to claim 24, wherein each of the first and second LDD regions contains an impurity element belonging to the Group 15 of the Periodic Table, and a concentration of the impurity element in the first LDD region is higher than in the second LDD region.

26. A computer according to claim 24, wherein at least one of the first and second gate electrodes has a first layer comprising tantalum nitride and a second layer comprising tungsten on the first layer.

27. A computer according to claim 24, wherein the shading film comprises an aluminum film or a film consisting of aluminum as the principal component.

28. A computer according to claim 24, wherein the oxide is a film comprising an aluminum oxide.

29. A computer comprising:
   a display device, the display device comprising a driving circuit and a pixel portion formed over a substrate,
   the driving circuit comprising:
   a first thin film transistor comprising a first semiconductor layer and a first gate electrode adjacent to the first semiconductor layer with a gate insulating film interposed therebetween; and
   a second thin film transistor comprising a second semiconductor layer and a second gate electrode adjacent to the second semiconductor layer with the gate insulating film interposed therebetween,
   wherein the first semiconductor layer comprises a first LDD region wholly overlapped with the first gate electrode with the gate insulating film interposed therebetween, and
   wherein the second semiconductor layer comprises a second LDD region partly overlapped with the second gate electrode with the gate insulating film interposed therebetween,
   the pixel portion comprising:
   a third thin film transistor comprising a third semiconductor layer and a third gate electrode adjacent to the third semiconductor layer with the gate insulating film interposed therebetween,
   wherein the third semiconductor layer comprises a third LDD region not overlapped with the third gate electrode with the gate insulating film interposed therebetween.

30. A computer according to claim 29, wherein each of said first second and third LDD regions contains an impurity element belonging to the Group 15 of the Periodic Table, and a concentration of said impurity element in each of said first and second LDD regions is higher than in said third LDD region.

31. A computer according to claim 29, wherein at least one of the first and second gate electrodes has a first layer comprising tantalum nitride and a second layer comprising tungsten on the first layer.

32. A computer comprising:
   a display device, the display device comprising a driving circuit and a pixel portion formed over a substrate,
   the driving circuit comprising:
   a first thin film transistor comprising a first semiconductor layer and a first gate electrode adjacent to the first semiconductor layer with a gate insulating film interposed therebetween; and
   a second thin film transistor comprising a second semiconductor layer and a second gate electrode adjacent to the second semiconductor layer with the gate insulating film interposed therebetween,
   wherein the first semiconductor layer comprises a first LDD region wholly overlapped with the first gate electrode with the gate insulating film interposed therebetween, and wherein the second semiconductor layer comprises a second LDD region partly overlapped with the second gate electrode with the gate insulating film interposed therebetween, the pixel portion comprising:

a third thin film transistor comprising a third semiconductor layer and a third gate electrode adjacent to the third semiconductor layer with the gate insulating film interposed therebetween; and a capacitor comprising a shading film disposed on a resin film, an oxide of the shading film, and a pixel electrode disposed on the oxide, wherein the third semiconductor layer comprises a third LDD region not overlapped with the third gate electrode with the gate insulating film interposed therebetween.

33. A computer according to claim 32, wherein each of said first, second and third LDD regions contains an impurity element belonging to the Group 15 of the Periodic Table, and a concentration of said impurity element in each of said first and second LDD regions is higher than in said third LDD region.

34. A computer according to claim 32, wherein at least one of the first and second gate electrodes has a first layer comprising tantalum nitride and a second layer comprising tungsten on the first layer.

35. A computer according to claim 32, wherein the shading film comprises an aluminum film or a film consisting of aluminum as the principal component.

36. A computer according to claim 32, wherein the oxide is a film comprising an aluminum oxide.

37. A camera comprising:

a display device, the display device comprising a driving circuit and a pixel portion formed over a substrate, the driving circuit comprising:

a first thin film transistor comprising a first semiconductor layer and a first-gate electrode adjacent to the first semiconductor layer with a gate insulating film interposed therebetween, wherein the first semiconductor layer comprises a first LDD region wholly overlapped with the first gate electrode with the gate insulating film interposed therebetween, the pixel portion comprising:

a second thin film transistor comprising a second semiconductor layer and a second gate electrode adjacent to the second semiconductor layer with the gate insulating film interposed therebetween, wherein the second semiconductor layer comprises a second LDD region not overlapped with the second gate electrode with the gate insulating film interposed therebetween.

38. A camera according to claim 37, wherein each of the first and second LDD regions contains an impurity element belonging to the Group 15 of the Periodic Table, and a concentration of the impurity element in the first LDD region is higher than in the second LDD region.

39. A camera according to claim 37, wherein at least one of the first and second gate electrodes has a first layer comprising tantalum nitride and a second layer comprising tungsten on the first layer.

40. A camera comprising:

a display device, the display device comprising a driving circuit and a pixel portion formed over a substrate, the driving circuit comprising:

a first thin film transistor comprising a first semiconductor layer and a first gate electrode adjacent to the first semiconductor layer with a gate insulating film interposed therebetween, wherein the first semiconductor layer comprises a first LDD region wholly overlapped with the first gate electrode with the gate insulating film interposed therebetween, the pixel portion comprising:

a second thin film transistor comprising a second semiconductor layer and a second gate electrode adjacent to the second semiconductor layer with the gate insulating film interposed therebetween; and a capacitor comprising a shading film disposed on a resin film, an oxide of the shading film, and a pixel electrode disposed on the oxide, wherein the second semiconductor layer comprises a second LDD region not overlapped with the second gate electrode with the gate insulating film interposed therebetween.

41. A camera according to claim 40, wherein each of the first and second LDD regions contains an impurity element belonging to the Group 15 of the Periodic Table, and a concentration of the impurity element in the first LDD region is higher than in the second LDD region.

42. A camera according to claim 40, wherein at least one of the first and second gate electrodes has a first layer comprising tantalum nitride and a second layer comprising tungsten on the first layer.

43. A camera according to claim 40, wherein the shading film comprises an aluminum film or a film consisting of aluminum as the principal component.

44. A camera according to claim 40, wherein the oxide is a film comprising an aluminum oxide.

45. A camera comprising:

a display device, the display device comprising a driving circuit and a pixel portion formed over a substrate, the driving circuit comprising:

a first thin film transistor comprising a first semiconductor layer and a first gate electrode adjacent to the first semiconductor layer with a gate insulating film interposed therebetween; and a second thin film transistor comprising a second semiconductor layer and a second gate electrode adjacent to the second semiconductor layer with the gate insulating film interposed therebetween, wherein the first semiconductor layer comprises a first LDD region wholly overlapped with the first gate electrode with the gate insulating film interposed therebetween, and wherein the second semiconductor layer comprises a second LDD region partly overlapped with the second gate electrode with the gate insulating film interposed therebetween, the pixel portion comprising:

a third thin film transistor comprising a third semiconductor layer and a third gate electrode adjacent to the third semiconductor layer with the gate insulating film interposed therebetween, wherein the third semiconductor layer comprises a third LDD region not overlapped with the third gate electrode with the gate insulating film interposed therebetween.

46. A camera according to claim 45, wherein each of said first second and third LDD regions contains an impurity element belonging to the Group 15 of the Periodic Table, and a concentration of said impurity element in each of said first and second LDD regions is higher than in said third LDD region.

47. A camera according to claim 45, wherein at least one of the first and second gate electrodes has a first layer comprising tantalum nitride and a second layer comprising tungsten on the first layer.

48. A camera comprising:
a display device, the display device comprising a driving circuit and a pixel portion formed over a substrate,
the driving circuit comprising:
a first thin film transistor comprising a first semiconductor layer and a first gate electrode adjacent to the first semiconductor layer with a gate insulating film interposed therebetween; and
a second thin film transistor comprising a second semiconductor layer and a second gate electrode adjacent to the second semiconductor layer with the gate insulating film interposed therebetween,
wherein the first semiconductor layer comprises a first LDD region wholly overlapped with the first gate electrode with the gate insulating film interposed therebetween, and
wherein the second semiconductor layer comprises a second LDD region partly overlapped with the second gate electrode with the gate insulating film interposed therebetween,
the pixel portion comprising:
a third thin film transistor comprising a third semiconductor layer and a third gate electrode adjacent to the third semiconductor layer with the gate insulating film interposed therebetween; and
a capacitor comprising a shading film disposed on a resin film, an oxide of the shading film, and a pixel electrode disposed on the oxide,
wherein the third semiconductor layer comprises a third LDD region not overlapped with the third gate electrode with the gate insulating film interposed therebetween.

49. A camera according to claim 48, wherein each of said first second and third LDD regions contains an impurity element belonging to the Group 15 of the Periodic Table, and a concentration of said impurity element in each of said first and second LDD regions is higher than in said third LDD region.

50. A camera according to claim 48, wherein at least one of the first and second gate electrodes has a first layer comprising tantalum nitride and a second layer comprising tungsten on the first layer.

51. A camera according to claim 48, wherein the shading film comprises an aluminum film or a film consisting of aluminum as the principal component.

52. A camera according to claim 48, wherein the oxide is a film comprising an aluminum oxide.

* * * * *